US008502542B2

(12) United States Patent
Couture

(10) Patent No.: US 8,502,542 B2
(45) Date of Patent: Aug. 6, 2013

(54) APPARATUS AND METHOD FOR MONITORING A PHASE LINE OF A SECTION OF AN ELECTRICAL ENERGY TRANSMISSION LINE

(75) Inventor: Pierre Couture, Boucherville (CA)

(73) Assignee: Hydro Quebec, Montreal, Quebec (CA)

( * ) Notice: Subject to any disclaimer, the term of this patent is extended or adjusted under 35 U.S.C. 154(b) by 786 days.

(21) Appl. No.: 12/665,686

(22) PCT Filed: Jun. 20, 2008

(86) PCT No.: PCT/CA2008/001185
§ 371 (c)(1),
(2), (4) Date: Mar. 22, 2010

(87) PCT Pub. No.: WO2008/154749
PCT Pub. Date: Dec. 24, 2008

(65) Prior Publication Data
US 2010/0176814 A1    Jul. 15, 2010

(51) Int. Cl.
*G01R 31/08*    (2006.01)
(52) U.S. Cl.
USPC ........... 324/521; 324/522; 324/531; 324/500; 324/508; 324/541; 324/544; 324/509; 324/511; 324/512; 702/58; 702/59; 361/2; 361/3; 361/4; 361/5; 361/6; 361/42; 361/47; 361/64; 361/65; 361/66
(58) Field of Classification Search
USPC ................. 324/521–522, 531, 500, 508, 541, 324/544, 509, 511, 512; 361/2–6, 42, 47, 361/64, 65, 66, 68; 702/58, 59
See application file for complete search history.

(56) References Cited

U.S. PATENT DOCUMENTS

| 4,766,549 | A | 8/1988 | Schweitzer, III et al. |
| 5,070,537 | A | 12/1991 | Ohira et al. |

(Continued)

FOREIGN PATENT DOCUMENTS

| CA | 2569267 A1 | 12/2005 |
| JP | 10-300808 | 11/1998 |

(Continued)

OTHER PUBLICATIONS

Non-English version of the International Preliminary Report on Patentability (PCT/IPEA/409) for PCT/CA2008/001185 dated Jan. 29, 2009.

(Continued)

*Primary Examiner* — Arleen M Vazquez
*Assistant Examiner* — Son Le
(74) *Attorney, Agent, or Firm* — Buchanan Ingersoll & Rooney P.C.

(57) ABSTRACT

An appliance and a method are intended to monitor a phase line of a section of an electrical energy grid line. The appliance comprises a device for monitoring a parameter of a phase line. The parameter is representative of routine operating conditions of the phase line and has a known propagation speed. The appliance also comprises a device for generating an event detection signal each time the parameter has a value that exceeds a threshold, and for storing a reception time when the detection signal is generated. The appliance also has a device for sending a signal representative of a geographic location of the end of the section and a device for performing a geographic location of the event once two consecutive detection signals are generated from the signal representative of the geographic location, and reception times associated with the two detection signals.

18 Claims, 42 Drawing Sheets

U.S. PATENT DOCUMENTS

| | | | |
|---|---|---|---|
| 6,396,172 B1 | 5/2002 | Couture | |
| 6,442,493 B1 * | 8/2002 | Jurisch et al. | 702/59 |
| 6,727,604 B2 * | 4/2004 | Couture | 307/112 |
| 2004/0199078 A1 * | 10/2004 | Mo et al. | 600/437 |
| 2006/0187074 A1 | 8/2006 | O'Sullivan et al. | |

FOREIGN PATENT DOCUMENTS

| | | |
|---|---|---|
| WO | WO 02/41459 A1 | 5/2002 |
| WO | WO 2005/119875 A1 | 12/2005 |

OTHER PUBLICATIONS

International Search Report of Application No. PCT/CA2008/001185 dated Oct. 27, 2008.

Non-English version of the Written Opinion of the International Searching Authority of Application No. PCT/CA2008/001185 dated Oct. 27, 2008.

* cited by examiner

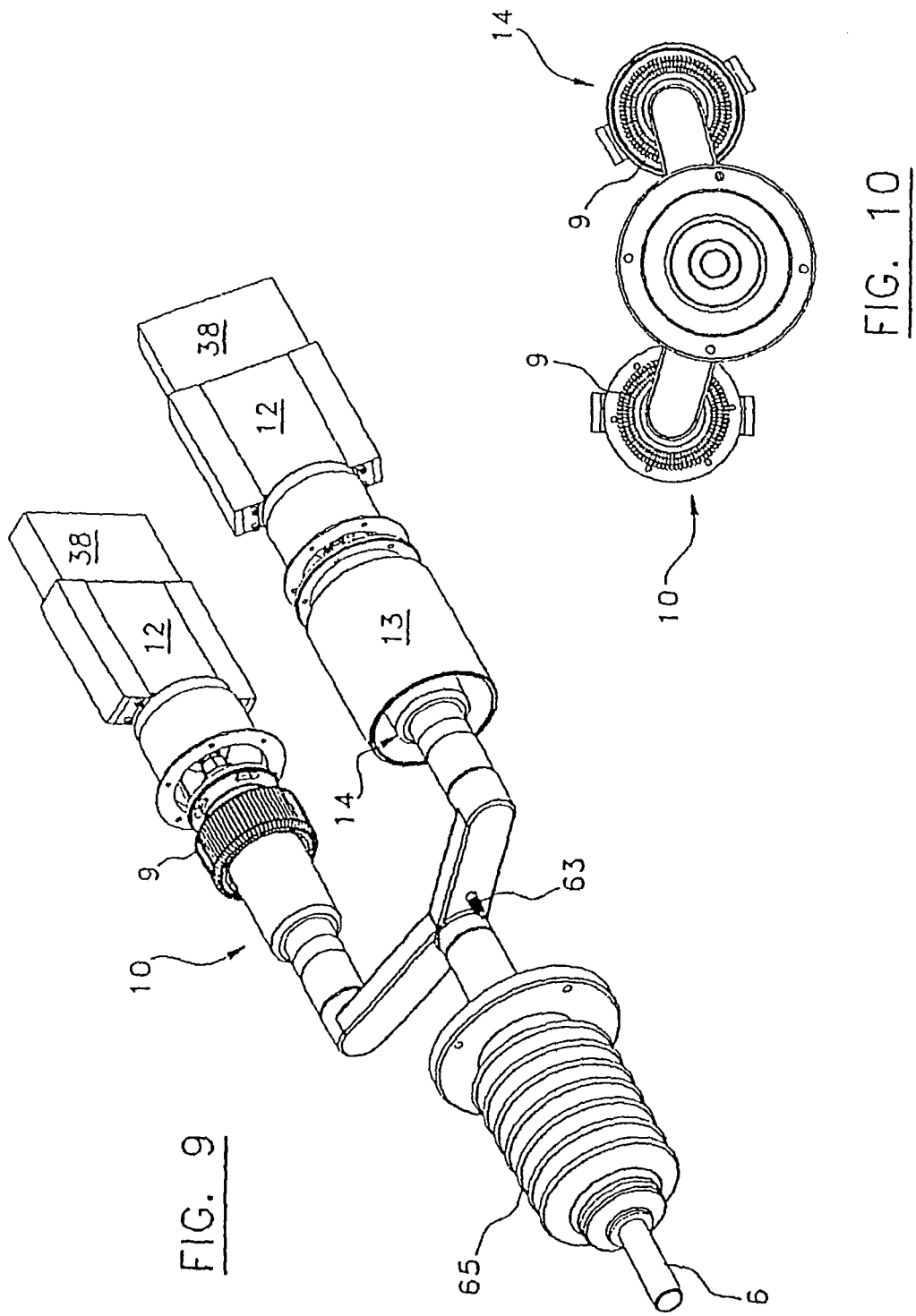

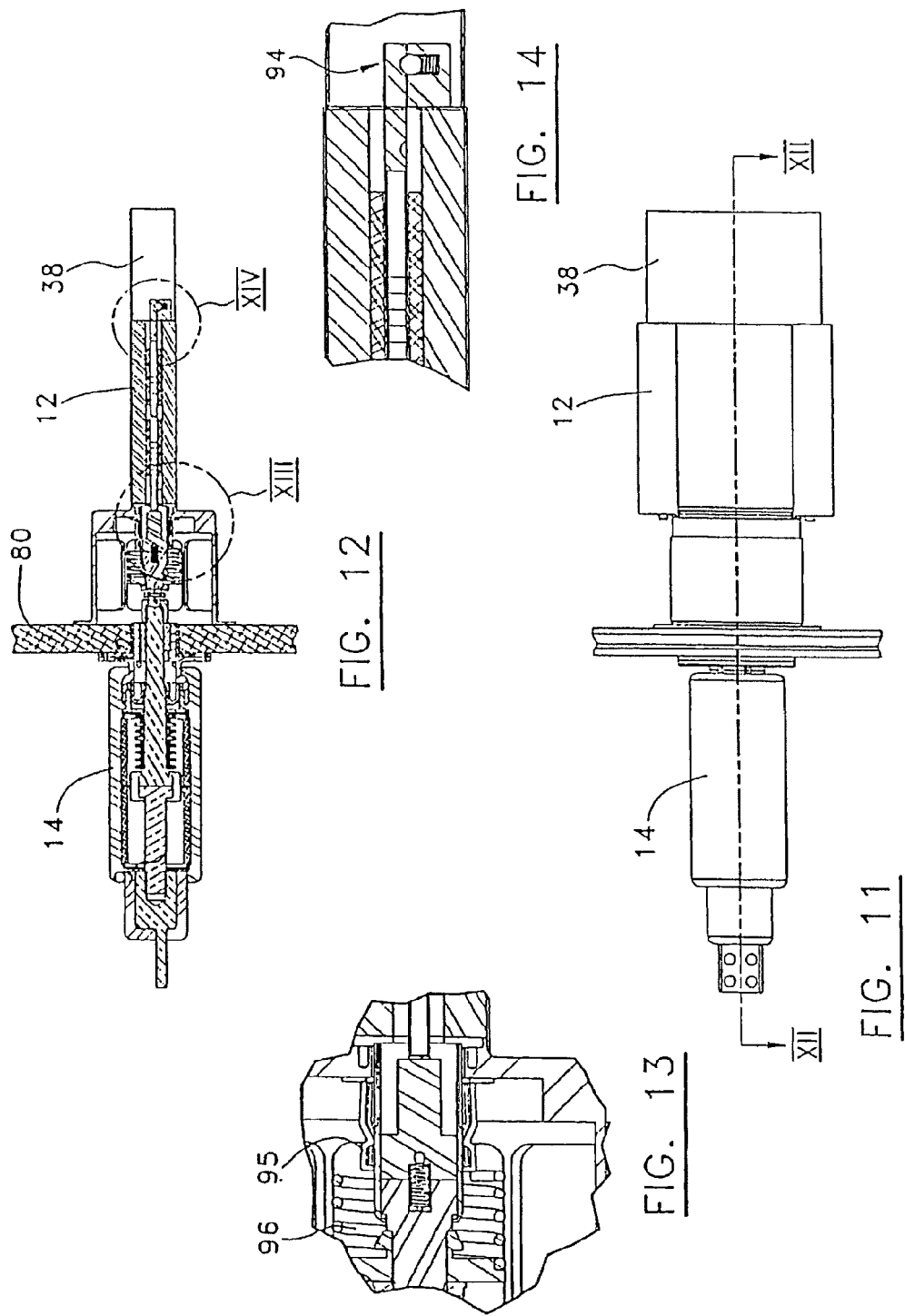

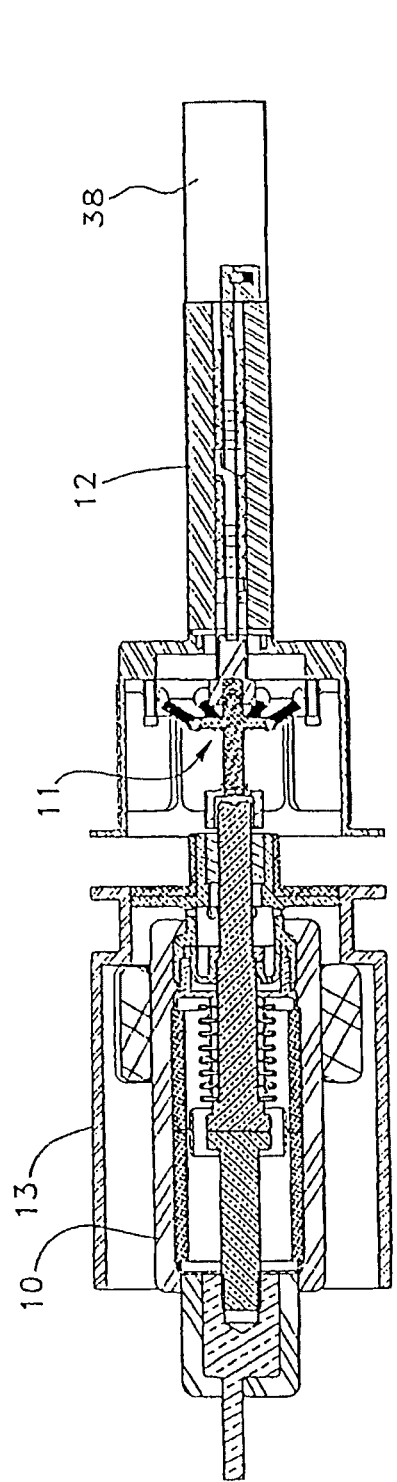
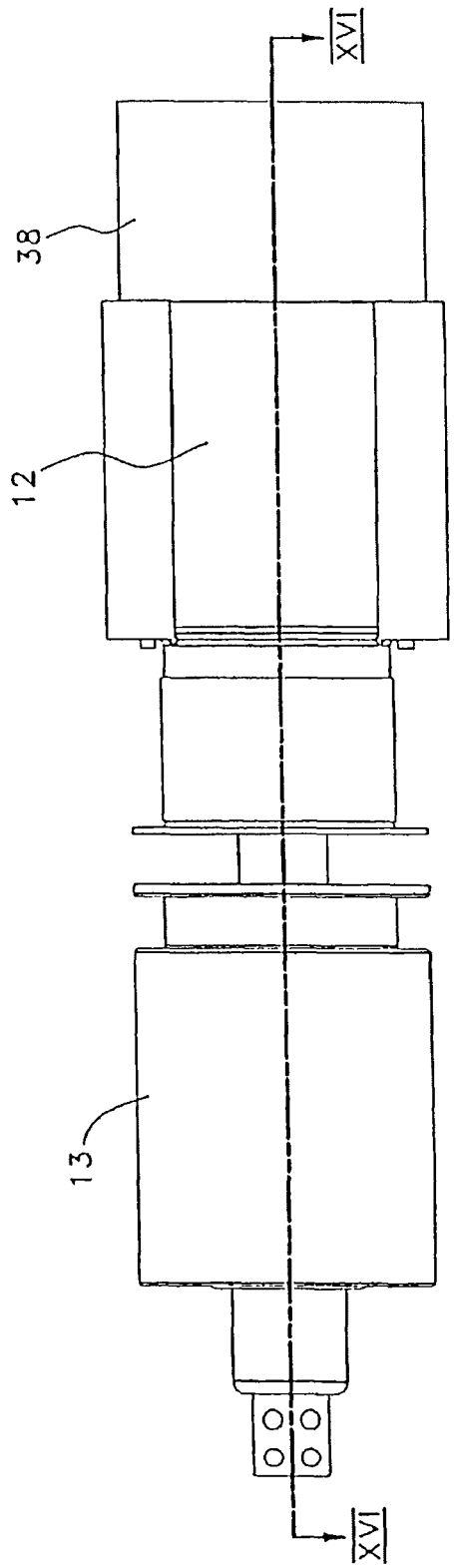
FIG. 16
FIG. 15

APPARATUS AND METHOD FOR MONITORING A PHASE LINE OF A SECTION OF AN ELECTRICAL ENERGY TRANSMISSION LINE

FIELD OF THE INVENTION

The present invention relates to an apparatus and a method for monitoring a phase line of a section of an electrical energy transmission line. The phase line comprises n conductors electrically insulated one from another and short-circuited between themselves at two extremities of the section.

DESCRIPTION OF PRIOR ART

Known in the prior art, there exists U.S. Pat. No. 6,396,172 and the published PCT application under the international publication number WO 02/41459. In these documents, a switching apparatus made to be used with a section of an electrical energy transmission line having several phase lines is described. Each of the phase lines has several conductors electrically insulated one from another and connected in parallel. The conductors of each phase line are short-circuited between themselves at two extremities of the section. The apparatus comprises pairs of interrupters connected in parallel, to open and close selectively the conductors of each phase line, detection means for detecting current operational conditions of the section and controlling means for controlling pairs of interrupters according to the current operational conditions of the section.

Patent application CA 2,569,267 describes a switching apparatus to modify the impedance of a phase line of a section of an electrical energy transmission line, the phase line comprising n conductors electrically insulated one from another and short-circuited between themselves at two extremities of the section. The apparatus comprises at least one first vacuum interrupter connected in series with at least one of the conductors, at least one first motor being controllable for opening and closing selectively the first vacuum interrupter, a detector for detecting a parameter representative of the current operational conditions of the phase line and a controller for controlling the first motor being controllable as a function of the parameter detected by the detector. The application also describes a switching module for modifying the impedance of two phase lines of two adjacent sections of an electrical energy transmission line and a method for modifying the impedance of a phase line of a section of an electrical transmission line.

So there thus exists a need for a method for monitoring a phase line of a section on an electrical energy transport line allowing a passive monitoring or an active monitoring of the phase line to follow the evolution of the line, to detect abnormal functionings, flaws or breaks in the line, to take measurements or to control flow of power.

SUMMARY OF THE INVENTION

An object of the present invention is to provide an apparatus and a method addressing the above-mentioned needs.

The present invention provides a method for locating an event occurring along a phase line on a section of an electrical energy transmission line, the phase line having n conductors electrically insulated one from another and short-circuited between themselves at two extremities of the section, the method comprising the steps of:
  a) monitoring a parameter on one of the n conductors of the phase line, at one of the extremities of the section without a ground reference, said parameter being representative of current operational conditions of the phase line and having a known propagation speed in the conductor;
  b) generating an event detection signal at the extremity of the section each time the parameter has a value exceeding a threshold, and storing a reception time when the detection signal is generated;
  c) transmitting a signal representative of a geographic location of the extremity of the section; and
  d) geographically locating the event along the section once two consecutive detection signals are generated from the signal representative of the geographic location of step c), and from the reception times associated with two consecutive detection signals.

The present invention also provides an apparatus for locating an event having occurred along a phase line on a section of an electrical energy transmission line, the phase line comprising n conductors electrically insulated one from another and short-circuited between themselves at two extremities of the section, the apparatus being located at one of the extremities of the section and comprising:
  monitoring device for monitoring at least one parameter on one of the n conductors of the phase line without a ground reference, said at least one parameter being representative of current operational conditions of the phase line and having a known propagation speed in the conductor;
  a device for generating a detection signal of the event at the extremity of the section each time said at least one parameter has a value exceeding a threshold, and for storing a reception time when the detection signal is generated;
  a device for transmitting a signal representative of a geographic location of said extremity of the section; and
  a device for geographically locating the event along the section once two consecutive detection signals are generated, from the signal representative of the geographic location, and from the reception times associated with two consecutive detection signals.

The present invention also provides a method for determining whether there is a flaw along a phase line on a section of an electrical energy transmission line, and for locating said flaw if there is one, the phase line comprising n conductors electrically insulated one from another and short-circuited between themselves at two extremities of the section, the length of the section being known, the method comprising the steps of:
  a) opening one of the n conductors at one of the extremities of the section to inject therein an incident electrical pulse, and storing an transmission time of the incident pulse;
  b) detecting a reflected electrical pulse received in response to the incident pulse on the conductor at the extremity of the section without a ground reference, and storing a reception time of the reflected pulse, the pulses having a known propagation speed in the conductor;
  c) transmitting a signal representative of the geographic location of the extremity of the section; and
  d) determining whether there is a flaw as a function of the transmission and reception times, of the length of the section and of the propagation speed, and, if there is a flaw, geographically locating said flaw as a function of the signal representative of the geographic location of step c), of the transmission and reception times, and of the propagation speed.

The present invention also provides an apparatus for determining whether there is a flaw along a phase line on a first section of an electrical energy transmission line and for locating said flaw if there is one, the phase line comprising n conductors electrically insulated one from another and short-circuited between themselves at two extremities of the first section, the length of the section being known, the apparatus being located at a first of the extremities of the first section, and comprising:

an interrupter for opening one of the n conductors;

a signal generator for injecting an incident electrical pulse in the conductor;

a detector for detecting on the conductor a reflected electrical pulse in response to the incident pulse without a ground reference, the pulses having a known propagation speed in the conductor;

a memory for storing the incident pulse injection and reflected pulse reception times;

a transmitter for transmitting a signal representative of a geographic location of the first extremity of the first section; and device for determining whether there is a flaw as a function of the transmission and reception times, of the length of the first section and of the propagation speed, and, if there is a flaw, geographically locating said flaw as a function of the signal representative of the geographic location transmitted by the transmitter, of the injection and reception times, and of the propagation speed.

The invention will be better understood from a reading of the non-restrictive description that follows of a preferred embodiment thereof, and upon referring to the appended drawings.

BRIEF DESCRIPTION OF THE DRAWINGS

FIG. 9 is a perspective side view of elements shown in FIGS. 7 and 8.

FIG. 10 is a front view of what is shown in FIG. 9.

FIG. 11 is a side view of elements shown in FIGS. 7 and 8.

FIG. 12 is a cross-sectional view along line A-A in FIG. 11.

FIG. 13 is an enlarged view of a portion of FIG. 12.

FIG. 14 is an enlarged view of another portion of FIG. 12.

FIG. 15 is a side view of elements shown in FIGS. 7 and 8.

FIG. 16 is a cross-sectional view along line A-A of FIG. 15.

DETAILED DESCRIPTION OF DRAWINGS

The present invention represents an improvement of the invention described in patent application CA 2,569,267. This improvement resides mainly in the addition of components to convert an electrical energy transmission line into a smart line, on which one can exercise passive or active monitoring, as described in the non-thresholdative description that follows.

Figure 46:
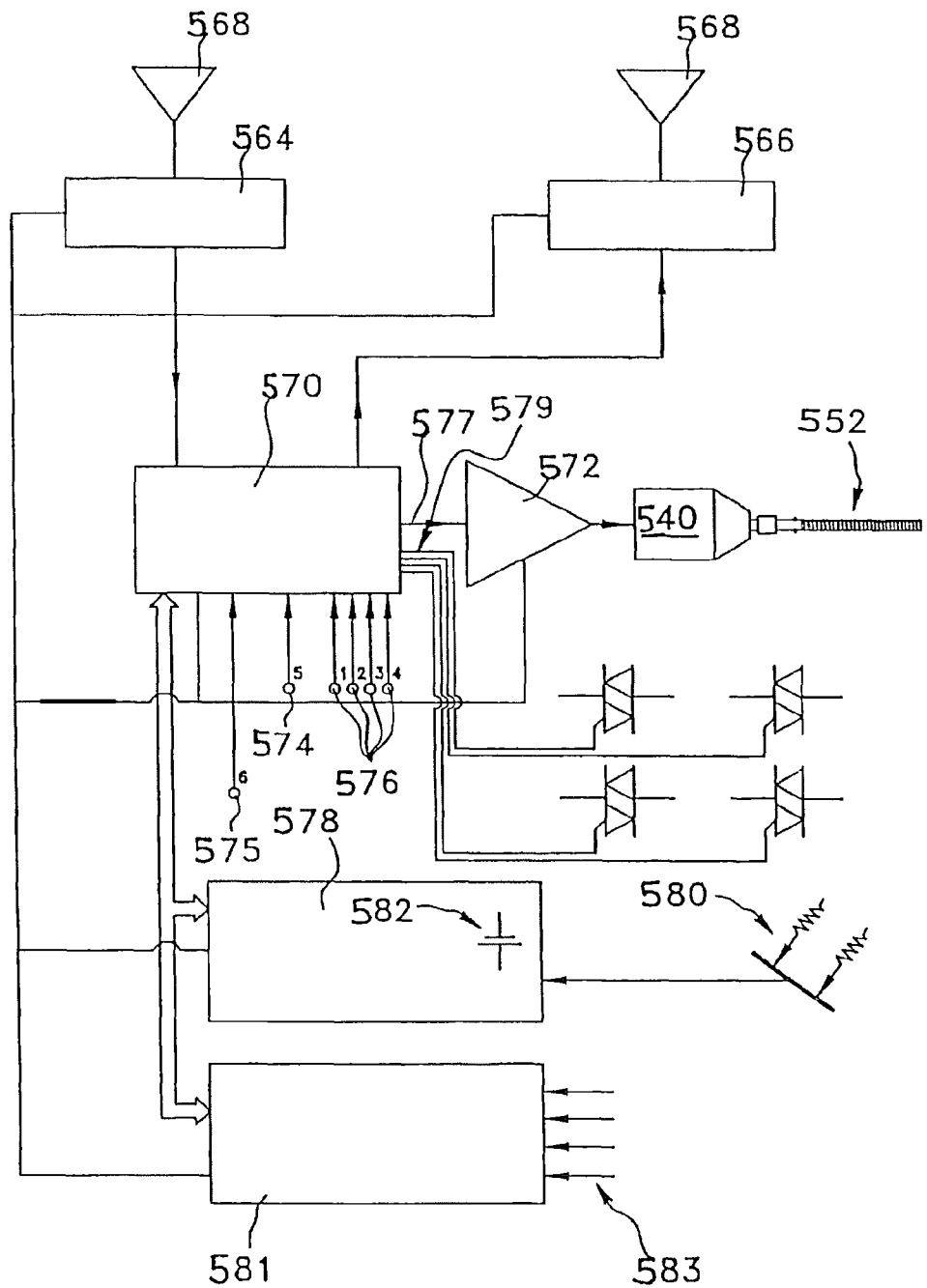
FIG. 46 is a block schematic diagram of a unit comprising a controller and a part of the detector according to the present invention.
Figure 48:
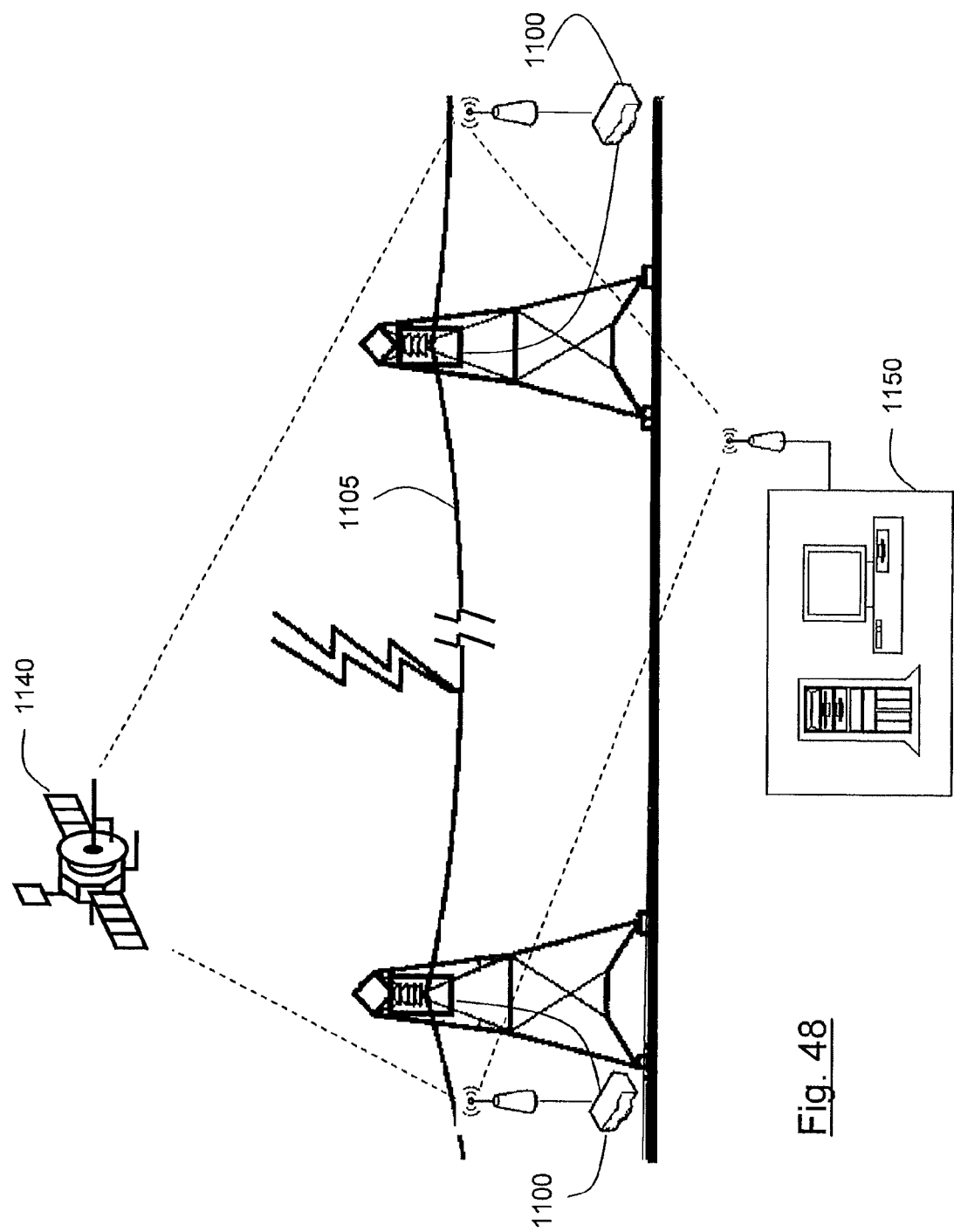
FIG. 48 is a schematic view of a part of an electrical energy transmission line, comprising two apparatuses according to another preferred embodiment of the present invention.
Figure 49:
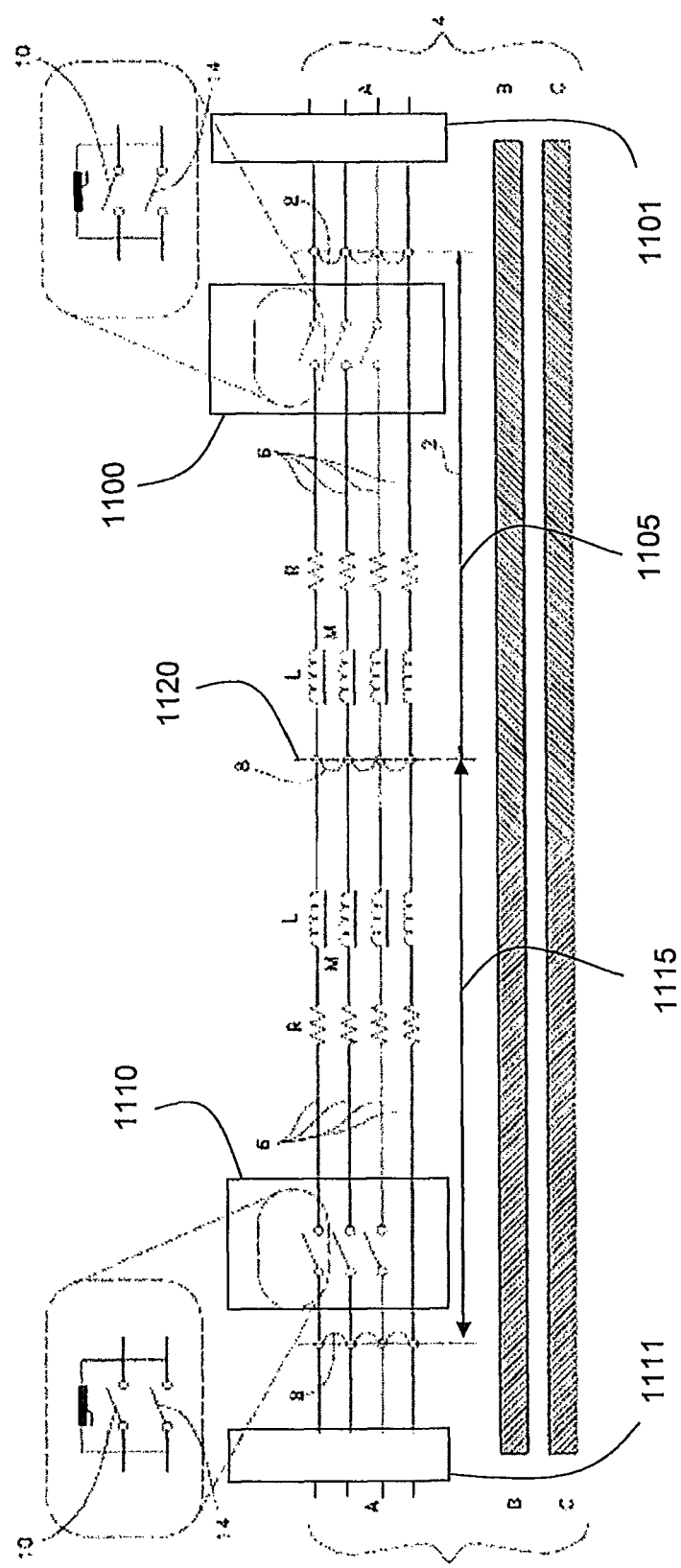
FIG. 49 is a schematic view of two parts of an electrical energy transmission line, comprising two apparatuses according to another preferred embodiment of the present invention.

Referring now to FIGS. 46, 48 and 49, the object of locating an event having occurred along a section 1105 of a phase line of an electrical energy transmission line is met with an apparatus 1100. The phase line comprises n conductors electrically insulated one from another and short-circuited between themselves at two extremities of the section 1105. The apparatus 1100 is located at one of the extremities of the section 1105. The apparatus 1100 comprises a monitoring device for monitoring at least one parameter on one of the n conductors of the phase line. Said at least one parameter is representative of current operational conditions of the phase line and has a known propagation speed in the conductor. The apparatus also comprises a device for generating a detection signal for the event at the extremity of the section 1105 each time said at least one parameter has a value exceeding a threshold, and for storing a reception time when the detection signal is generated. The apparatus 1100 also comprises a device for transmitting a signal representative of a geographic location of said extremity of the section 1105. The apparatus 1100 also comprises a device for geographically locating the event along the section 1105 once two consecutive detection signals are generated from the signal representative of the geographic location, and the reception times associated with two consecutive detection signals. The length of the section being known, one knows also that when the signal originating from the event reaches the distant extremity of the section, it meets the short-circuit of the conductors and produces a reflected signal that returns to the apparatus. The apparatus thus receives a first signal originating directly from the event, and a second reflected signal at the distant extremity of the section. These two signals allow localisation of the event along the section. This apparatus monitors in a "passive" manner the phase line. In FIG. 48, several towers can be placed between the towers illustrated in this Figure, thus explaining the presence of a cut in the line illustrated in the schematic. Monitoring devices, for generating the event detection signal, for transmitting the signal representative of the geographic location and for geographically locating the event along the section operate through the processor 570 having input ports for allowing monitoring of at least one electrical parameter on one of the n conductors, and having calculation capabilities for calculating the geographic location of the event along the section. Preferably, the parameter representative of current operational conditions is the current or the voltage.

Preferably, the monitoring device 1101 is capable of operating at a sampling frequency of at least 1 MHz for monitoring said at least one parameter representative of operational conditions. This sampling frequency can preferably increase up to 1 GHz. As illustrated in FIG. 48, sampling can be synchronized through referral to a GPS system 1140. The GPS system 1140 can communicate with the processor 570 to geographically locating the apparatus and thus direct maintenance teams to the affected section. Moreover, the apparatus 1100 can be numerically controlled from a remote central control system 1150 that controls and monitors the complete transmission line by communicating with several apparatuses.

Preferably, the monitoring device 1101 comprises means carried out by the processor 570, for continuously storing data on the parameter during a predetermined time window, and a memory for storing in memory only the data related to a period of time starting 100 µs before the reception time and ending when the value of the said at least one parameter re-passes below the threshold. This allows adequate measurement and identification of the wave front that would be characteristic of the event having occurred on the section.

According to a preferred embodiment of the invention, it is possible to reconstitute the original wave front from the wave front arriving at the apparatus, through signal processing, and through knowledge of the characteristics of the line. Moreover, the apparatus can also be used to detect events on overhead ground wires associated with the section. Indeed, the overhead ground wires are coupled in a capacitive manner and through induction to the transmission line. Consequently, a perturbation on the overhead ground wire has an impact on the conductors, which can be detected by the apparatus according to the present invention. The apparatus according to the present invention can also use phasor technology in order to better identify the event having occurred on the line. Measurement of the phasors can also provide significant information on the localisation of the defect on the line, and even in certain cases, allow identification of what could have hit the line. Preferably, the phase line comprises four conductors.

Preferably, and as illustrated on FIG. 49, the present invention also provides a system comprising two apparatuses 1100 and 1110, each apparatus being as described hereinabove. The apparatus 1100 is located on a first section 1005. The second apparatus 1110 is located on a second section 1115 adjacent to the first section 1105. FIG. 49 shows how the apparatuses can be mounted in a "back-to-back" configuration. In such a configuration, the pairs of sections 1105 and 1115 are adjacent. The apparatus 1100 can be mounted back-to-back with the apparatus 1110 on a same tower, and the apparatus 1110 can also be mounted back-to-back with an apparatus 1111 of another tower. This configuration allows a spacing of the extremities of the sections requiring the presence of an apparatus. In FIG. 49, the extremity 1120 in the center of two sections 1105 and 1115 does not have a monitoring apparatus which can be advantageous in order to reduce the number of apparatuses to monitor for maintenance of the transmission line. In such a configuration, given the configuration and the connections between the different modules and sections, a same event can be detected by several modules on several sections, because a signal characteristic of an event can propagate beyond one single apparatus.

According to a preferred embodiment of the invention, the apparatuses on the sections are compatible with several other sensors located on the line. The apparatuses can therefore also be used as relays for the signals of the sensors in order to ensure a good quality of transmission of the signals to the appropriate monitoring systems.

The objective of locating an event having occurred along a phase line of a section 1105 of an electrical energy transmission line is also met with a method comprising several steps. The phase line comprises n conductors electrically insulated one from another and short-circuited between themselves at two extremities of the section. The method comprises the steps of:

a) monitoring a parameter on one of the n conductors of the phase line, at one of the extremities of the section, said parameter being representative of current operational conditions of the phase line and having a known propagation speed in the conductor;

b) generating an event detection signal at the extremity of the section each time the parameter has a value exceeding a threshold, and storing a reception time when the detection signal is generated;

c) transmitting a signal representative of the geographic location of the extremity of the section; and d) geographically locating the event along the section once two consecutive detection signals are generated from the signal representative of the geographic location of step c), and from the reception times associated with two consecutive detection signals.

Preferably, the step of monitoring a parameter on one of the n conductors of the phase line is carried out at a sampling frequency of at least 1 MHz.

Preferably, in step a), data on the parameter are continuously stored during a predetermined window of time, and in step b), after the generation of the detection signal, the data produced in step a) are kept in memory only for a period of time starting 100 μs before the reception time, and ending when the value of the parameter re-passes below the threshold. As mentioned above, this allows adequate measurement and identification of a wave front that would be characteristic of the event having occurred on the section.

Figure 47:
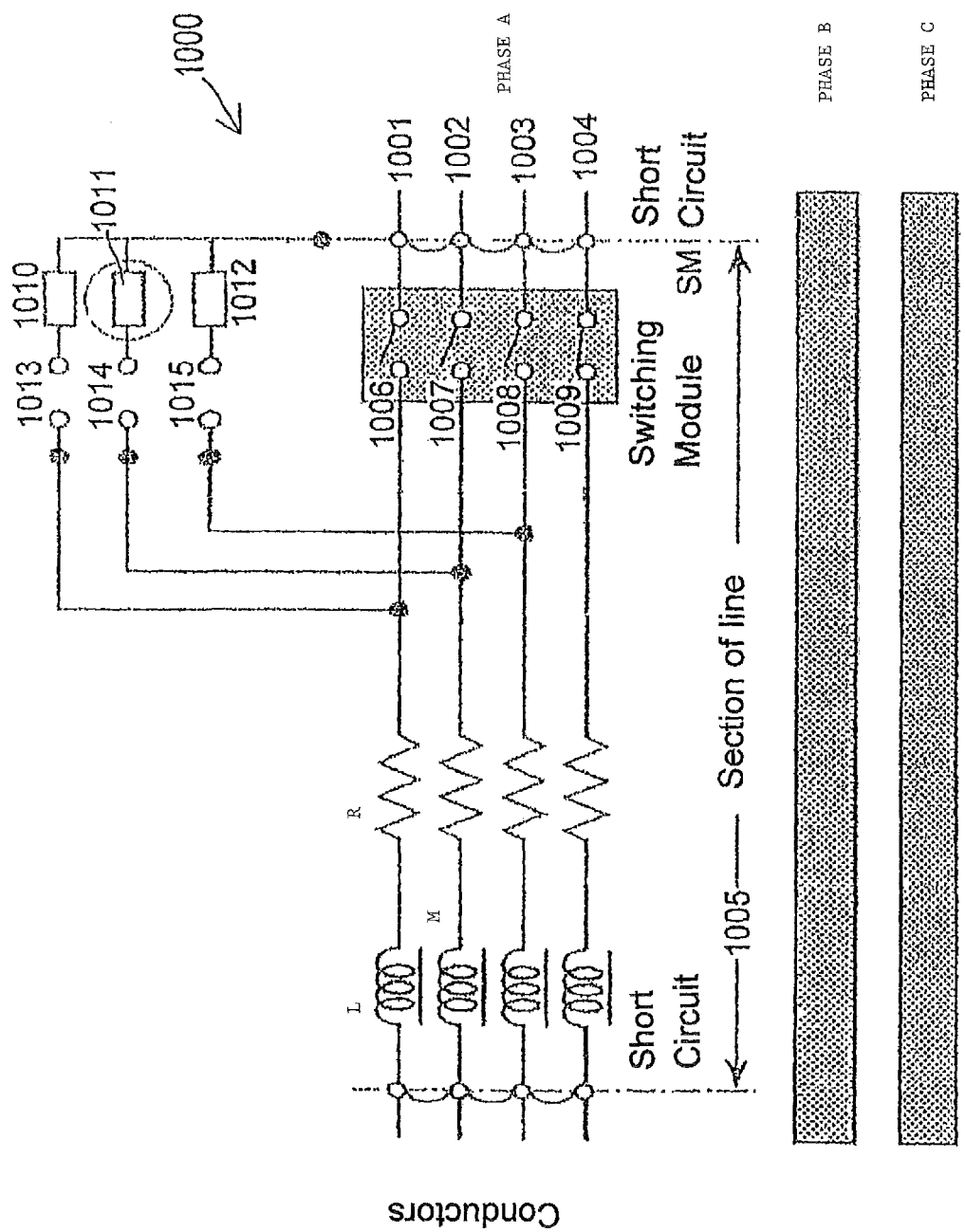
FIG. 47 is an electrical schematic diagram of a part of an apparatus according to the preferred embodiment of the invention.

As illustrated in FIG. 47, the objective of monitoring whether there is a flaw along a phase line on a first section of an electrical energy transmission line and locating said flaw if there is one can also be carried out with an apparatus 1000 according to another preferred embodiment of the invention. The phase line comprises n conductors 1001, 1002, 1003 and 1004 electrically insulated one from another and short-circuited between themselves at two extremities of the first section. The length of the section is known. The apparatus 1000 is located at a first of the extremities of the first section. The apparatus 1000 comprises an interrupter 1006, 1007, 1008 or 1009 to open one of the n conductors. The apparatus 1000 also comprises a signal generator 1010, 1011 and 1012 for injecting an incident electrical pulse in the conductor. The apparatus 1000 also comprises a detector for detecting on the conductor a reflected electrical pulse in response to the incident pulse, the pulses having a known propagation speed in the conductor. The apparatus 1000 also comprises memory for storing the incident pulse injection and reflected pulse reception times. The apparatus 1000 also comprises a transmitter for transmitting a signal representative of a geographic location of the first extremity of the first section. The apparatus 1000 also comprises a device for determining if there is a flaw as a function of the transmission and reception times, of the length of the first section and of the propagation speed, and, if there is a flaw, geographically locating of said flaw as a function of the signal representative of the geographic location transmission by the transmitter, by the injection and reception times, and of the propagation speed. The different devices of the apparatus 1000 can be carried out by a processor 570 as shown for example in FIG. 46. This apparatus monitors in an "active" manner the phase line.

Preferably, the detector is adapted to operate at a sampling frequency of at least 1 MHz for detecting said reflected pulse.

Preferably, the apparatus comprises a processor, for example the processor 570 shown on FIG. 46, that allows the use of means for detecting and storing data on the conductor starting at the moment when the incident electrical pulse is injected up to the moment when the reflected electrical pulse is detected.

The object of determining if there is a flaw along a phase line on a section of an electrical energy transmission line, and thus locating said flaw if there is one, can also be met with a method comprising several steps according to another preferred embodiment of the invention. The phase line comprises n conductors electrically insulated one from another and short-circuited between themselves at two extremities of the section. The length of the section is known. The method comprises the steps of:

a) opening one of the n conductors at one of the extremities of the section to inject therein an incident electrical pulse, and for storing an transmission time of the incident pulse;

b) detecting a reflected electrical pulse received in response to the incident pulse on the conductor at the extremity of the section, and storing a reception time of the reflected pulse, the pulses having a known propagation speed in the conductor;

c) transmitting a signal representative of the geographic location of the extremity of the section; and d) determining whether there is a flaw as a function of the transmission and reception times, of the length of the section and of the propagation speed, and, if there is a flaw, geographically locating said flaw as a function of the signal representative of the geographic location of step c), of the transmission and reception times, and of the propagation speed.

Preferably, the step of detecting the reflected pulse on the conductor at the extremity of the section and of storing the reception time of the reflected pulse is carried out at a sampling frequency of at least 1 MHz.

Preferably, step b) comprises a step of detecting and storing data on the conductor starting at the moment when the incident electrical pulse is injected up to the moment when the reflected electrical impulse is detected.

According to another preferred embodiment, the object of monitoring a phase line of a section of an electrical energy transmission line can also be met with a monitoring apparatus 1000, as better illustrated in FIG. 47. The phase line comprises n conductors 1001, 1002, 1003 and 1004 electrically insulated one from another and short-circuited between themselves at two extremities of the section 1005. The apparatus comprises at least one first interrupter 1006, 1007, 1008 and 1009 connected in series with at least one of the conductors 1001, 1002, 1003 and 1004.

The apparatus 1000 also comprises, as shown for example in FIG. 46, a detector for detecting at least one parameter representative of the current operational conditions of the phase line. The apparatus comprises a processor having first input ports for receiving signals indicative of the operational positions of the interrupters and at least a second entry port for receiving the signals indicative of the parameter. The apparatus also comprises a radiofrequency receiver connected to the processor for receiving control signals and a controller for controlling the first interrupter 1006, 1007, 1008 and 1009 as a function of the control signals. The apparatus also comprises a radiofrequency transmitter connected to the processor for transmitting signals indicative of the operational positions of the interrupters 1006, 1007, 1008 and 1009 and of the parameter. The apparatus also comprises electrical power means for powering the processor, the receiver and the transmitter.

Preferably, the monitoring apparatus 1000 of a phase line of a section of an electrical energy transmission line also comprises a high voltage pulse generator 1010, 1011 and 1012 and a spark-gap 1013, 1014 and 1015 connected in series with the pulse generators 1010, 1011 and 1012. The pulse generator and the spark-gap form a circuit connected in parallel with the first interrupter. In another embodiment, the pulse generator is a current pulse generator.

The object of monitoring a phase line of a section of an electrical energy transmission line is also met with a method for monitoring a phase line of a section of an electrical energy transmission line. The phase line comprises n conductors 1001, 1002, 1003 and 1004 electrically insulated one from another and short-circuited between themselves at two extremities of the section 1005. The method comprising the steps of providing at least a first interrupter 1006, 1007, 1008 and 1009 connected in series with at least one of the conductors 1001, 1002, 1003 and 1004, detecting at least one parameter representative of current operational conditions of the phase line, receiving signals indicative of the operations positions of the interrupters 1006, 1007, 1008 and 1009 and of the signals indicative of the parameter with a processor having first input ports and at least one second input port. The method also comprises the step of receiving control signals with a radiofrequency receiver connected to the processor, controlling the first interrupter 1006, 1007, 1008 and 1009 as a function of the control signals, transmitting signals indicative of the operational positions of the interrupters 1006, 1007, 1008 and 1009 and of the parameter with a radiofrequency transmitter connected to the processor and powering the processor, the receiver and the transmitter with electrical power means.

Preferably, the method for monitoring a phase line of a section of an electrical energy transmission line also comprises, before the step of detecting at least one parameter, the steps of generating a high voltage pulse with a high voltage pulse generator 1010, 1011 and 1012, sparking the pulse with a spark-gap 1013, 1014 and 1015 for producing a high voltage pulse and for injecting the high voltage pulse into the conductors 1001, 1002 or 1003.

DEFINITION

A "Smart Power Line (SPL)" includes a conventional bundled transmission line (e.g.: a line at 735 KV) on which one insulates the subconductors of the phases on 30 Km segments and to which one adds at every 60 Km, on a anchoring tower, switches mounted on the phases and an active or passive line monitoring system.

Operational Principle

The mounted switches redirect current in one or several of the subconductors of the bundle in order to deice the line or to modulate its impedance ("Line Impedance Modulator LIM"). A smart transmission line, in addition of analyzing itself and monitoring itself for maintenance purposes, allows monitoring in real time of the electrical behaviour of the line and of the network and allows modification, if needed, of power flow in the line and in the electrical network.

This high redundancy mounted technology acts directly on the network and can be numerically controlled through a remote central control station. It is compatible with a smart network.

This "Flexible AC Transmission System" or FACTS being distributed completes the other network FACTS.

Impact on the Operation of a Conventional Transmission Line

The addition of this technology on a conventional transmission line does not compromise:
- the electrical insulation of the line, since it is mounted directly on a phase without any reference to any of the other phases or with the ground;
- the electrical continuity of the line, because at all times a direct galvanic line or a "make before break" galvanic line ensures continuity;
- the maximum transit capacity of the line, because at all times the internal circumventing jumpers allow one to reallocate to the line its full transit capacity; and
- the mechanical resistance of the line, because it is not mechanically connected in series with the line. It is supported by circumventing jumpers on the anchoring tower. This anchoring tower and mounted switches constitute a mini sub-station.

Impact on the Reliability and Safety of the Line

This technology allows an increase in the electrical reliability of the line and of the network:
- by reducing the number of short-circuits due to galloping through the detection and suppression of galloping with the powered deicing;
- by reducing the number of short-circuits due to freezing rain, frost or wet snow under powered deicing; and
- by redirecting power to other lines in contingency cases.

Impact on Operation of the Line

This technology allows one to increase in a significant manner the mechanical reliability of the line and to increase its operations life:
- by avoiding collapsing of the line due to freezing rain, frost or wet snow through powered deicing;
- by reducing fatigue and avoiding breakage due to galloping under powered deicing;
- by avoiding accelerated aging due to an overload caused by exceptional climatic events, for example, a combination of wind and freezing rain, of wind and frost or of wind and wet snow; and
- by avoiding rotation of bundles caused by random removal of ice. This allows to keep at all times the center of mass below the geometric center of the bundle through a control of the sequence of the removal of the subconductors.

Impact on Maintenance of the Line

This passive monitoring technology allows specific and localized preventive maintenance of the line or switches through:
- precise localisation of faults in grounding and between phases, through measurement and analysis of travel times of the perturbating event, that is the time required before the event is detected by one or several detectors;
- precise localisation of lightning strikes, through measurement and analysis of travel time of the perturbating event;
- precise localisation of line breaks, through measurement and analysis of travel time of the perturbating event;
- localisation of the increase of a corona effect through a fault on the lines or on the line guard rings;
- a comparison of arc signatures of vacuum switches;
- continuous follow-up of the current passage in the switching module, through measurement and analysis of currents and voltages.

This active line monitoring technology through the help of a high voltage pulsate generator located within the switching module allows one to:
- monitor the insulation state of spacers and tool yokes, through the measurement and study of reflections produced through insulation faults; and
- monitor the state of conductors, through measurement and study of reflections produced through faults in the conductors.

Impact on Protection of the Line and of the Network

Phasor measurement, in addition to allowing monitoring of the behaviour of the line and of the network, allows an increase in the protection of the line, through direct action on the circuit breakers.

Phasor measurement allows also verification of the operation and calibration of the measurement equipment in the network substations.

Measurement of the phasors also allows a visualization of power flow in the network.

Impact on Operation of the Network

This distributed and modular technology allows an increase in the transit capacity of the network:

by controlling power flow, through modulation of the impedance of the lines in order to reduce bottlenecks.

And in more advanced versions:

by stabilizing interregional oscillations, through the addition of damping; and by increasing the network stability, through the addition of distributed brake resistor grids.

Increase in the Transit Capacity of a Line

One can increase the transit capacity of a mono conductor or a bi-conductor line and turn it into a smart line through the addition of other conductors by phases and by adding switching modules in order to deice and to control power flow therein.

The additional weight of the conductors is compensated by the reduction in the weight of ice due to the deicing modules. This method allows one to avoid reinforcement of towers, of insulators, and line foundations.

This modification, in addition to increasing the transmit capacity of the line, reduces corona discharge.

In a more general manner, one can say that the converting of a conventional line into a smart line allows monitoring of the evolution of the line, reduction of galloping, avoidance of collapse of the line due to freezing rain, frost or wet snow, reduction of the number of faults due to galloping, to freezing rain, to frost or wet snow accumulations and consequently increases the operational life of the line. Moreover, a smart line can be used as a measuring instrument on a smart network and as an actuator for controlling power flow in the same network. All of these advantages are obtained without compromising the operation of the latter.

The description that follows reproduces in part the description of the invention described in patent application CA 2,569,267.

In the drawings, the cables linking the different elements of the switching apparatus, the sensors and the command cards of the electronic switches are not shown.

Figure 7:
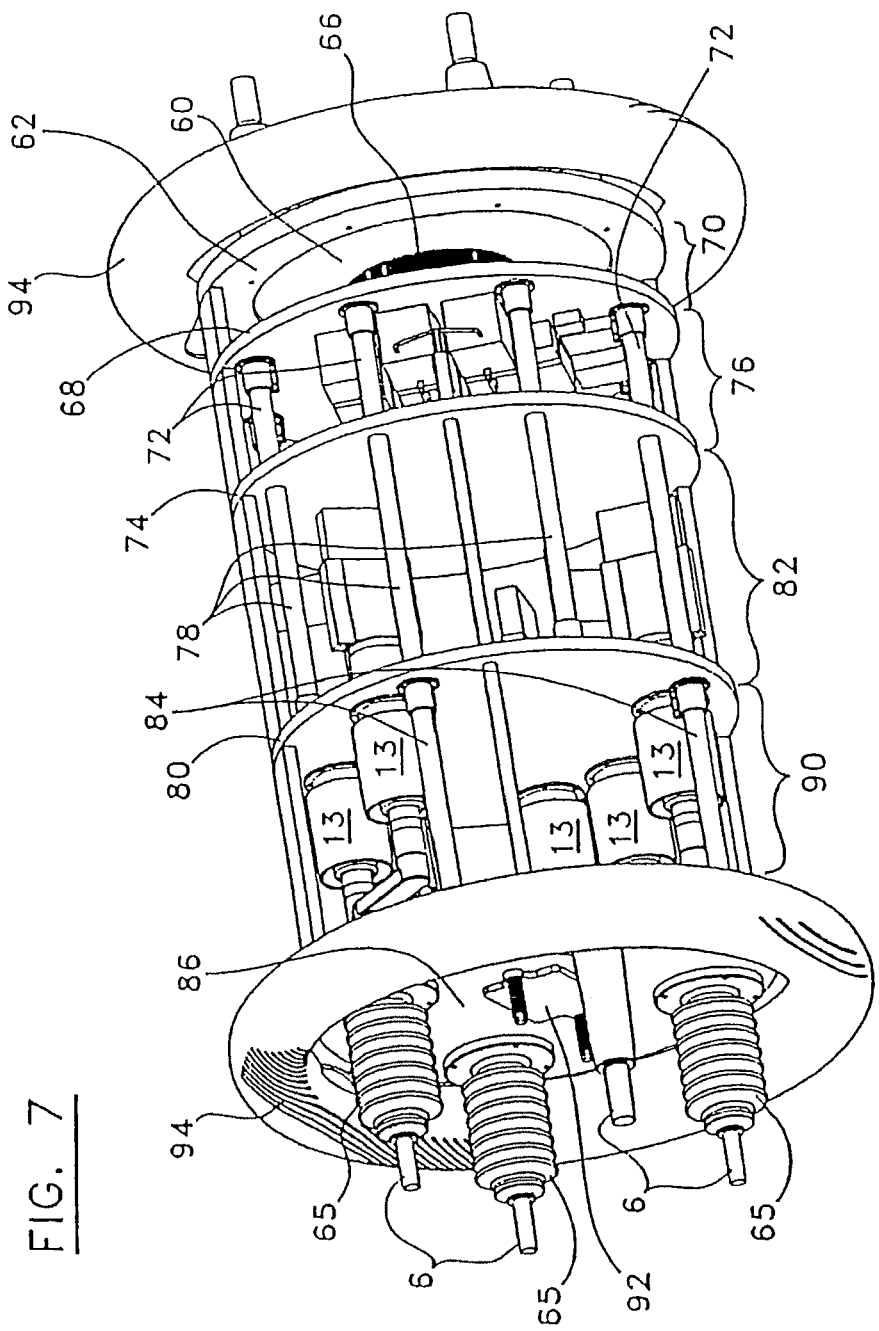
FIG. 7 is a perspective side view of an apparatus according to a preferred embodiment of the present invention.
Figure 8:
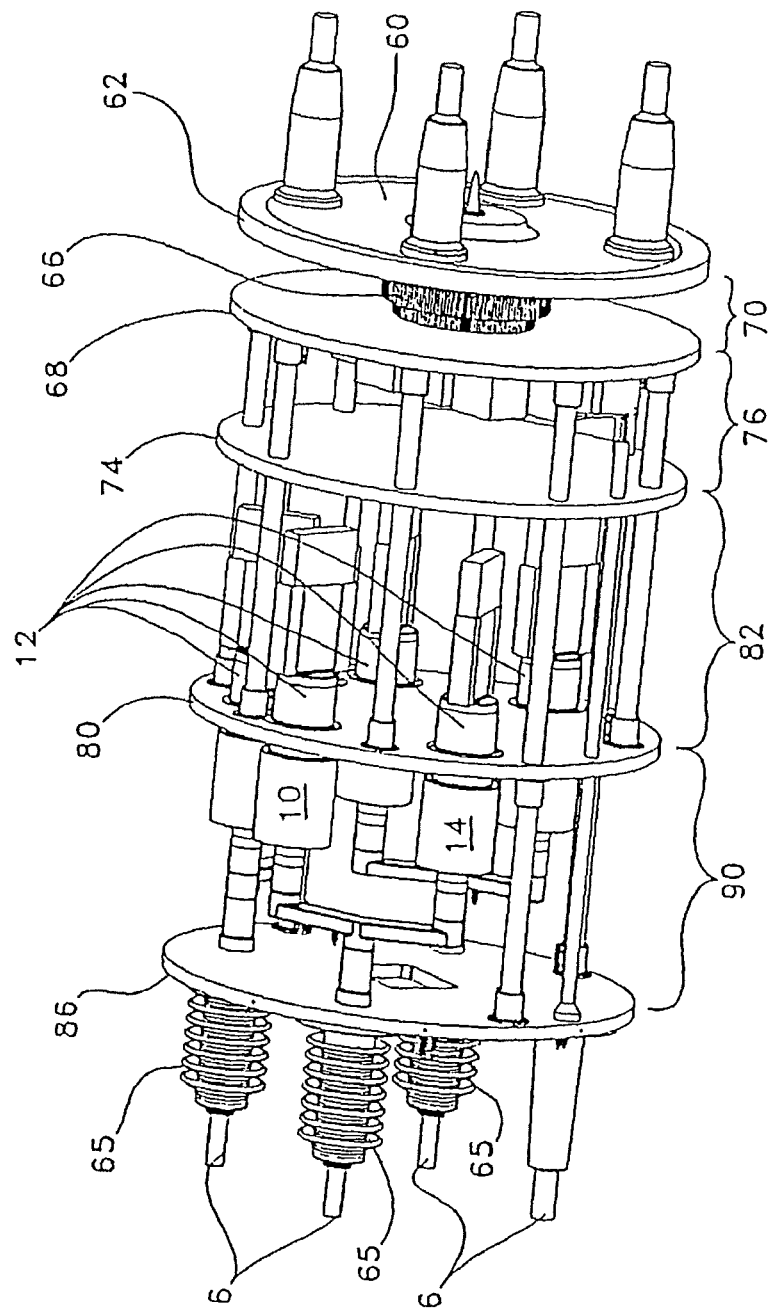
FIG. 8 is another perspective side view of the apparatus shown in FIG. 7.
Figure 24:
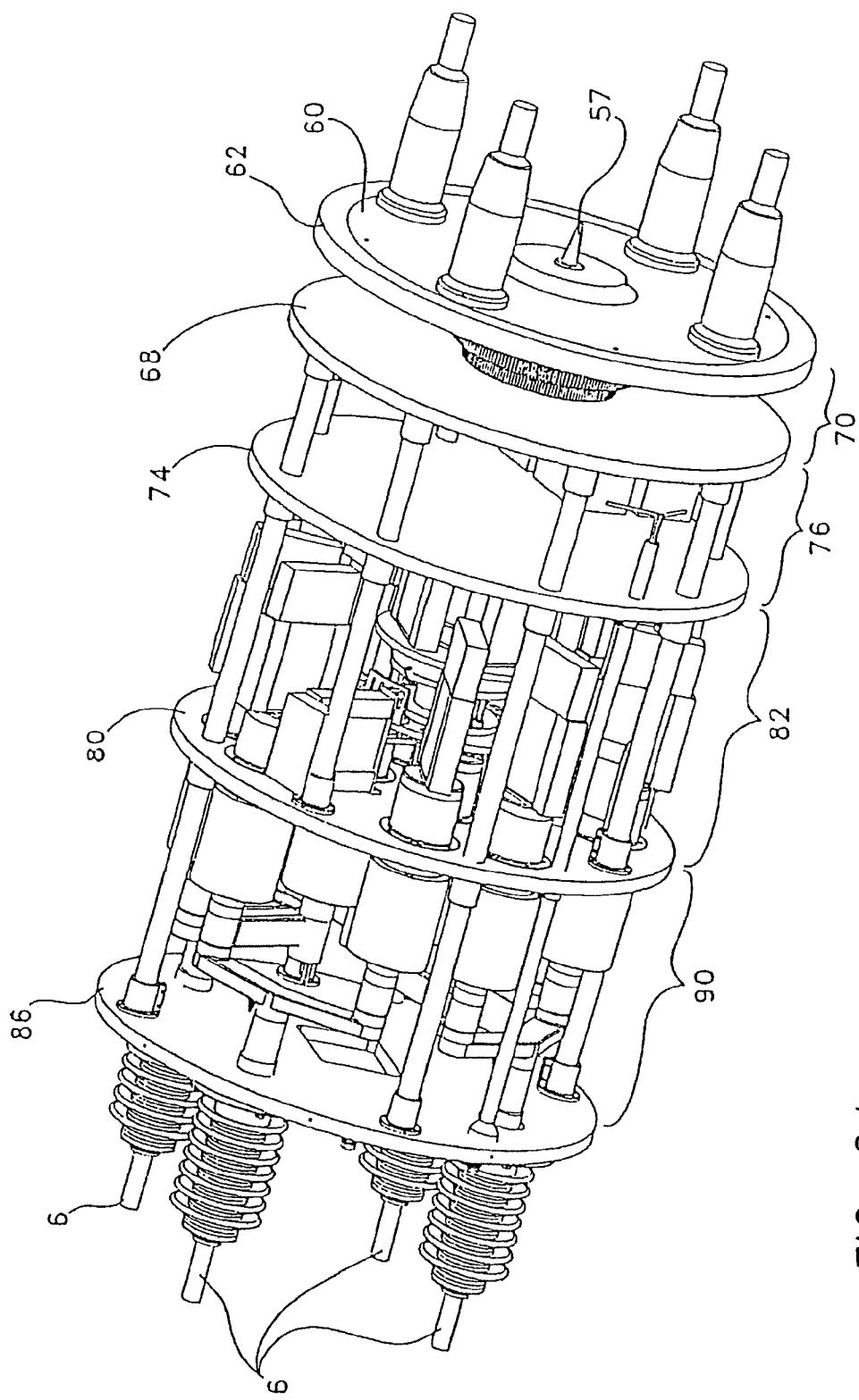
FIG. 24 is a side perspective view of an apparatus according to another preferred embodiment of the invention.
Figure 25:
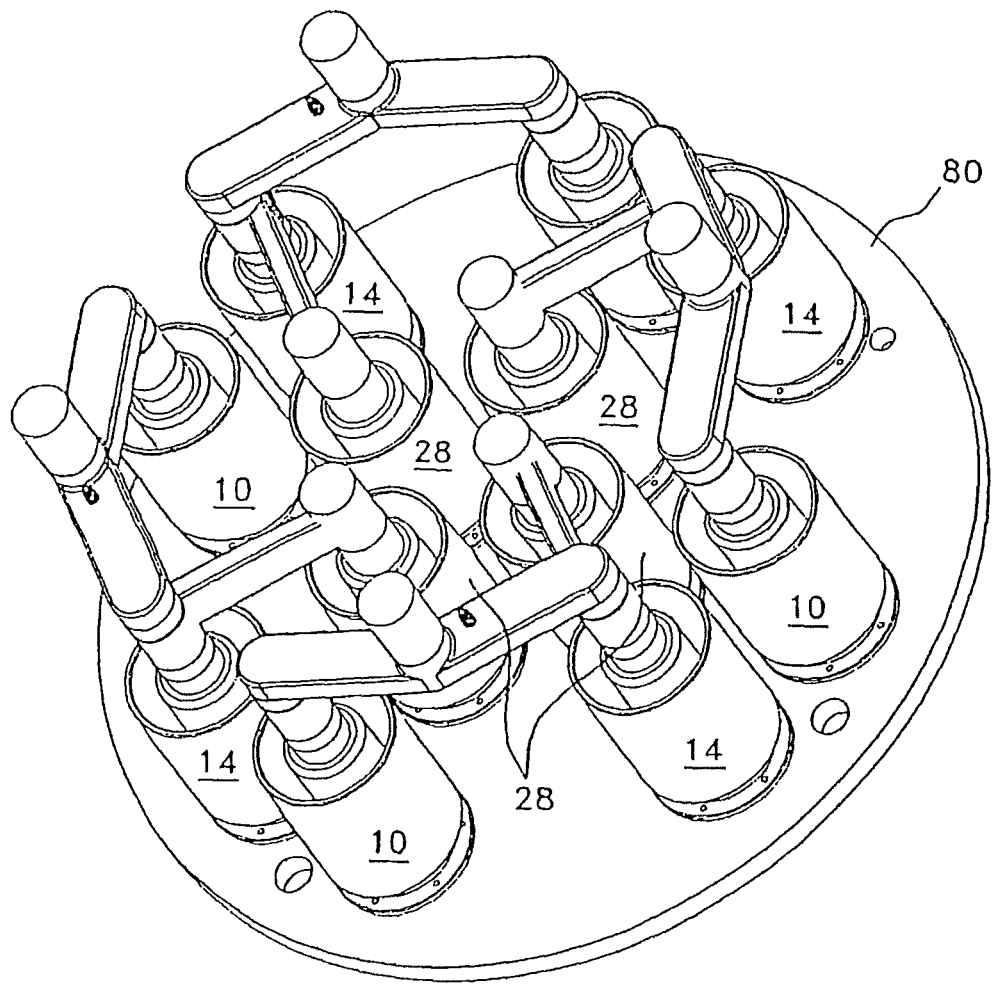
FIG. 25 is a front perspective view of elements shown in FIG. 24.
Figure 26:
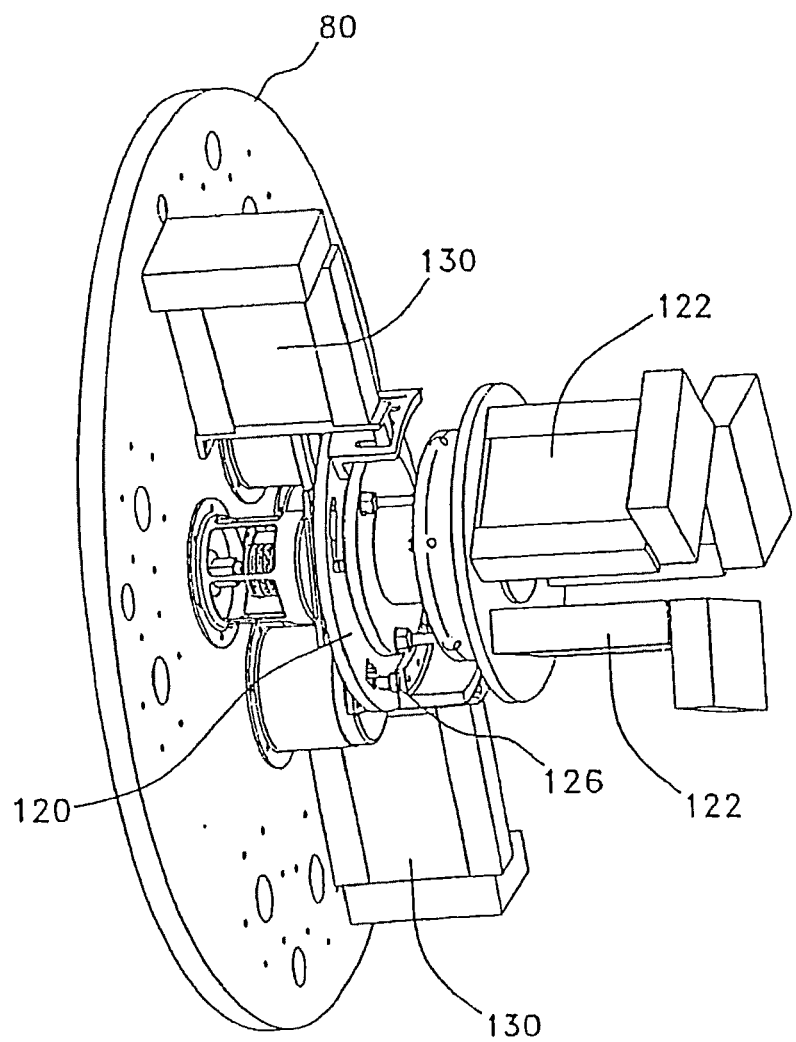
FIG. 26 is a side perspective view of elements shown in FIG. 24.
Figure 28:
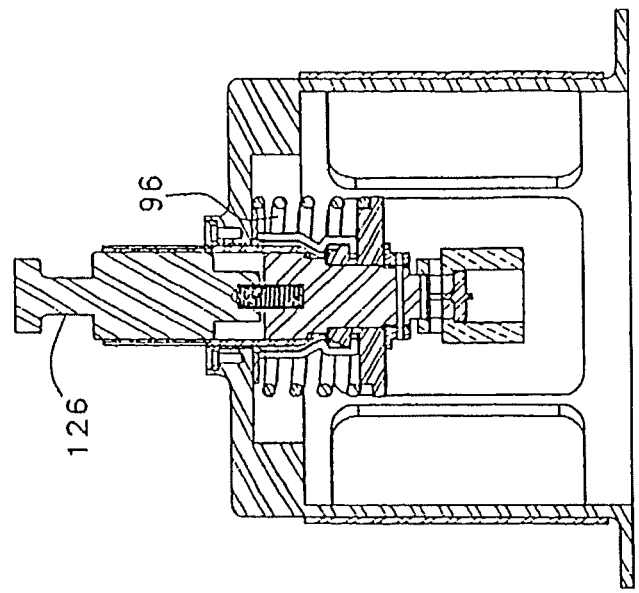
FIG. 28 is a cross-sectional view along line A-A of FIG. 27.
Figure 27:
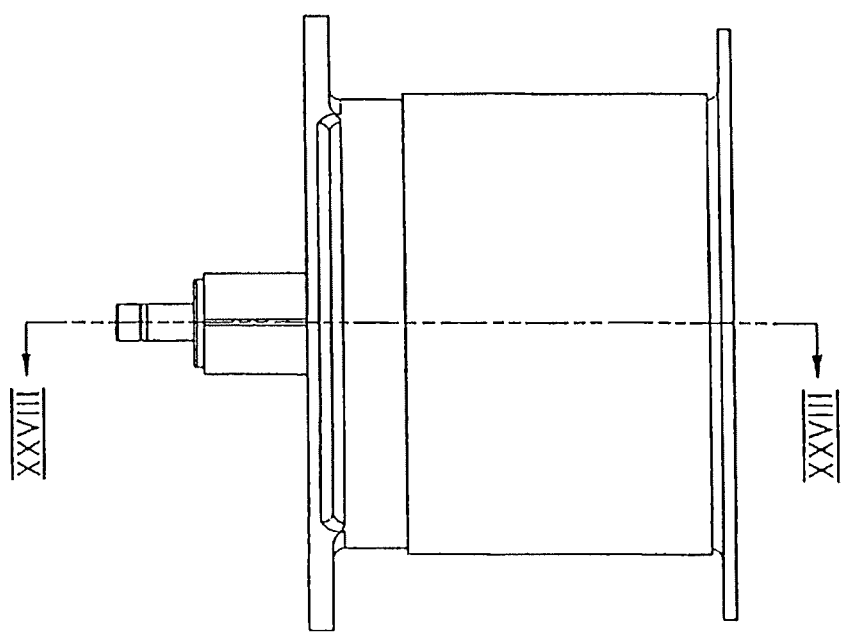
FIG. 27 is a side view of elements shown in FIG. 24.
Figure 29:
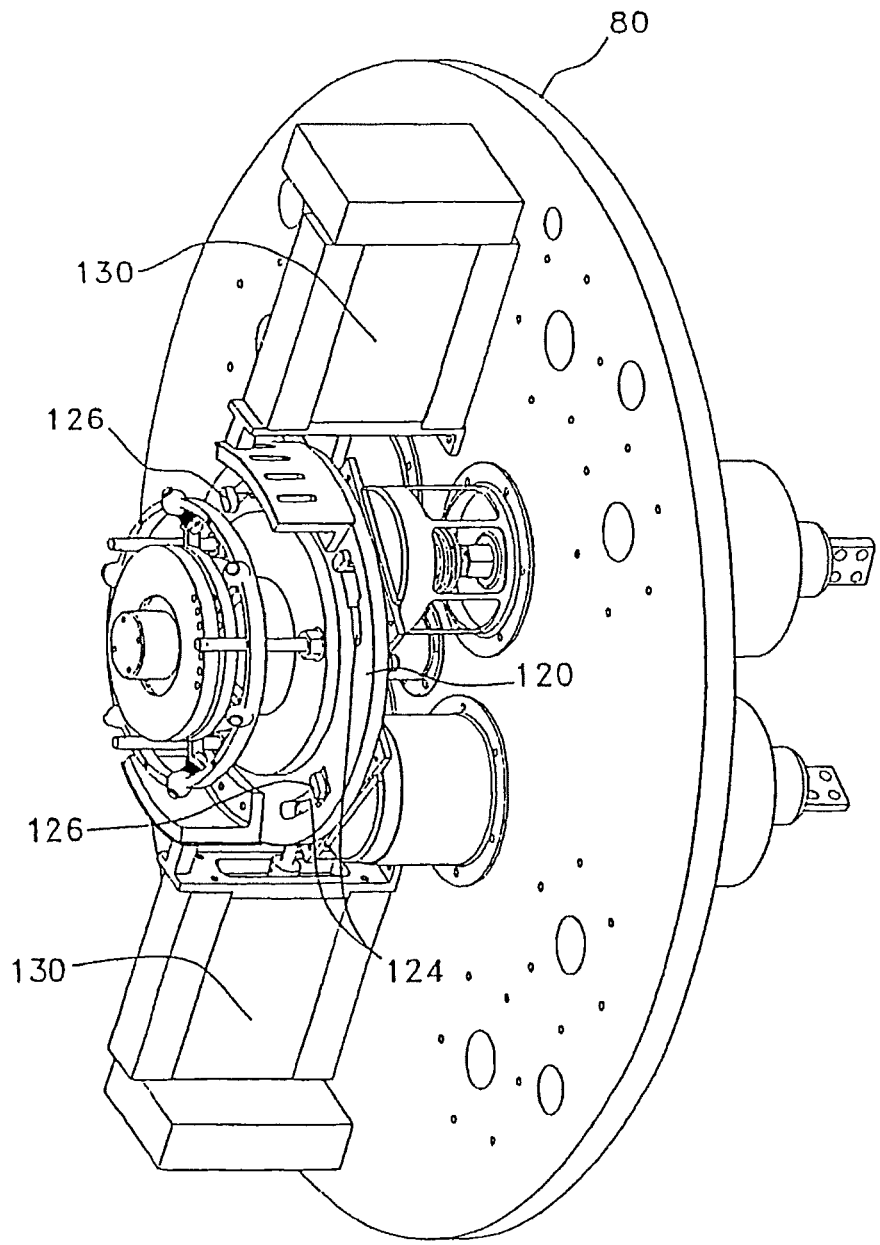
FIG. 29 is a side view of elements shown in FIG. 24.
Figure 30:
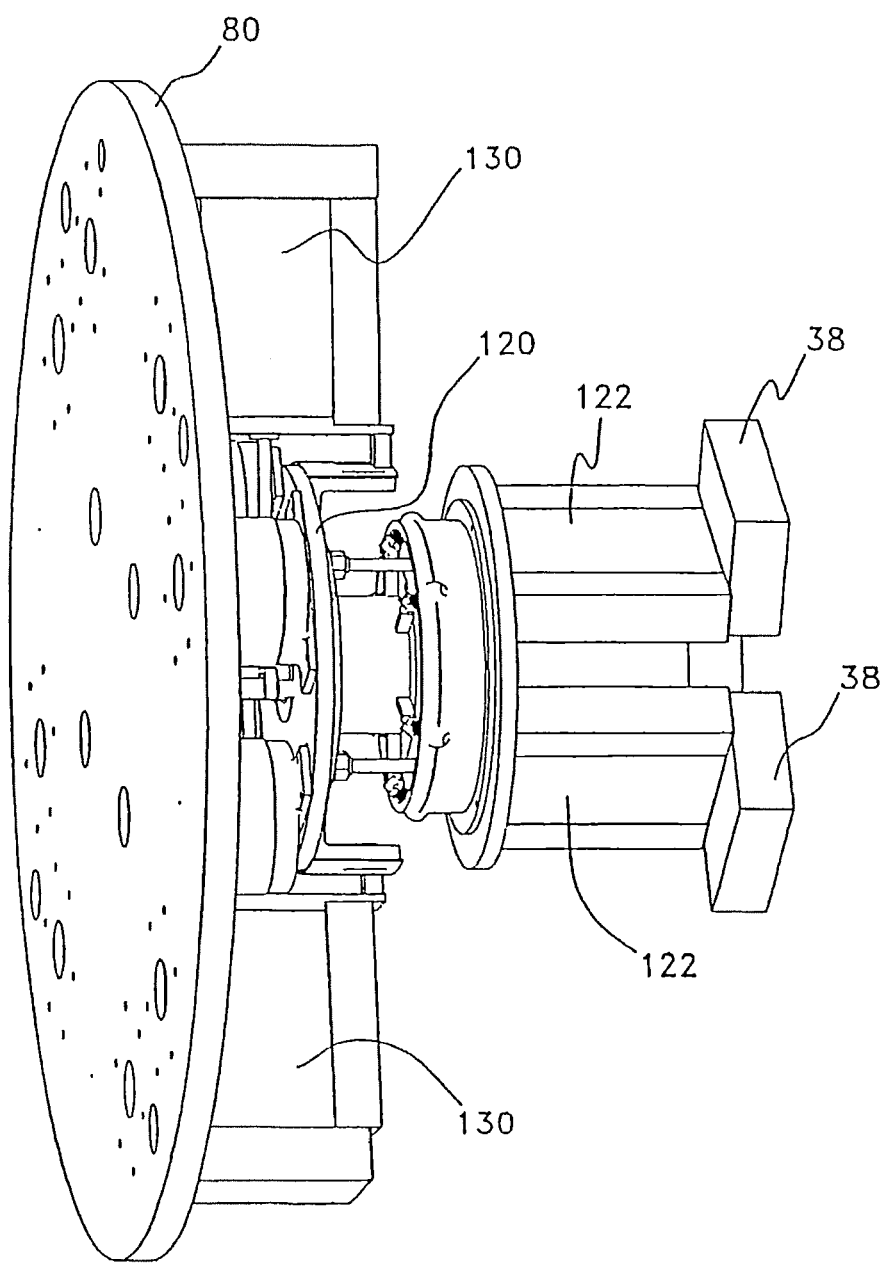
FIG. 30 is a side view of elements shown in FIG. 24.
Figure 31:
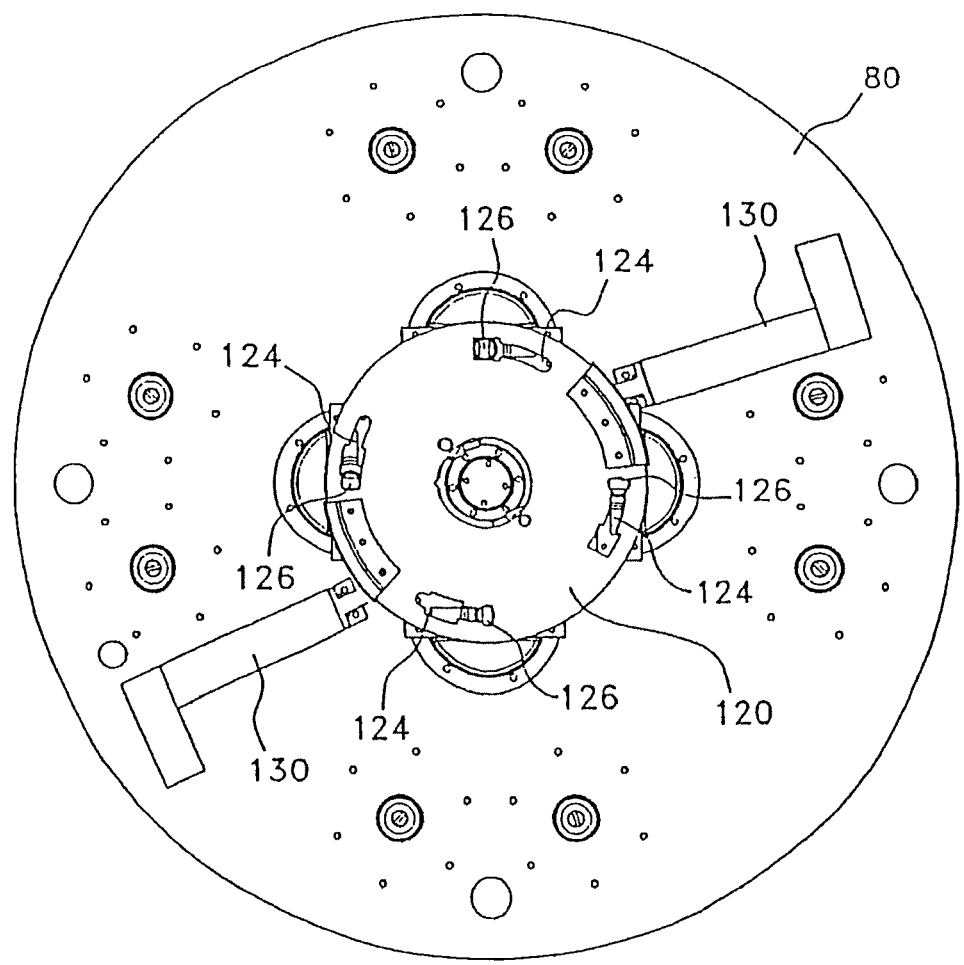
FIG. 31 is a front view of elements shown in FIG. 26.
Figure 32:
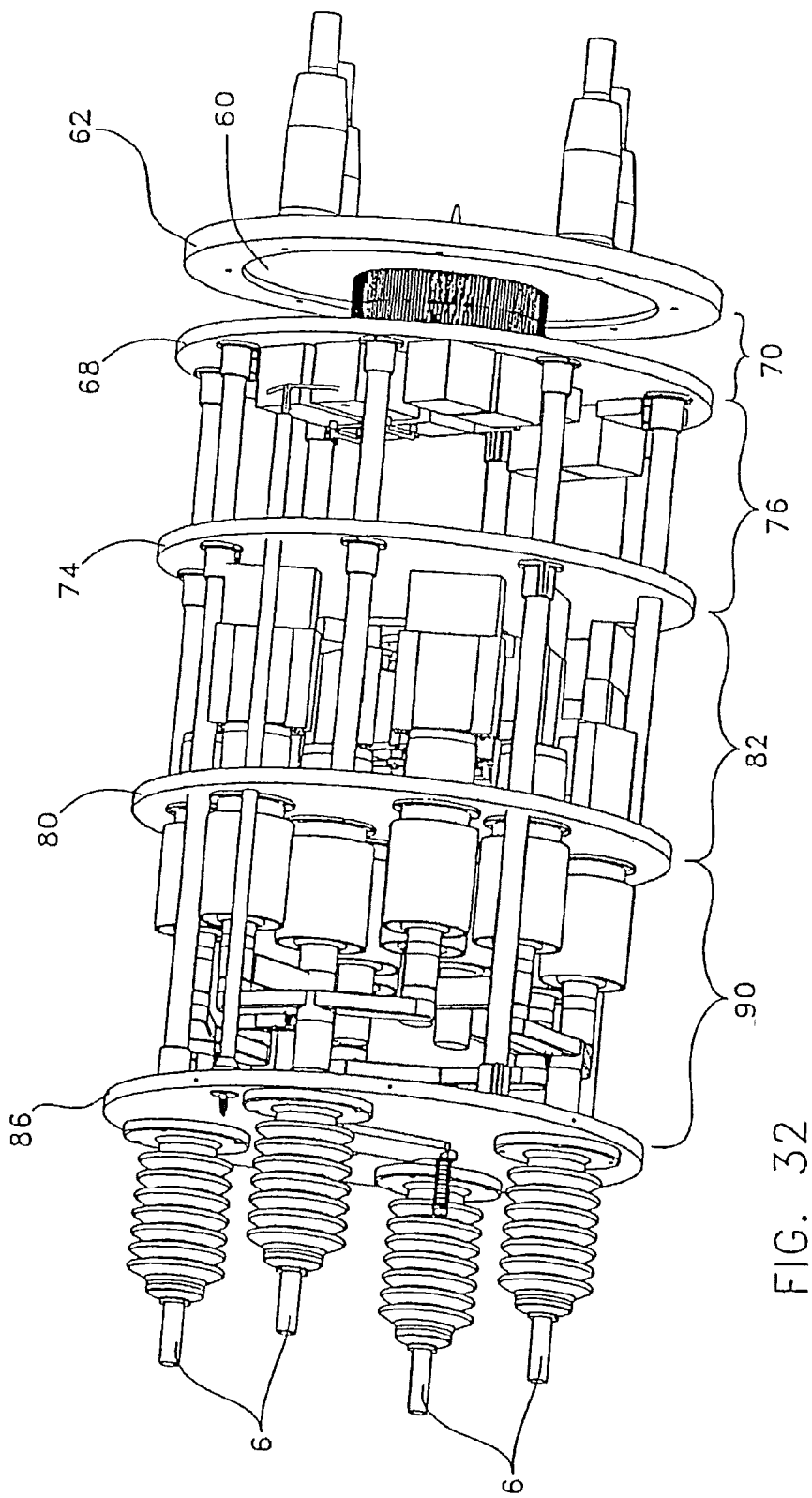
FIG. 32 is a side perspective view of an apparatus according to another preferred embodiment of the present invention.
Figure 33:
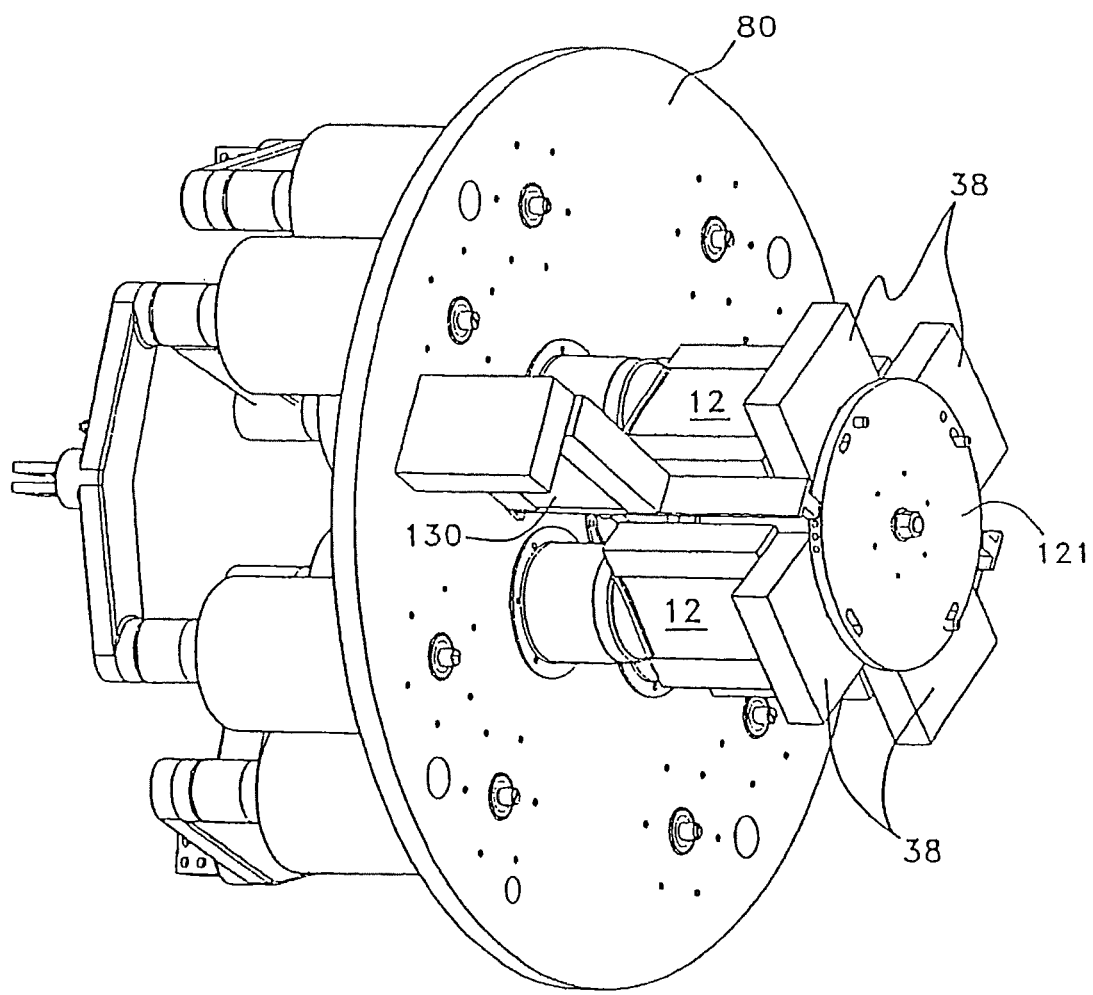
FIG. 33 is a side perspective view of elements shown in FIG. 32.
Figure 35:
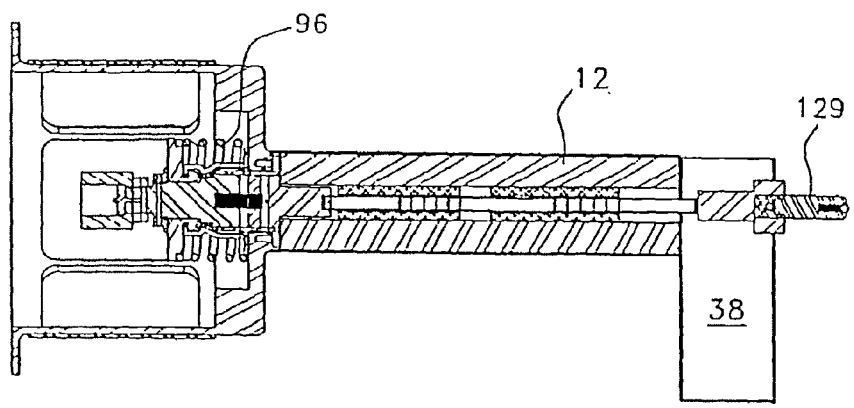
FIG. 35 is a cross-sectional view along line A-A of FIG. 34.
Figure 34:
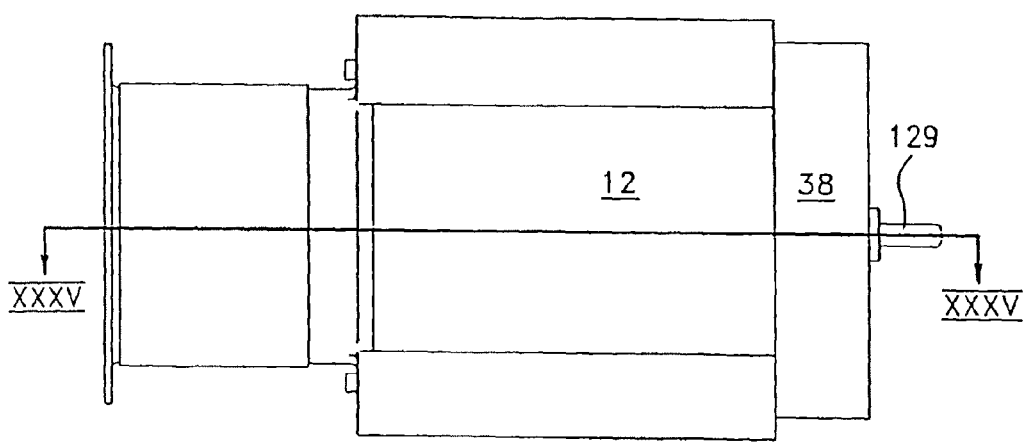
FIG. 34 is a side view of elements shown in FIG. 32.

The present invention relates to a line impedance modulator (LIM) which is a distributed flexible AC transmission system (FACTS) where each of the segments has a length of several tens of kilometers and is independent. According to the present invention, each segment of the electrical power line is provided with a switching module characterized in that it comprises at least one vacuum interrupter connected in series with at least one of the conductors of the segment. According to a preferred embodiment, such as shown in FIG. 7, at least one of the conductors is not provided with a switch which means that such conductor always provides a galvanic link. According to other preferred embodiments where switches are provided on all of the conductors, such as shown for example in FIG. 24, a make before break mechanism is provided so that the four conductors of a segment of the phase line are never opened simultaneously.

Figure 5:
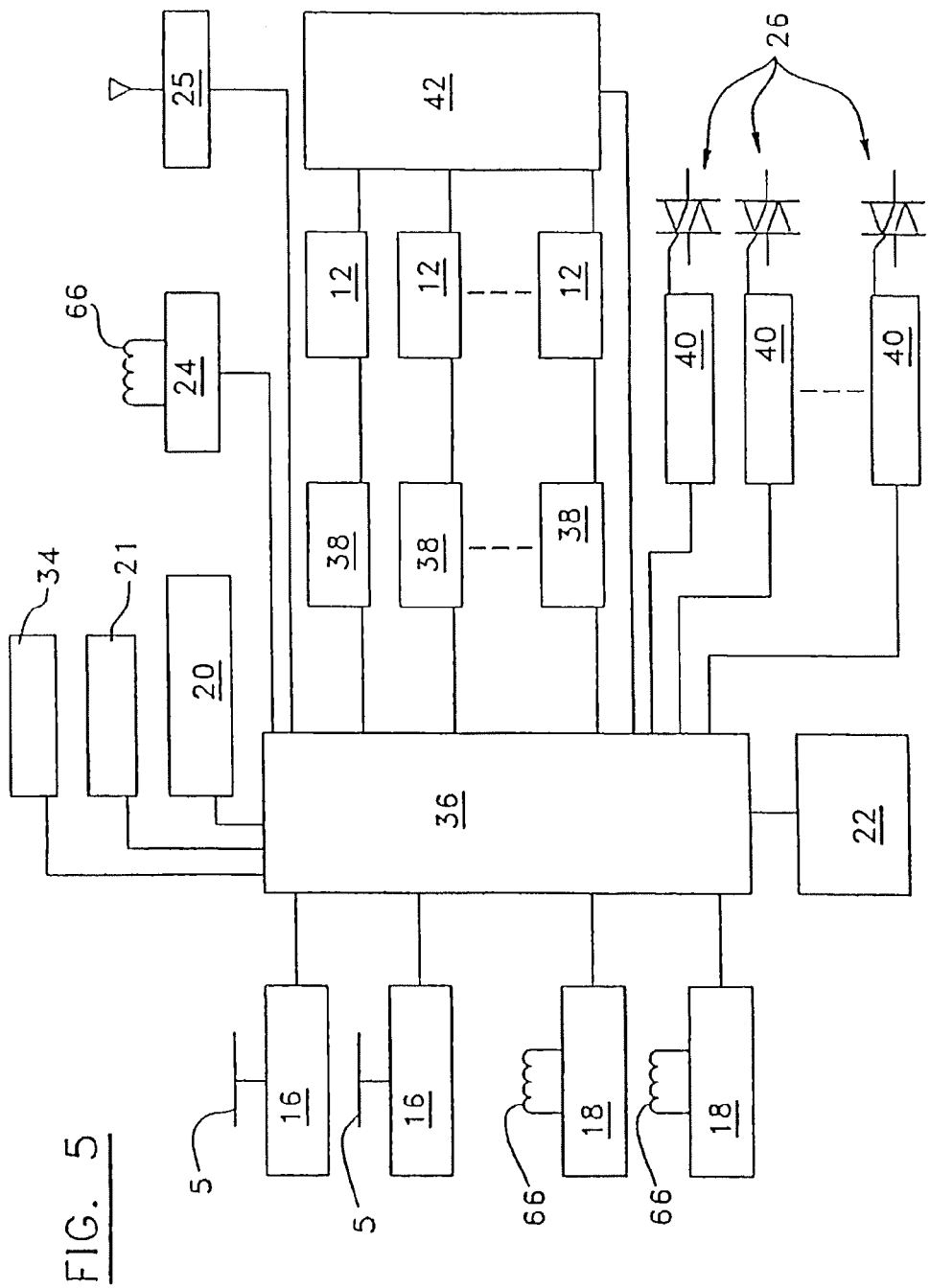
FIG. 5 is a block diagram of an apparatus according to a preferred embodiment of the invention shown in FIG. 2.
Figure 17:
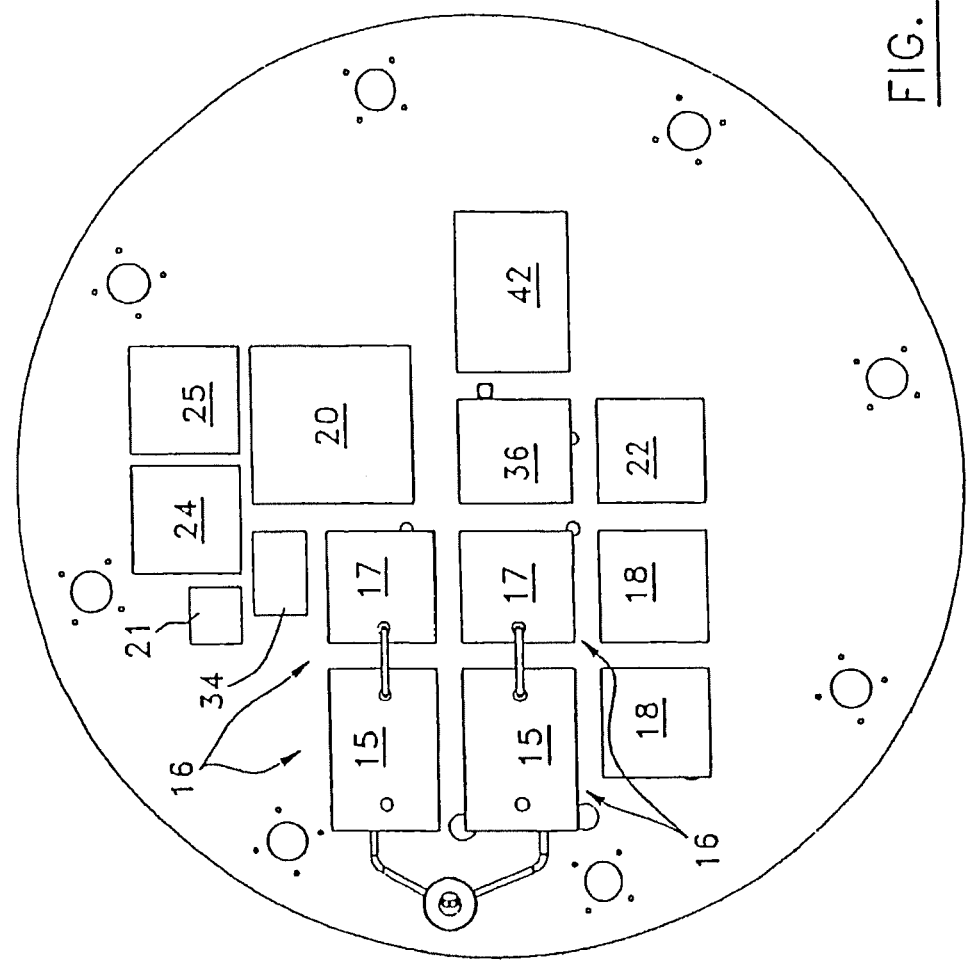
FIG. 17 is a front schematic view of the apparatus shown in FIGS. 7 and 8.
Figure 42:
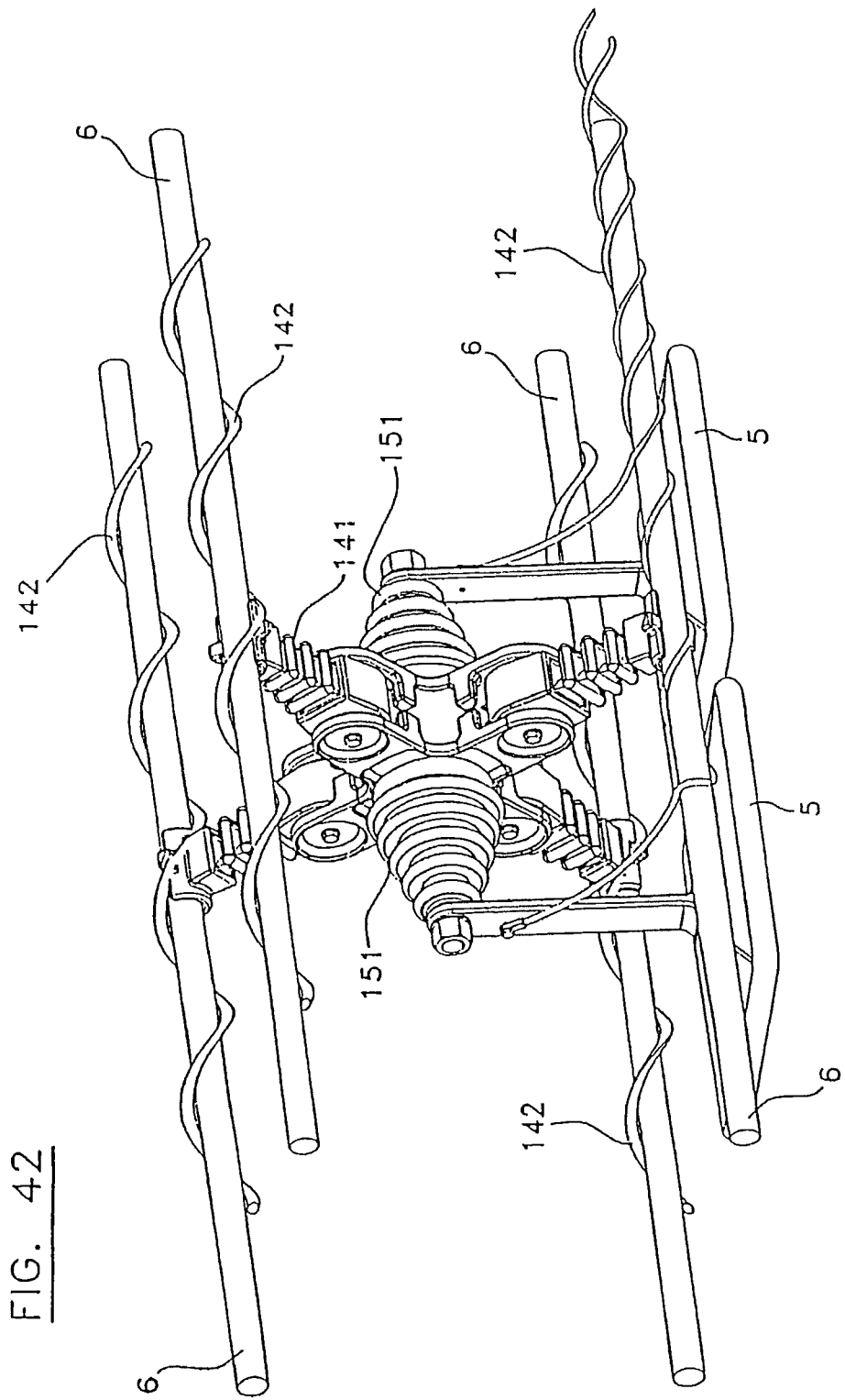
FIG. 42 is a side perspective view of an antenna of a contactless capacitive power supply, mounted on the conductors of a phase line.

According to preferred embodiments of the present invention, redundancy is provided on several levels for safety purposes. For example, according to preferred embodiments, pairs of vacuum interrupters such as shown in FIGS. 9 to 14, connected in parallel are provided. Still according to preferred embodiments, linear actuators such as shown in FIGS. 9 to 14, are provided for forcing the closing or the opening of a given vacuum interrupter in case of a malfunction. Still according to a preferred embodiment, as shown in FIGS. 5 and 17, communications are provided by means of power line communication, wireless communication or even communication by optical fiber. A remote control of the apparatus can be performed via the communication system. Still according to preferred embodiments, as shown in FIGS. 7, 17 and 42, power supply is provided from the electrical power line by means of a contactless power supply operating either with magnetic coupling or capacitive coupling.

Still according to preferred embodiments, data representative of the current and past operations of the power line can be provided for analysis. Still according to a preferred embodiment, there is provided a black box containing a memory storing data representative of current and past operations of the apparatus, as shown in FIG. 5 or in FIG. 46.

Still according to a preferred embodiment of the present invention, means are provided for closing all of the conductors of the line phases of the electrical power line in case of a malfunction of the communication system and thereby reestablishing the phase line. Still according to a preferred embodiment of the present invention, data representative of the current operations of each phase line of the segment can be sent through a communication system for remote diagnostic and maintenance.

According to a preferred embodiment, in case of loss of communication with one or multiple switching apparatus, the vacuum interrupters in one or several apparatus close themselves in a pre-established sequence causing the power line to return to its initial state within a few tens of milliseconds, which means that the power line recovers its full carrying capability. Furthermore, in case of loss of power supply in one of the switching apparatus, the vacuum interrupters close themselves in a pre-established sequence and the line is returned to its initial state within a few tens of milliseconds which means the segment of the electrical power line recovers its full capability.

Some potential applications of the present invention include the following: line impedance modulator (LIM); line deicer; on-line power supply; current thresholder; sub-synchronism resonance damping; inter-area oscillations damping; and breaking resistor. Passive components can be added to the apparatus according to the present invention according to the teaching of PCT application published under International Publication no 02/41459, published on May 23, 2002.

Figure 1:
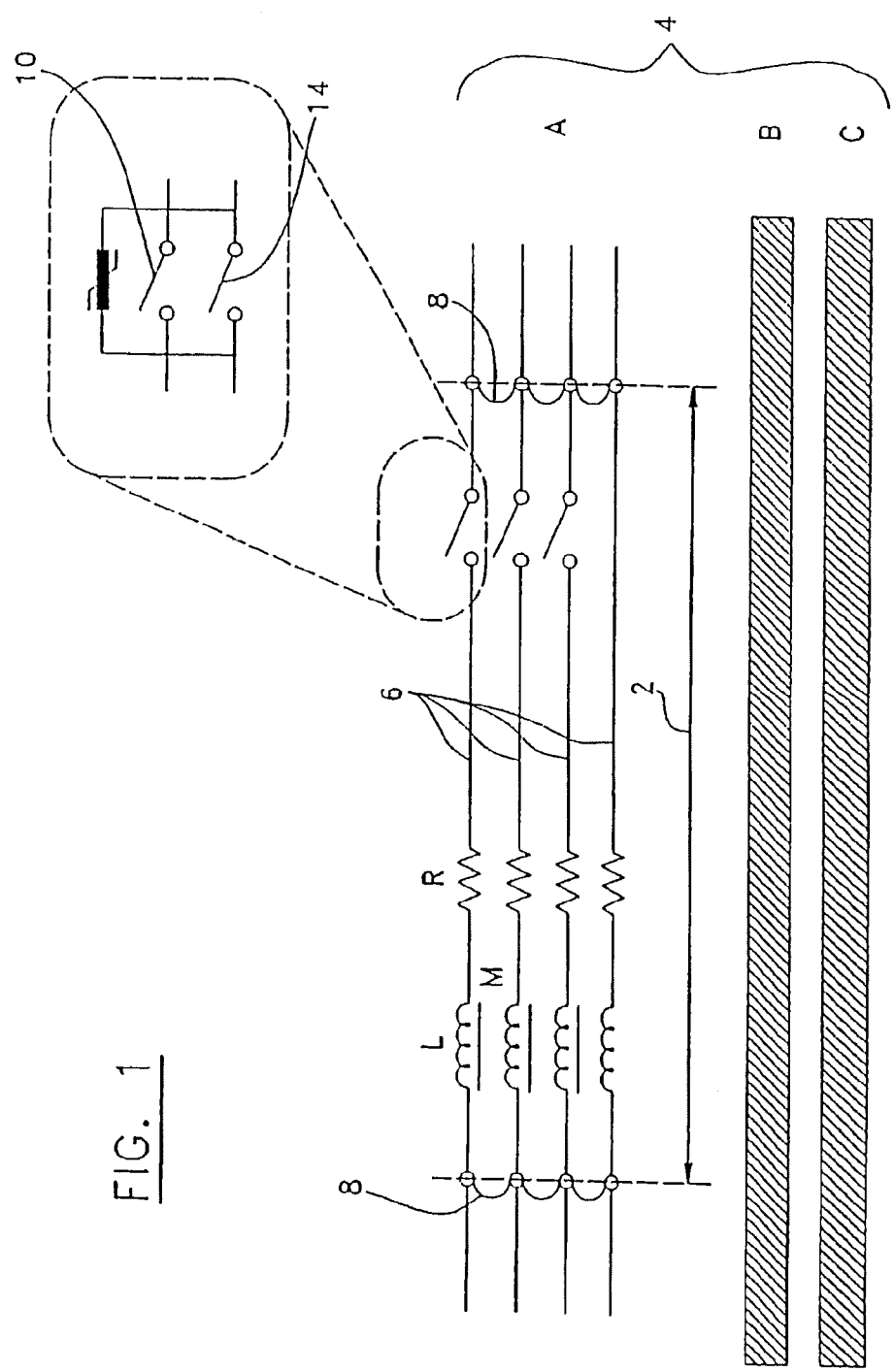
FIG. 1 is a schematic view of a section of an electrical energy transmission line comprising interrupters.

We will now refer to FIGS. 1 and 5. The components shown in FIG. 5 are specifically adapted to the embodiment of FIG. 2 but they can be easily adapted to the embodiment of FIG. 1 and even to embodiments of FIGS. 3 and 4 by a person skilled in the art. There is provided a switching apparatus for varying an impedance of a phase line of a segment 2 of an electrical power line 4. The phase line including four conductors 6 electrically insulated from each other and short-circuited together at two ends of the segment by means of short circuits 8. The phase line shows four conductors but there can be n conductors 6. R, L, M are respectively representative of the resistance, the inductance and the mutual inductance of the segment 2 of the phase line 4. The segment 2 has three phase lines A, B and C.

At the minimum, the apparatus comprises at least one vacuum interrupter connected in series with at least one of the conductors 6. In the present case, there are provided three first vacuum interrupters 10 associated respectively to three conductors of the phase line, three first controllable motors 12 for selectively opening and closing the three first vacuum interrupters 10, three second vacuum interrupters 14 connected in parallel respectively with the first vacuum interrupters 10, and three second controllable motors 12 for selectively opening and closing the second vacuum interrupters 14. The apparatus also comprises a detector for detecting a parameter representative of current operating conditions of the phase line 4. In the present case, contactless capacitive and inductive power supplies 16 and 18 are provided. The apparatus also comprises a controller 20 for controlling the first and second controllable motors 12 according to parameters detected by detectors and requests from remote control. A main contactless power supply is provided for supplying an electricity supply from the phase line. The main contactless power supply comprises the capacitive and inductive power supplies 16 and 18.

Converters are provided for converting the electricity supply from the phase line into DC and AC supplies. The DC supply feeds a capacitor box 22 for storing the DC energy.

Each of the power supplies 16 and 18 is doubled to provide a redundancy. Each inductive power supply 18 comprises current transformers 66 located in a compartment of the apparatus as shown for example in FIG. 7. These transformers have their primary supplied by the phase current. The secondary of the transformers supplies a converter which is connected to stocking capacitors located in the capacitor box 22 via the distribution box 36.

Each capacitive power supply 16 comprises an insulated conducting plate called capacitive antenna 5, shown for example in FIG. 42, located a few centimeters from the conductors of the phase line. The antennae 5 is electrically connected to transformers 15 shown in FIG. 17 and located within the switching apparatus by means of an insulator feedthrough 97 shown for example in FIG. 22. The transformers 15 supply converters 17 shown in FIG. 17, connected to the capacitor box 22 via the distribution box 36.

These capacitive and inductive power supplies 16 and 18 are connected to the distribution box 36 which distributes the electrical energy to different elements of the apparatus. This distribution box 36 is controlled by the controller 20 of the switching apparatus.

A power line communication system 24 of the PLC type (power line carrier) is connected to the controller 20 for communication through the phase line, and a high frequency emitter/receiver router 25 is connected to the PLC and to the controller 20 for wireless communication. A global positioning system 21 is also provided for locating the switching apparatus via satellite and for timing purposes. The router 25 and global positioning system 21 have antennae 57 as shown for example in FIG. 24.

All of the switching apparatus of a power line can be linked to a local telecommunication network. In this local network, the switching apparatus of each phase line communicates: 1) between the different sections of the power line through PLC; 2) between switching apparatus of a section through a short-range RF or infrared link; and 3) to the substation repeater at both ends of the electrical power line or in between, through a short-range RF, infrared link or fiber optic link.

Figure 2:
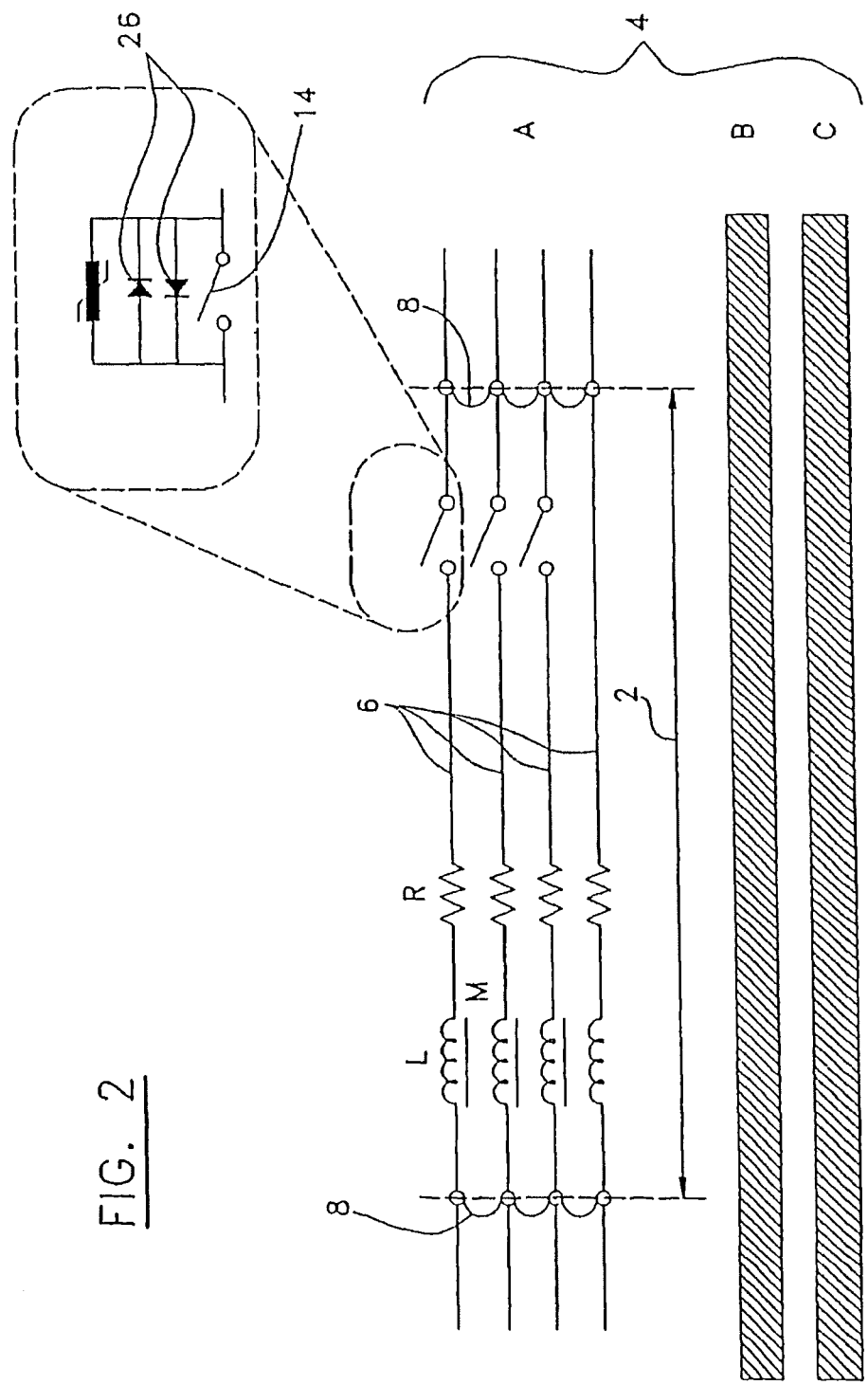
FIG. 2 is a schematic view of a section of an electrical energy transmission line comprising interrupters.

Referring now to FIG. 2, there is shown an embodiment where the apparatus comprises three electronic switches 26 connected in parallel respectively with the three vacuum interrupters 14, the electronic switches 26 are controlled by the controller. Of course, less than three electric switches can be provided.

Figure 3:
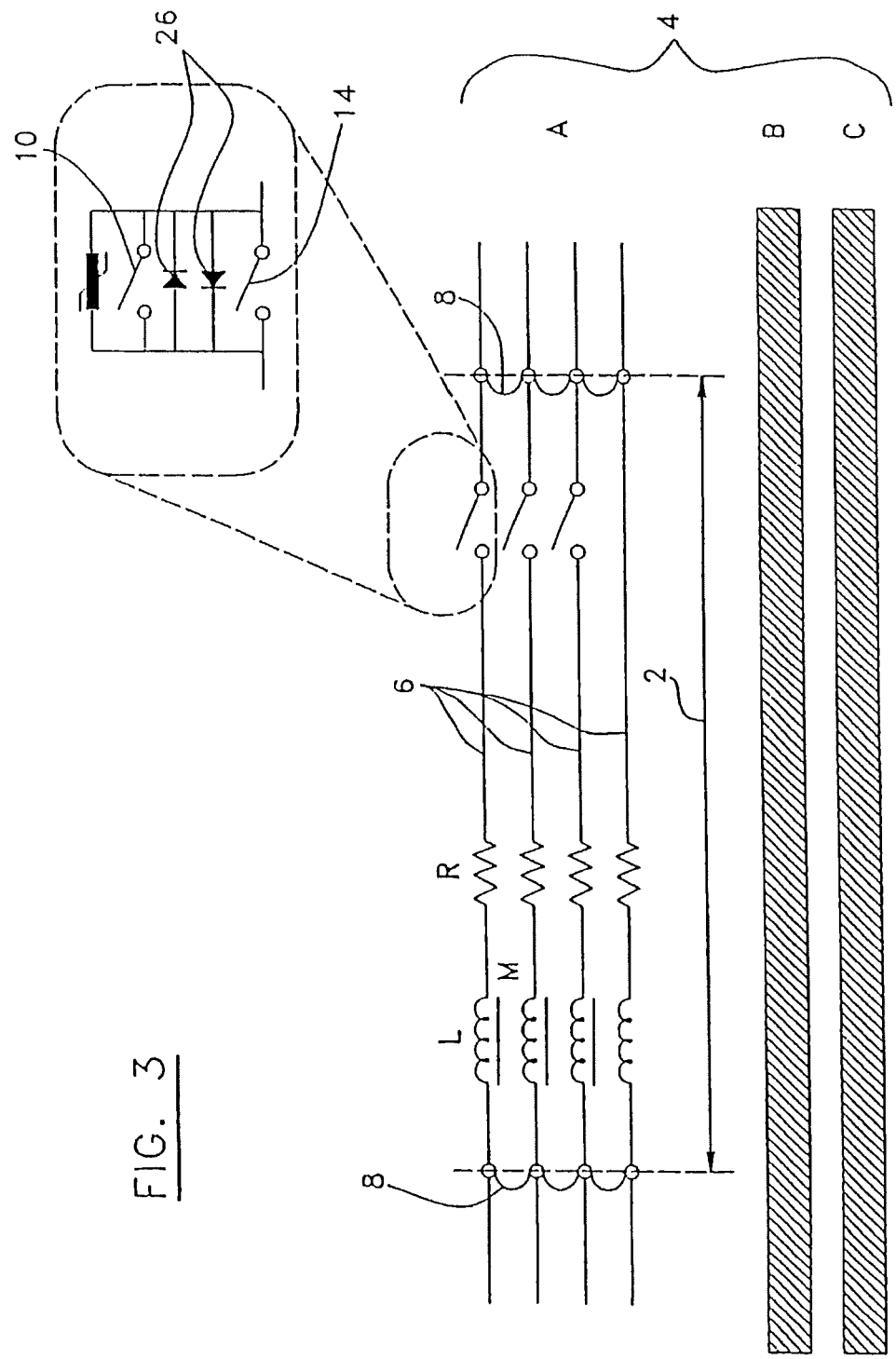
FIG. 3 is a schematic view of a section of an electrical energy transmission line comprising interrupters.

Referring now to FIG. 3, the apparatus, in this embodiment, comprises three electronic switches 26 connected in parallel to the first and second vacuum interrupters 10 and 14. It is also possible to provide less than three electronic switches.

Figure 4:
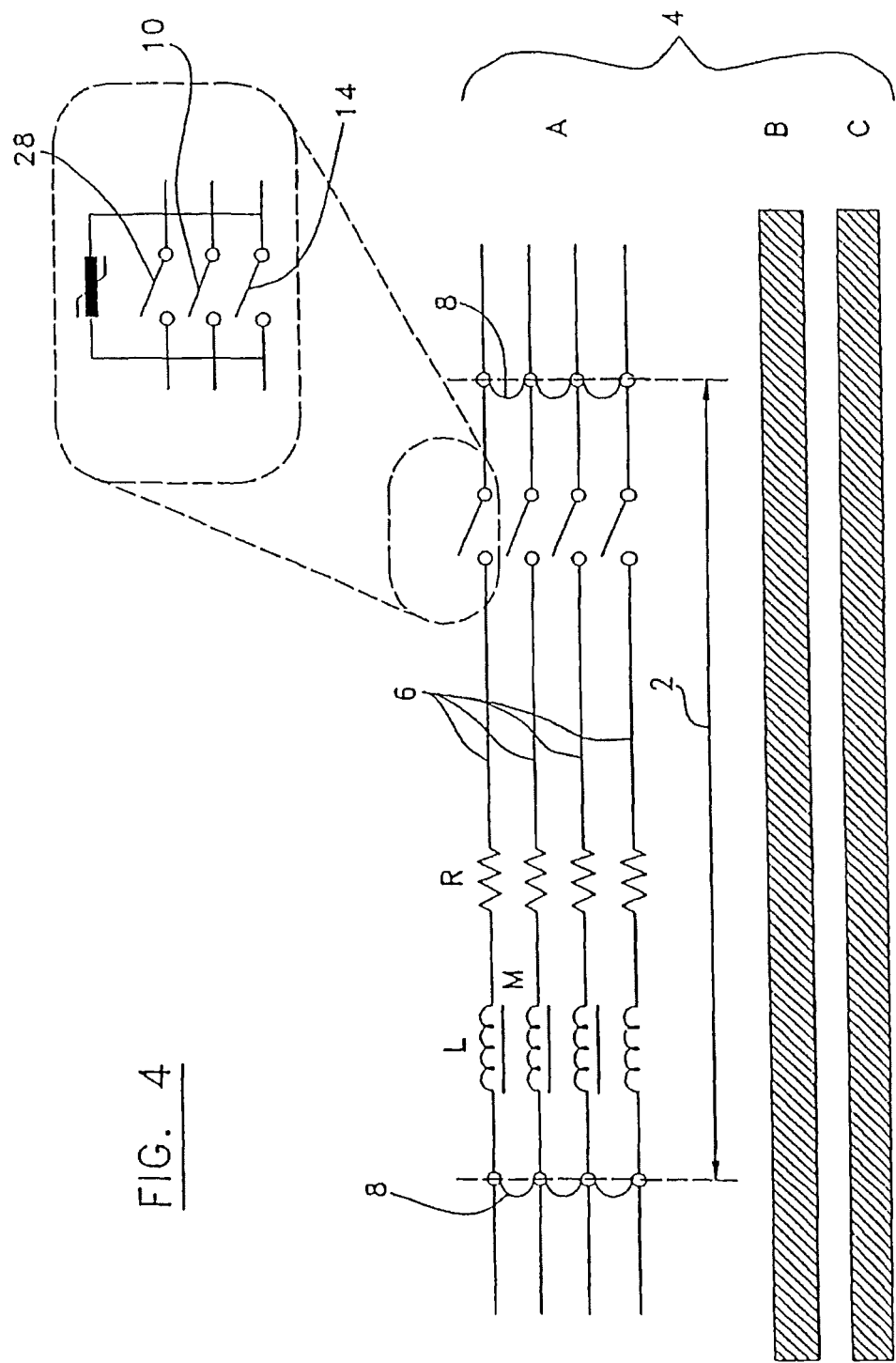
FIG. 4 is a schematic view of a section of an electrical energy transmission line comprising interrupters.

Referring now to FIG. 4, there is shown an apparatus according to the present invention for deicing. This apparatus comprises four first, second and third vacuum interrupters 10, 14 and 28 connected in parallel and associated respectively to four conductors of the phase line, and four first, second and third controllable motors 12 for selectively opening and closing the first, second and third vacuum interrupters 10, 14 and 28.

Referring now to FIG. 5, the apparatus comprises a black box 34 comprising a memory and a housing for protecting the memory. The memory is connected to the controller 20 for storing parameters representative of current and past activities of the switching apparatus and of the phase line. The controllable motors 12 can be single phase linear motors, polyphase linear motors, regular motors provided with a lead screw or any other kind of motors. The flow of signals and power supplies within the apparatus is done by means of a distribution box 36. Each motor 12 is connected to the distribution box via a motor converter 38. Each electronic switch 26 is connected to the distribution box via an electronic switch control card 40.

Figure 6:
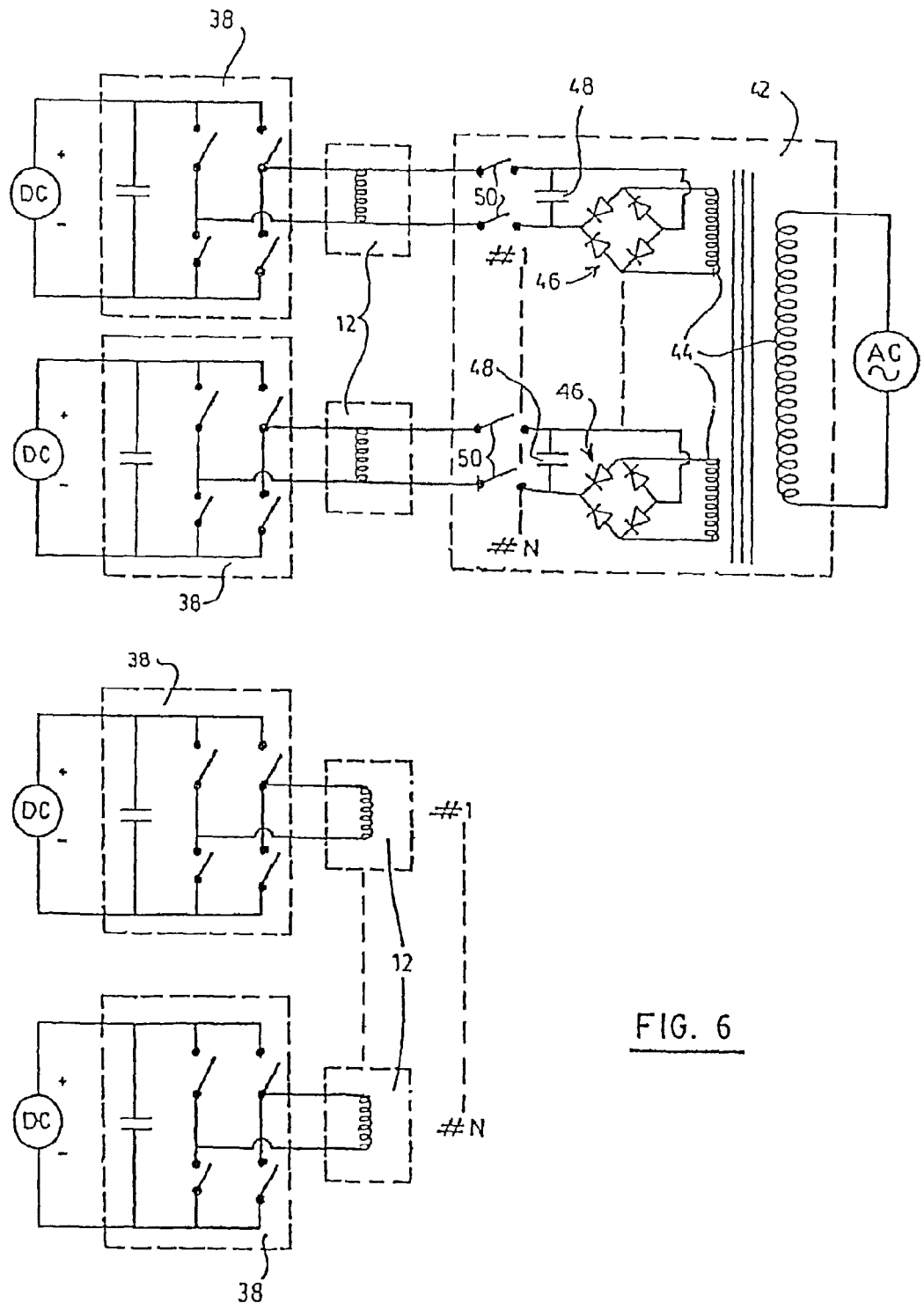
FIG. 6 is a circuit diagram partially illustrating the apparatus.

We will now refer to FIGS. 5 and 6. The motors 12 shown in the upper part of FIG. 6 are for controlling the second vacuum interrupters 14 shown for example in FIG. 1. The motors 12 shown in the lower part of the Figures are for controlling the first vacuum interrupters 10 shown also, for example, in FIG. 1. As can be seen in FIG. 6, the motors for controlling the second vacuum interrupters 14 which are used as bypass jumpers are connected to a "sidekick trigger" device 42. This "sidekick trigger" device 42 comprises, for each of the second controllable motors, a dedicated contactless power supply 44 for supplying an electricity supply from the phase line, a rectifier 46 for rectifying the electricity supply, a capacitor 48 for storing electrical energy from the output of the rectifier 46 and a controllable switch 50 for discharging the capacitor 48 into the corresponding second controllable motor to close it, upon reception of a control signal from the controller 20. The controller 20 has a detector for detecting a malfunction in the high frequency emitter/receiver router 25 and the power line transmission system 24 and any other malfunctions, and a command generator for generating the control signal upon detection of the malfunction to close at least one or all of the second vacuum interrupters 14 shown for example in FIG. 1 through the motor converters 38 if there is no response through the "sidekick trigger" mechanism 42.

The controller has also a detector for detecting a malfunction in the main contactless power supplies 16 and 18, and a command generator for generating the control signal upon detection of the malfunction to close at least one or all of the second vacuum interrupters 14 shown for example in FIG. 1. Furthermore, the controller has an input for detecting a malfunction in the first vacuum interrupters shown for example in FIG. 1, and a command generator for controlling the second controllable motors to close at least one or all of the second vacuum interrupters 14 shown for example in FIG. 1 upon detection of a malfunction in one of the first vacuum interrupters.

Referring now to FIGS. 1, 3 and 4, in case of an explosion in one of the first vacuum interrupters 10, which is not likely if the system is well designed, the second vacuum interrupter 14 associated with the first vacuum interrupter that has exploded is closed and the maximum impedance modulation amplitude is reduced by epsilon. The second vacuum interrupters 14 are used as bypass jumpers. Epsilon is small and is a function of the number of segments in service in the power line which can have a length of 200 km. The higher the number of segments, the lower is epsilon. If one vacuum interrupter is subject to a malfunction, the line continues to be operable. The replacement of a partially defective switching apparatus takes less than one day and this can be done without any service interruption. With exception of an unintentional flaw in the design, the power line will not lose his carrying capability. In case of a malfunction of one of the first vacuum interrupters 10, the second vacuum interrupter 14 takes over automatically.

We will now refer to FIGS. 2, and 7 to 17, to describe a preferred embodiment of the switching apparatus. The switching apparatus generally comprises at one end a first conducting plate 60 insulated by means of an insulator 62 from the lateral wall 64 of the housing shown in FIG. 18. This first conducting plate 60 electrically connects the four conductors of the line phase. The electrical current of the four conductors flows from the first plate 60 through a central conductor which extends through current transformers 66 then through a second conducting plate 68. These two conducting plates 60 and 68 dethreshold a first compartment 70 that contains the transformers 66. The transformers 66 are used for measuring the phase current, for extracting electrical supply from the phase line, and as an emitting and receiving antenna for the power line communication and the global positioning system (GPS).

The electrical current flows from this second conducting plate 68 though a series of conductors 72 located in periphery of this second plate 68 to a third conducting plate 74. These second and third conducting plates 68 and 74 dethreshold a second compartment 76 for housing the controller and the power supplies. This configuration reduces the magnetic field produced by the phase current within this second compartment 76, and also in compartments 82 and 90.

Then, the electrical current flows from this third plate 74 through conductors 78 located in periphery of this third plate 74 to reach a fourth conducting plate 80. These third and fourth conducting plates 74 and 80 dethreshold a third compartment 82 that contains the actuators. Each actuator comprises a motor, a converter and associated control mechanical devices. These actuators are controllable motors for opening and closing the vacuum interrupters. This fourth conducting plate 80 is used as a voltage reference for all of the vacuum interrupters. This fourth conducting plate 80 is connected to a fifth conducting plate 86 through conductors 84 located in periphery of this fourth conducting plate 80. This fifth conducting plate 86 is the output plate of the switching apparatus. The fourth and fifth conducting plates 80 and 86 dethreshold a fourth compartment 90 that contains the switches which are the vacuum interrupters. This fifth conducting plate 86 contains insulator feedthroughs 65 for the passage of the conductors 6, a door 92 for dampening overpressure in case of explosion, insulator feedthrough 97, shown for example in FIG. 22, for a capacitive power supply and the snubbers 97 shown for example in FIG. 22, when required.

Figure 18:
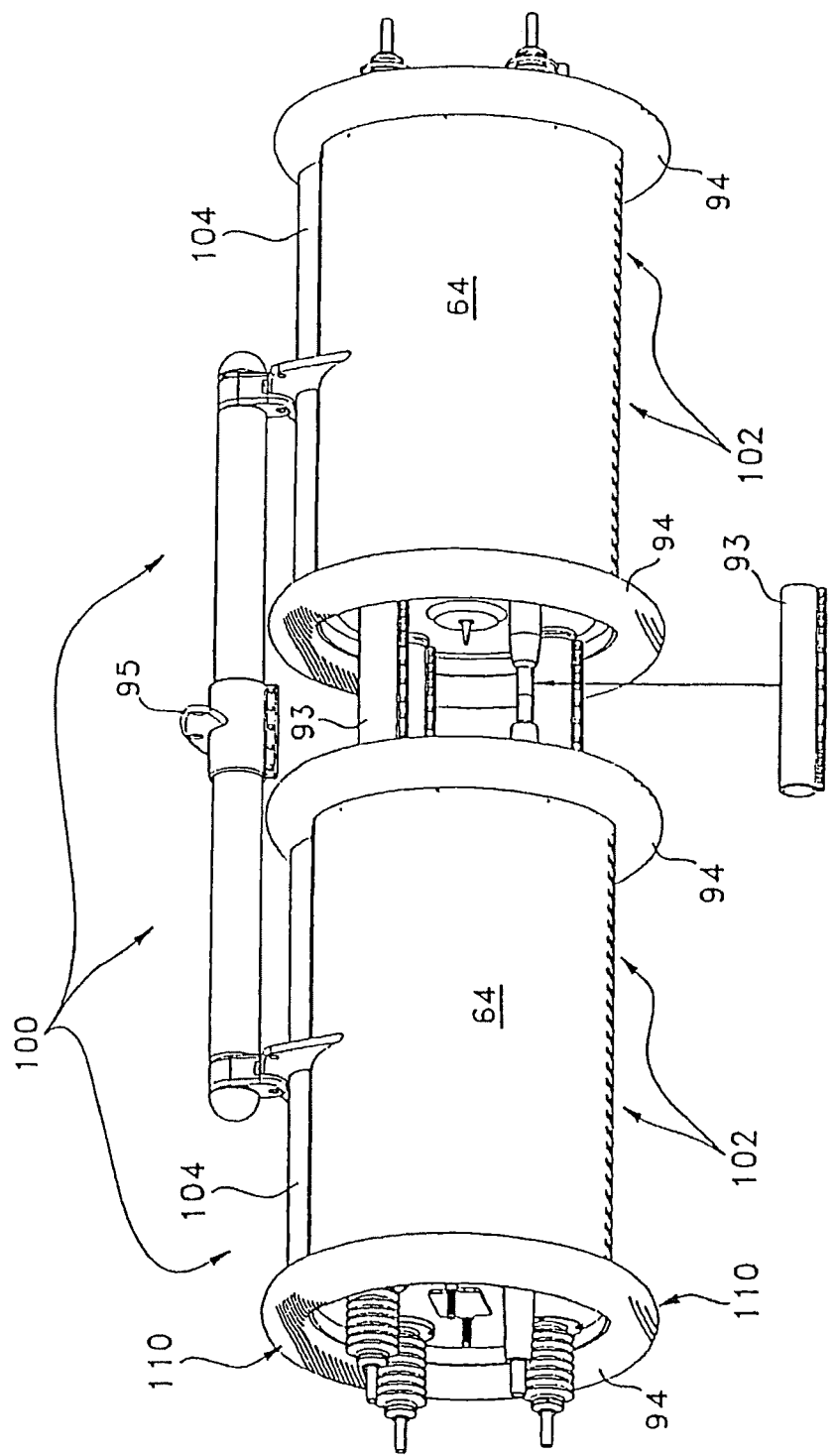
FIG. 18 is a side perspective view of an apparatus according to another preferred embodiment of the present invention.
Figure 19:
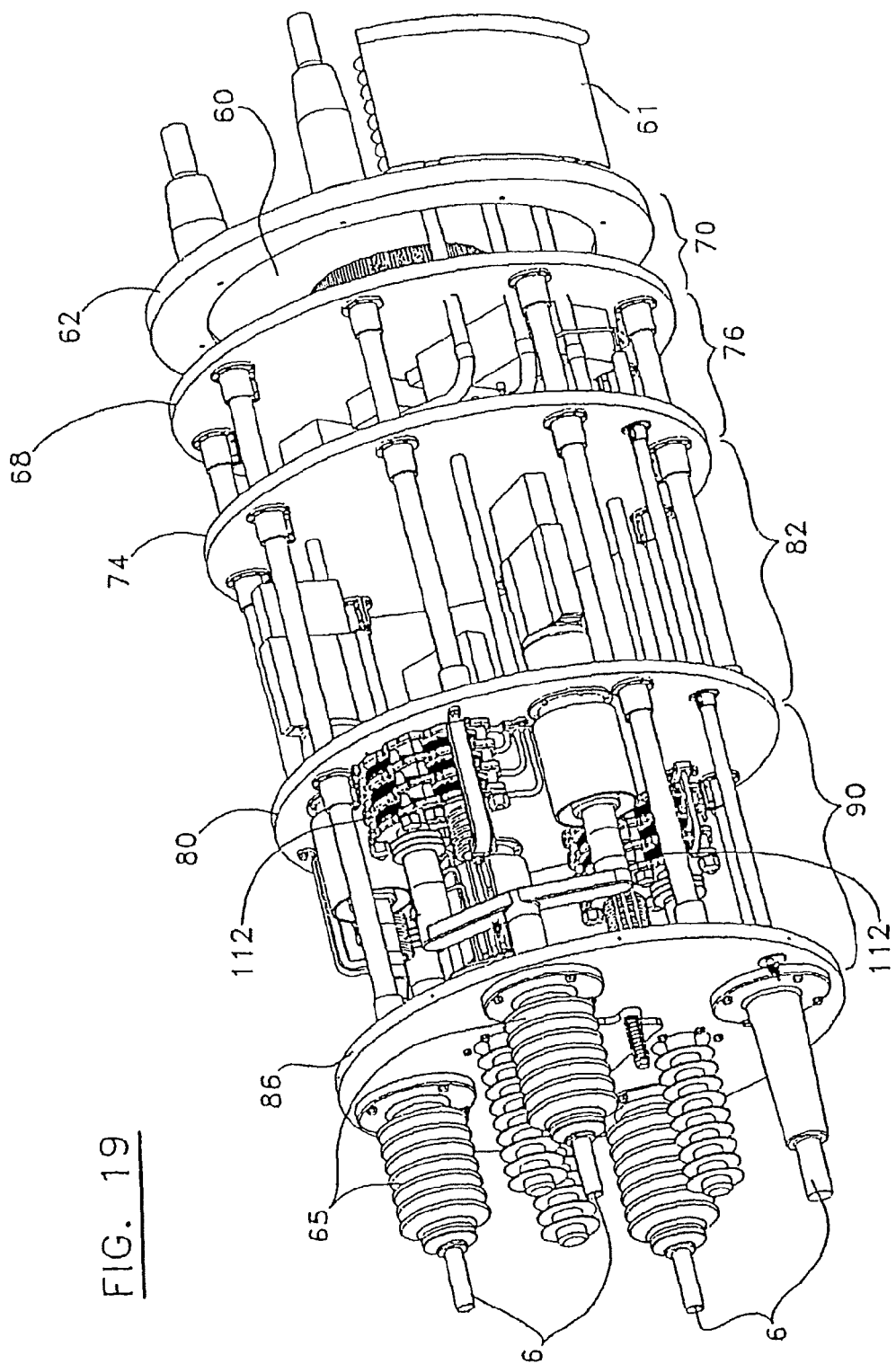
FIG. 19 is a side perspective view of an apparatus according to another preferred embodiment of the present invention.
Figure 20:
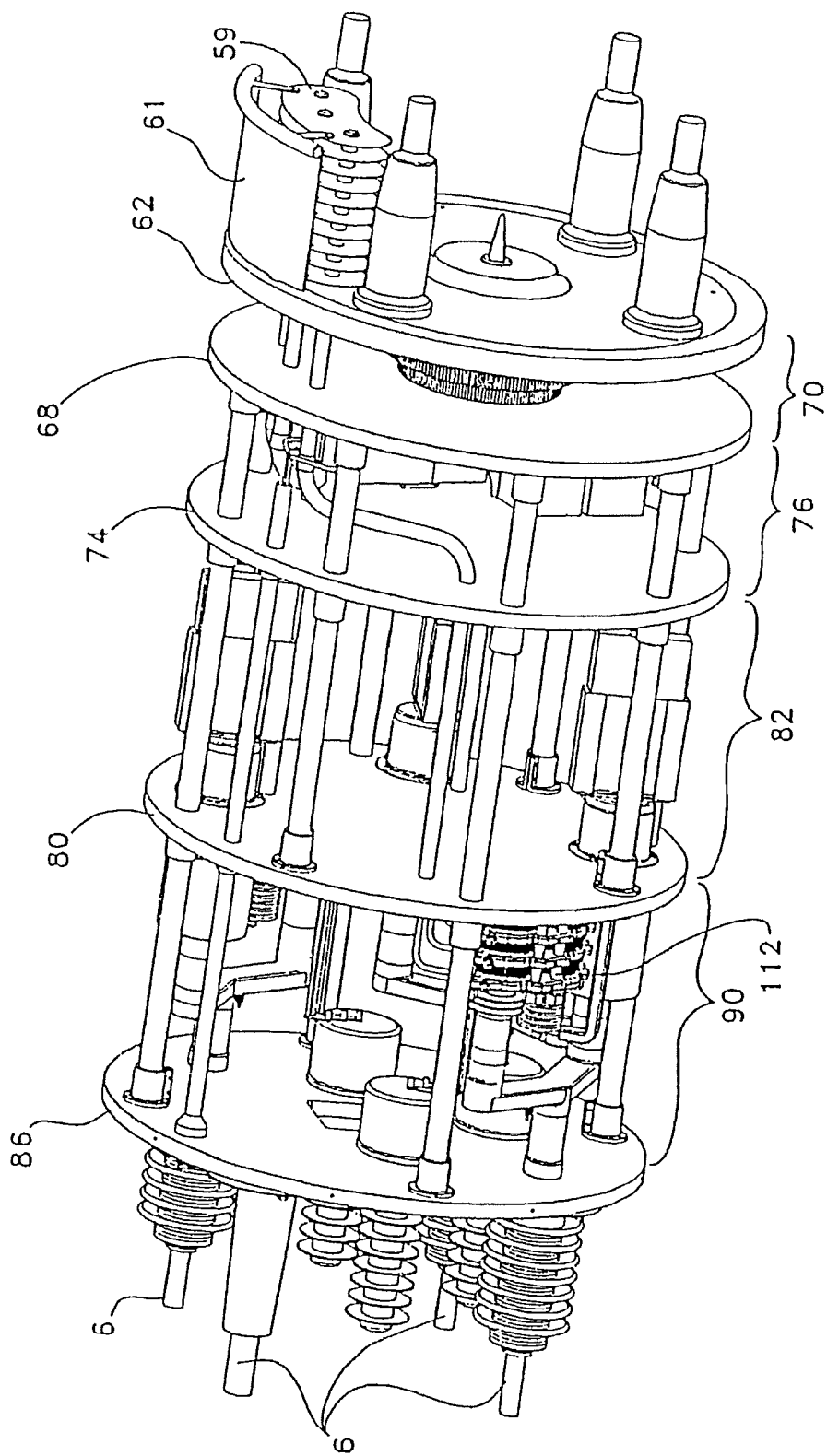
FIG. 20 is another side perspective view of a part of an apparatus shown in FIG. 19.
Figure 21:
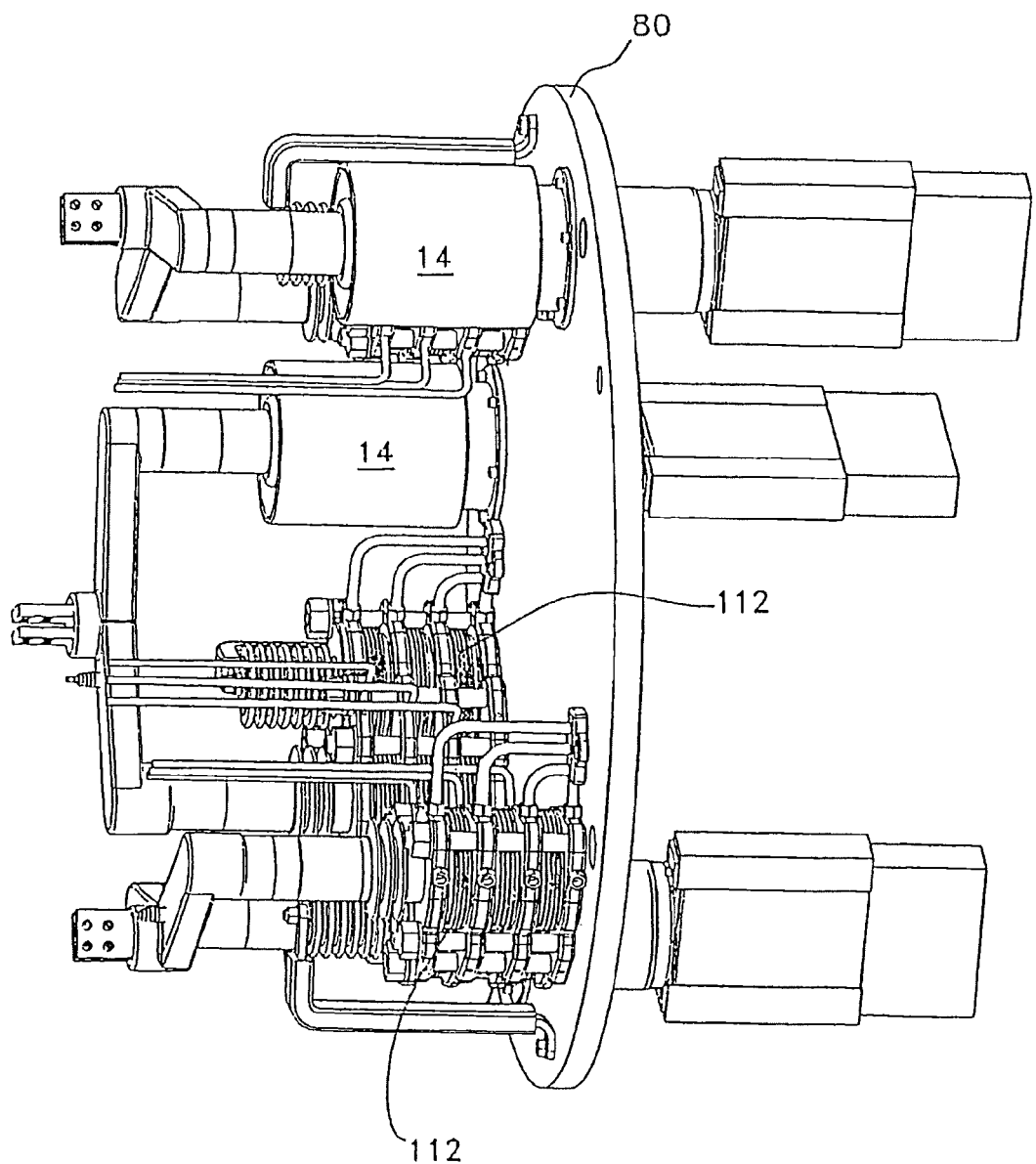
FIG. 21 is a side perspective view of elements shown in FIGS. 19 and 20.

So the switching apparatus comprises a housing having a lateral conducting wall 64 shown in FIG. 18, and first, second, third, fourth and fifth conducting plates 60, 68, 74, 80 and 86 transversal to the lateral wall and which separate the housing into first, second, third and fourth compartments 70, 76, 82 and 90. The first conducting plate 60 is provided with an insulating element 62 for electrical insulation from the lateral wall. The second, third, fourth and fifth conducting plates 68, 74, 80 and 86 are electrically connected to the lateral wall. The first, second, third and fourth conducting plates 60, 68, 74 and 80 are electrically connected to the conductors 6 and the fifth conducting plate 86 being insulated from some of the conductors 6 by means of insulator feedthroughs 65. The first and second conducting plates dethreshold the first compartment 70 which comprises at least one central conductor connecting the first and second plates, and transformers 66 located around the central conductor for informing the controller of the current flowing through the central conductor. The second and third plates dethreshold the second compartment 76 which includes the controller and the dedicated and main contactless power supplies. The third and fourth plates dethreshold the third compartment 82 which includes the controllable motors 12. The fourth and fifth plates dethreshold the fourth compartment 90 which includes the vacuum interrupters 10 and 14. According to a preferred embodiment, a mechanical shield 13 protects the vacuum interrupters from each other.

One of the conductors 6 is directly connected to the output plate 86 of the apparatus by a galvanic link. The other conductors are connected through insulator feedthroughs 65 to enter into the fourth compartment 90 that contains the vacuum interrupters. In this embodiment, the vacuum interrupters are provided in pairs and are connected in parallel as shown more specifically in FIG. 9. The vacuum interrupters are connected to the voltage reference plate or to the housing of the apparatus. For each pair of vacuum interrupters, the second vacuum interrupter 14 is used as a bypass jumper and is connected to a "sidekick trigger" device. In FIG. 9, the shield 13 of interrupter 10 has been removed to provide a view of the elements appearing behind the shield 13. Current transformers 9 connected to the controller are also provided for measuring currents. Capacitive voltage sensors 63 are also provided for measuring voltages.

Referring now more specifically to FIGS. 11 to 14, each of the second controllable motors 12 comprises a stabilizing device 94 for stabilizing the position of the second controllable motor 12 in open or closed position. A spring 96 is provided for urging the second interrupter into a closed position. A lock is provided for holding the spring in a compressed position to keep the interrupter in open position. Either the activation of the converter 38 or the closing of the controllable switch 50 shown in FIG. 6 is sufficient to activate the motor 12 to overcome the stabilizing device 94 and open the lock 95. The spring, once the lock 95 is opened, moves the second interrupter 14 in closed position. When the linear actuator is activated for opening the second vacuum interrupter 14, the lock 95 maintains the vacuum interrupter 14 into the open position. If the converter 38 or the power supply that supplies the converter 38 is not functioning, and the controller requests the closing of interrupter 14, then the "sidekick trigger" 42 will inject current in the motor coil to overcome the stabilizing device 94 to open the lock 95 and consequently the spring 96 will close the vacuum interrupter 94.

Referring now to FIGS. 15 and 16, the first vacuum interrupter 10 connected in parallel with the second vacuum interrupter 14 is activated by a motor 12 having a bi-stable device 11 having two stable positions, open or closed, and a linear motor 12 as shown more specifically in FIG. 16. This first vacuum interrupter 10 is used for short-circuiting or opening the corresponding conductor.

The linear motors 12 that open and close the second vacuum interrupters 14 are made of single phase winding coil free to move within a magnetic field orthogonal to a magnetic field. A voltage source supplies the winding of the motor through a converter 38. As shown in FIG. 6, each "sidekick trigger" 42 device comprises an independent power supply for each of the linear motors 12 and its associated vacuum interrupter. These independent power supplies charge capacitors 48 which are connected to the windings of the motors through electromagnetic or electronic switches 50. When there is a malfunction of the controller, the power supply or the motor converter, then the switches 50 of the "sidekick trigger" device are forced to close. The energy accumulated by a capacitor 48 induces an electrical current through the winding of the corresponding motor 12 along a given direction to produce a movement of the corresponding linear motor. This movement overcomes the stabilizing device 94, opens the lock 95 and consequently the spring 96 closes the corresponding second vacuum interrupter 14. When all of the second vacuum interrupters 14 are closed then the phase line recovers its original capacity for flowing current. Converters 38 supply the motors 12 with the necessary energy for opening and closing the second vacuum interrupters. Also, the converters 38 and the motors 12 are used for breaking in regenerative mode or for dampening movement of any of the vacuum interrupters.

Referring now more specifically to FIG. 17, there is shown where most of the elements shown in FIG. 5 are located within the context of the embodiments shown in FIGS. 2, and 7 to 17. The contactless capacitive power supplies comprise voltage transformers 15. Capacitive supplies 17 are provided. The controller 20 is embodied by a control card.

Referring now to FIG. 18, there is shown a switching module 100 for varying impedances of two phase lines of two adjacent segments of an electrical power line. Each phase line includes four conductors electrically insulated from each other and short-circuited at two ends of its segment. The switching module comprises two switching apparatus each being for example as shown in FIGS. 1 to 4. The two switching apparatus are mounted back to back. The housing is provided with openings 102 at lower and upper portions thereof for ventilation. The openings of the upper portion are not shown because they are underneath a half cylinder 104. The housing is provided with thermal insulating material to prevent overheating inside the housing from solar radiation.

The housing comprises a cylindrical wall 64 provided at its two extremities with guard rings 94. A lifting hook 95 is provided. The openings located on top are covered by the half-cylinder 104 which directs the ventilating air into the guard rings 94 which are also provided with openings 110 located underneath and on top. A thermal insulator is located underneath the cylinder to prevent overheating inside the housing from solar radiation. Mechanical couplings 93 are provided between the apparatus of the module 100.

By embodying two switching apparatus in a back-to-back switching module 100, the number of pylons that would be involved with a switching apparatus is reduced by a factor of two. For a nominal 30 km LIM or deicer segment, only one pylon per 60 km has a LIM or deicer switching module 100.

Referring now to FIGS. 2, and 19 to 21, there is shown a switching apparatus provided with electronic switches 112. When one wants to increase the opening and closing frequency, then the first vacuum interrupters shown in FIG. 1 are replaced by electronic switches 26 connected in parallel with the second vacuum interrupters 14. In this case, additional elements should be added such as a cooling system with heat pipe 59, a snubber, a circuit for protection against overvoltages, a voltage distributing circuit (not shown) for distributing the voltage among the different stages of the electronic switches, and control cards 40 shown in FIG. 5. Sun shield 61 is provided for protection against sun rays.

Figure 22:
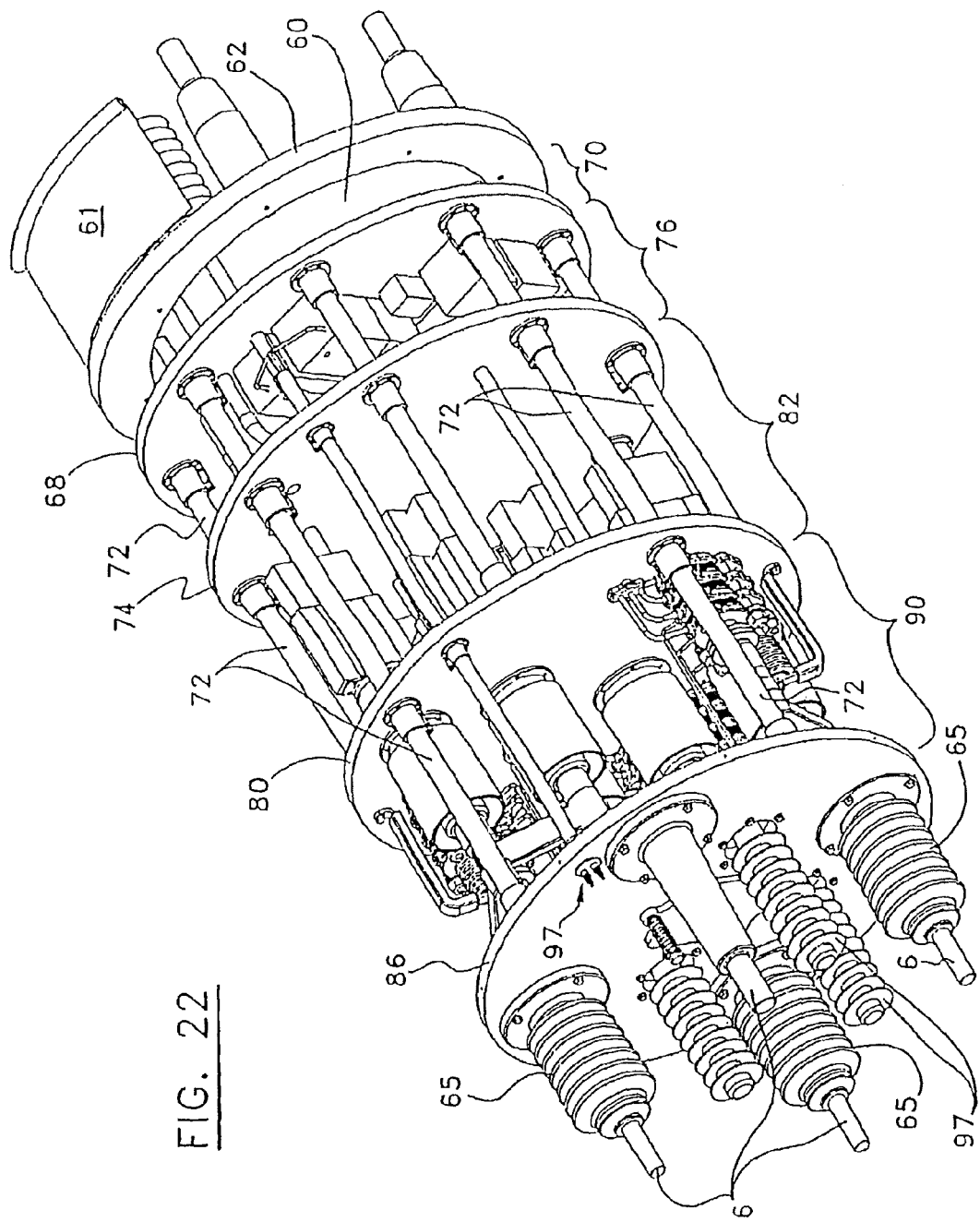
FIG. 22 is a side perspective view of an apparatus according to another preferred embodiment of the invention.
Figure 23:
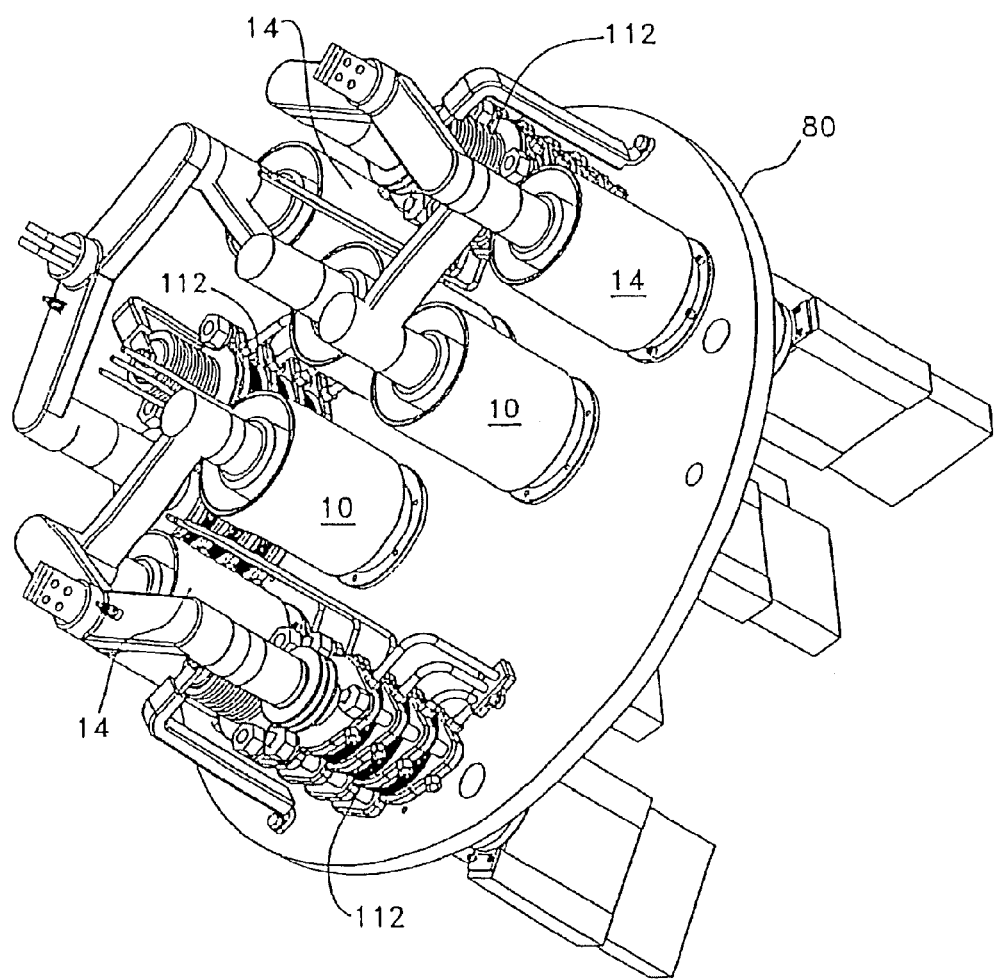
FIG. 23 is a side perspective view of elements shown in FIG. 22.

Referring now to FIGS. 3, 22 and 23, there is shown a switching apparatus with two vacuum interrupters 10 and 14 and an electronic switch 26 connected in parallel. By having the first and second vacuum interrupters 10 and 14 connected in parallel with an electronic switch 26, the operator has the choice of using either the first vacuum interrupter 10 or the electronic switch 112 for switching the corresponding conductor.

We will now describe a dejam mode which is a mode for forcing a vacuum interrupter to open. When a linear actuator is activated for opening a vacuum interrupter and this vacuum interrupter does not open because, for example, its contacts are stuck together, then an oscillating signal is superimposed to the command signal of the motor in order to superimpose a percussion force over the opening force to dejam the corresponding vacuum interrupter.

We will now describe an operating mode where additional pressure can be applied onto the contacts of the vacuum interrupters. When there is a ground malfunction, the line current can increase by several tens of kilo amperes before the time when the line circuit-breaker removes the fault, several tens of milliseconds later. During this critical period of time, it is possible to further reduce the resistance of the interrupter contacts by adding to the closing force of the springs, the force produced by the linear motors during several tens of milliseconds. According to this operating mode, the short-circuit current is detected and a strong current is applied to the windings of the linear motors by means of the converters of the motors to keep the contacts of the second vacuum interrupters closed as long as the malfunction is detected.

Referring now to FIGS. 4 and 24 to 31, there is shown an embodiment of the present invention for deicing. We will describe an operating mode that is called "make before break". In this mode, the four connectors of the phase line cannot be opened simultaneously so that the phase line is never completely opened. According to this embodiment, the apparatus comprises four vacuum interrupters 28 which are connected to a "make before break" mechanism, and four second vacuum interrupters 14 which are connected in parallel to the four first vacuum interrupters 10. The second vacuum interrupters 14 are used as bypass jumpers. By varying the operating position of the "make before break" mechanism, the vacuum interrupter 28 that is closed is switched round.

The "make before break" mechanism comprises a plate which is a lifting disc 120 activated by one or several lifting motors 122. This disc 120 is programmed and provided with openings 124 through which rods 126 pass. The rods 126 have predetermined geometries for cooperating with the shapes of the openings 124 depending on the angular position of the disc. The angular position of the disc allows to keep at any time one of the four vacuum interrupters 28 in closed position. Motors 130 rotate the disc into one of the four pre-established positions.

In short, each of the controllable motors have a rod connected to the corresponding third vacuum interrupter 28, which is movable along a course between open and close positions. A movable plate 120 is provided with four openings allowing the four rods to pass through the plate, the openings of the plate and cross sections of the rods having cooperating shapes allowing the course of a maximum of three vacuum interrupters 28 into the open position. Controllable plate motors 130 are provided for rotating the plate in different operating positions perpendicularly to the rods to determine which three interrupters 28 are allowed to move in the open position. Motors 122 are also provided for moving the plate in parallel to the rods consequently moving three of the four vacuum interrupters 28 between open and close positions thereby preventing at any time a complete opening of the phase line.

Figure 36:
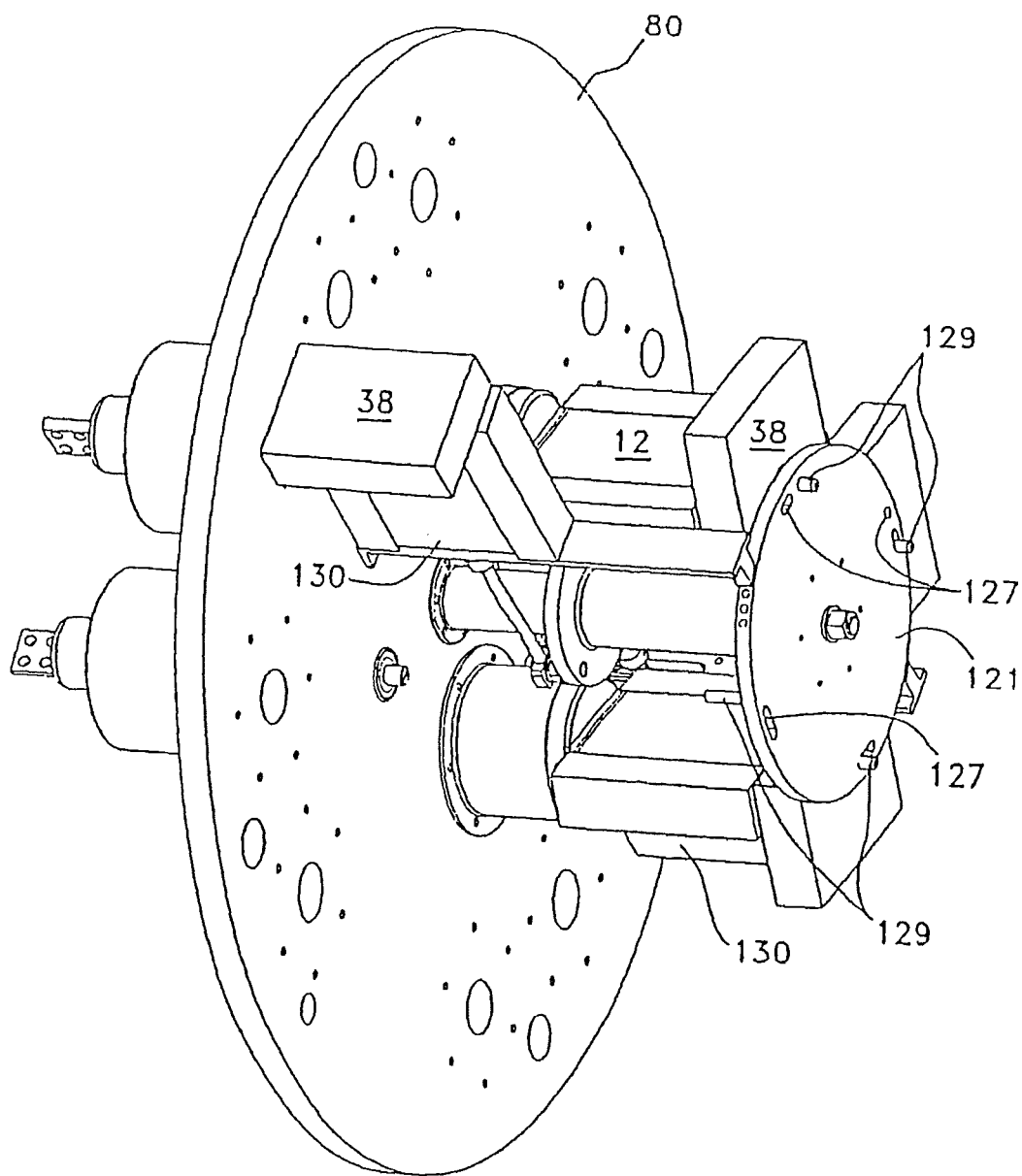
FIG. 36 is a side perspective view of elements shown in FIG. 32.
Figure 37:
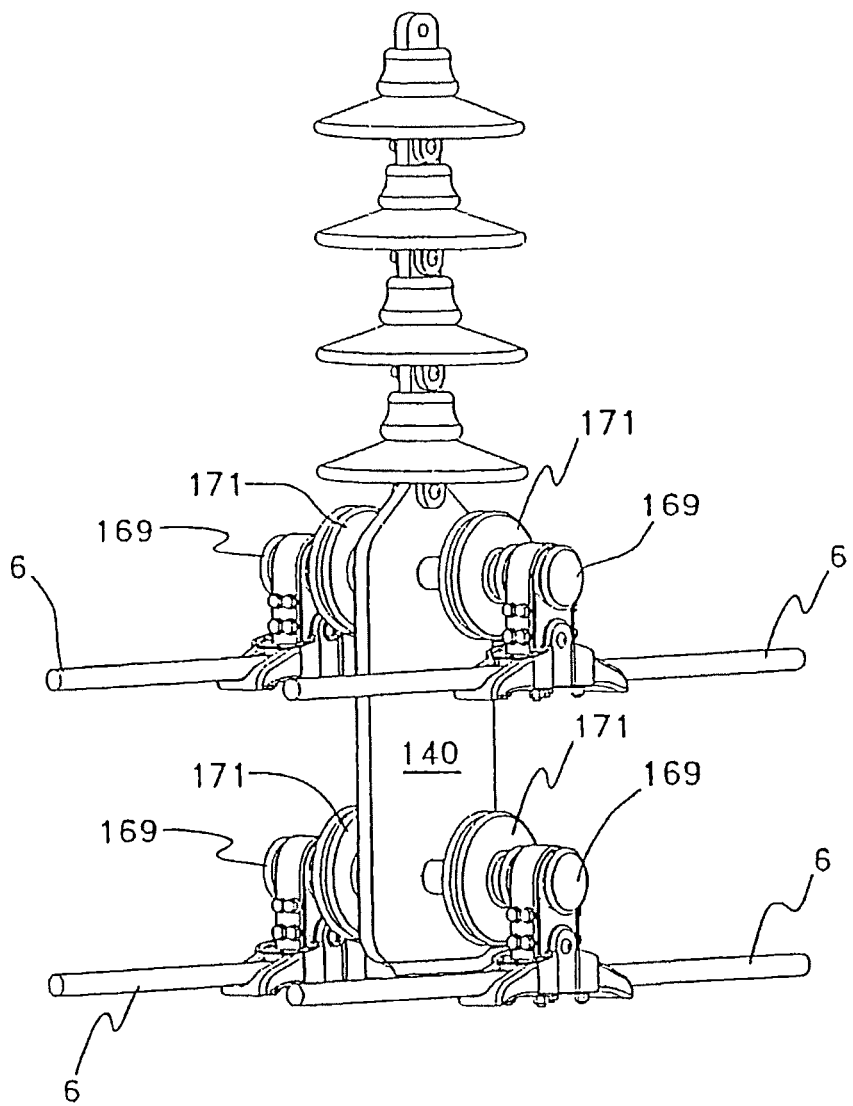
FIG. 37 is a side perspective view of a yoke plate for conductors.
Figure 38:
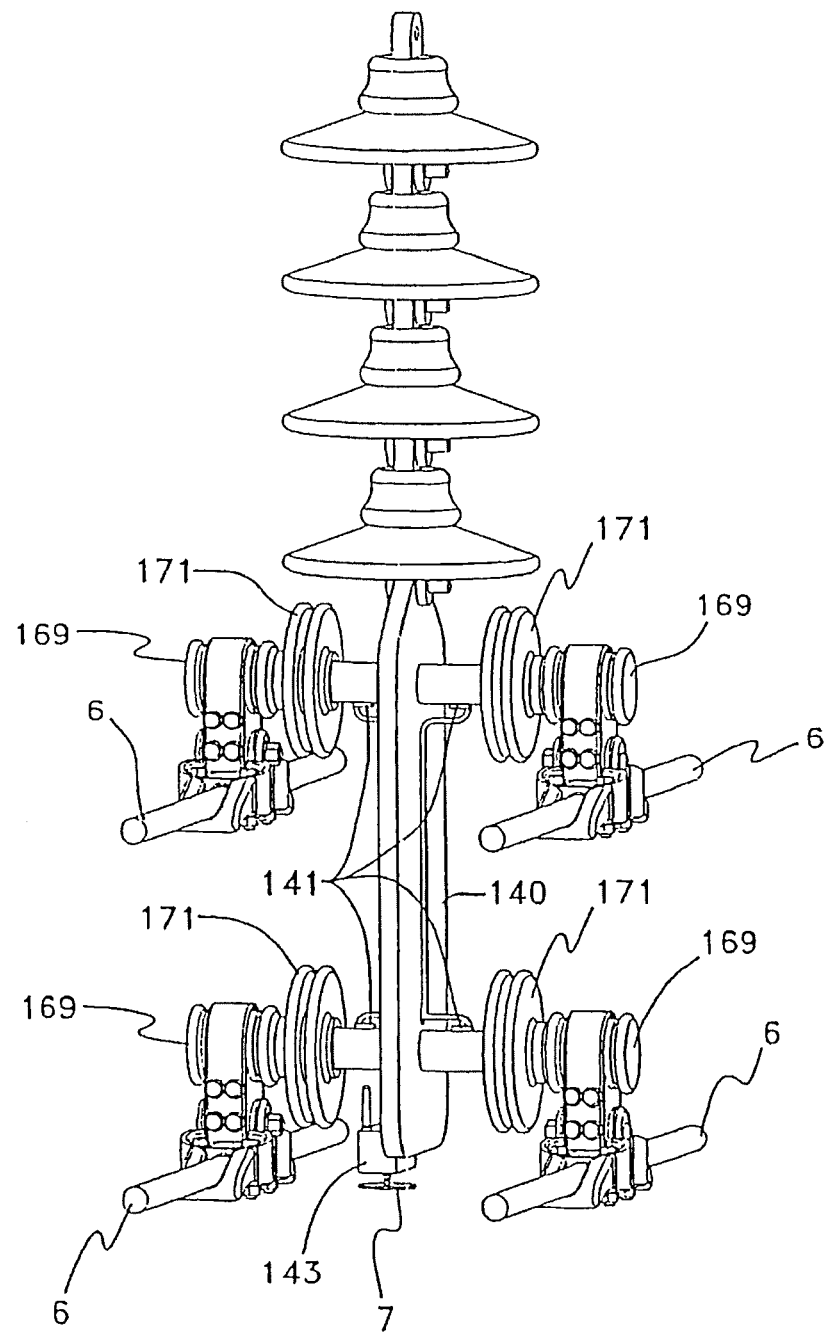
FIG. 38 is a side perspective view of another yoke plate for conductors.
Figure 39:
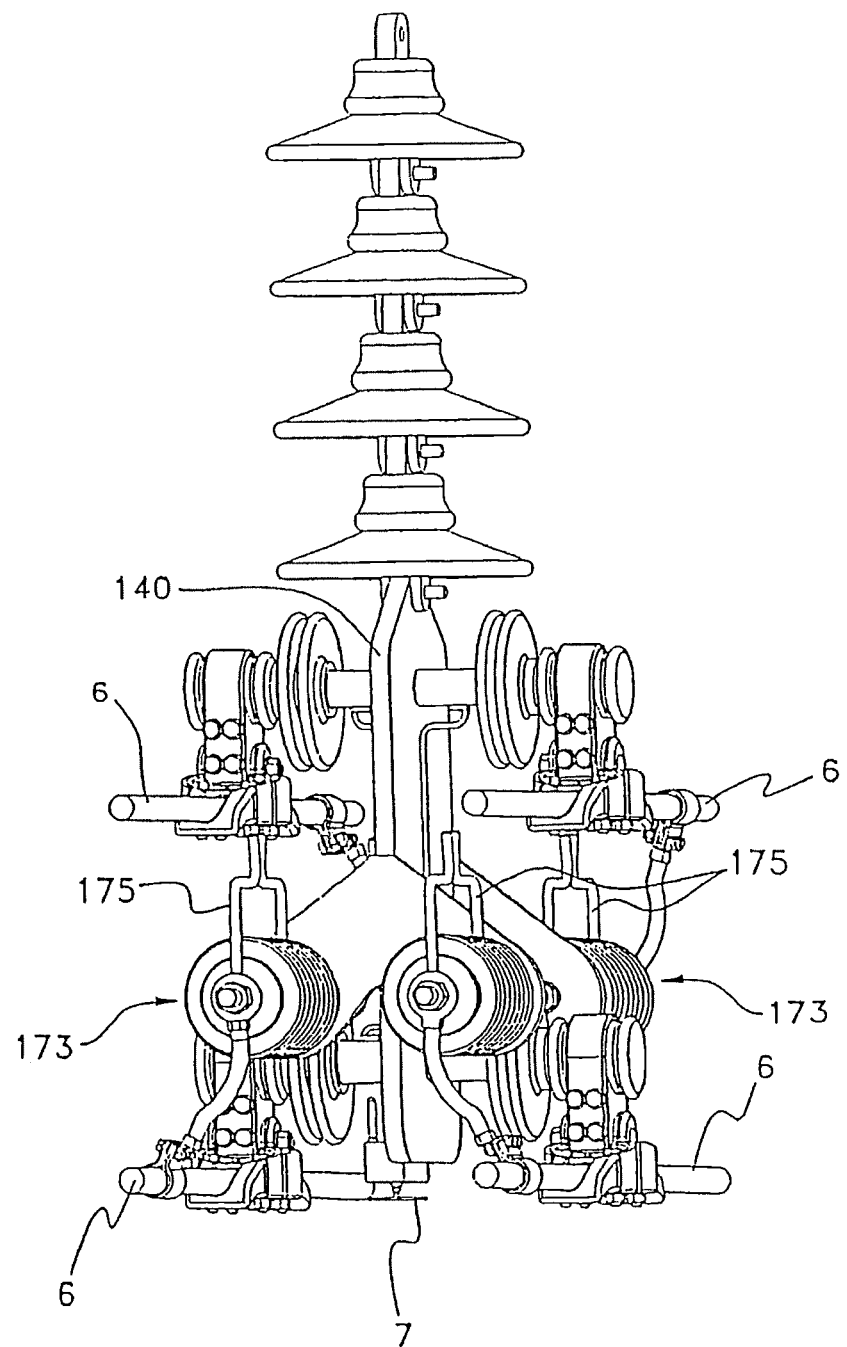
FIG. 39 is a side perspective view of another yoke plate for conductors.
Figure 40:
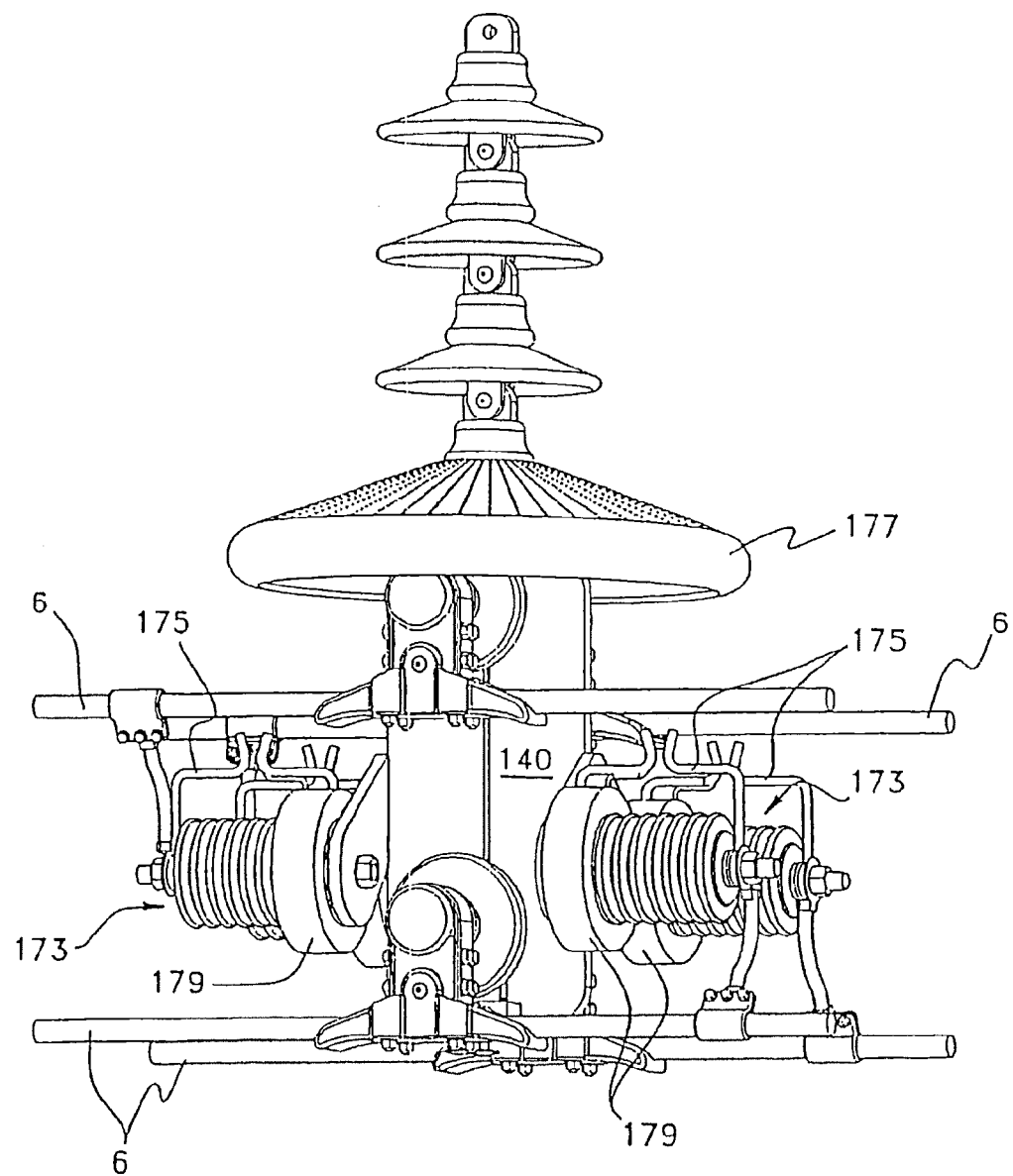
FIG. 40 is a side perspective view of another yoke plate for conductors.

Referring now to FIGS. 32 to 36, there is shown another embodiment of the "make before break" mechanism, which is called "blocking mechanism". In FIG. 36, one of the motors 12 with its converter 38, spring 96 and associated elements have been removed, when compared with FIG. 33, to provide a better view of some elements such as the pin 129. In this embodiment, four linear motors are provided and are associated respectively to the four third vacuum interrupters 28 and to a blocking disc 121.

This blocking disc 121 is provided with openings 127 with different geometries, through which the pins 129 pass. The cooperation between the geometries of the openings 127 and of the pins 129 depends on the angular position of the disc 121 which prevents, at any time, a simultaneous opening of the four third vacuum interrupters 28. Motors 130 rotate the disc 121 into one of four pre-established possible positions in order to direct the current into one of the conductors of the phase line. In this embodiment, for each conductor, three vacuum interrupters are connected in parallel. The vacuum interrupters 28 are the vacuum interrupters of the "make before break" mechanism. The second vacuum interrupters 14 are used as bypass jumpers and the first vacuum interrupters 10 are used for opening and closing the conductors. The second and third vacuum interrupters are for safety purposes. For deicing a conductor, its three corresponding vacuum interrupters are closed.

In short, each of the four controllable motors has a pin connected to the corresponding third vacuum interrupter 28 which is movable along a course between open and close positions. A movable disc 121 is provided with openings 127 allowing the pins 129 to pass through the disc, the openings of the disc and the pins cooperating to allow the course of a maximum of three of the four vacuum interrupters 28 into the open position. Controllable plate motors 130 are provided for moving the disc 121 in different operating positions with respect to the pins to determine which three interrupters 28 are allowed to move in the open position consequently preventing at any time a complete opening of the phase line, the controllable plate motors 130 being controlled by the controller.

We will now describe a possible deicing procedure for the four conductors of a phase line. At the beginning, the twelve vacuum interrupters of the switching apparatus are closed. At any time, the voltage and the currents of the conductors of the phase line are measured. First, the conductor that has to be deiced is selected. Second, the disc is rotated so that the vacuum interrupter associated with the conductor that has to be deiced cannot be opened. Third, the three remaining vacuum interrupters of the "make before break" mechanism are opened. Fourth, the controller verifies that the precedent steps have been correctly performed by detecting interlocks and by measuring electrical current through the conductors. Fifth, the three vacuum interrupters used as bypass jumpers and corresponding to the three vacuum interrupters of the "make before break" mechanism that are opened are also opened according to a pre-determined sequence. Sixth, the controller verifies that the precedent steps have been performed correctly by detecting interlocks and by measuring electrical current through the conductors of the phase line. Seventh, the remaining three vacuum interrupters corresponding to those of the "make before break" mechanism that are opened are also opened according to a pre-established sequence. Eighth, the controller verifies that the precedent steps have been performed correctly by detecting interlocks and by measuring voltages and currents of the conductors of the phase line. At this point, we can consider that the deicing of one of the conductors has begun.

If a problem is detected by the controller, a report is emitted and the deicing operation is interrupted. Once the load sensors mounted on the yoke plates confirm that the deicing of the selected conductor is completed, then the steps mentioned above are performed in a reverse manner in order to close all of the vacuum interrupters. Then the steps can be performed again by selecting another of the conductors to be deiced.

In order to prevent a rotation of the conductors bundle when a deicing is performed, a deicing sequence is chosen in order to keep the center of mass of the bundle underneath the geometric center of the bundle. For example, two upper conductors and one lower conductor are deiced according to a sequence, then the two upper conductors and the other lower conductor are deiced according to a sequence. This routine is performed until all of the conductors are deiced.

Referring now to FIGS. 37 to 40, there are different yoke plates that are used to insulate the conductors of the bundle. The yoke plates 140 can be used for mounting thereon safety devices for preventing handling overvoltage from a ground or between phase fault, or problems resulting from a flash of lightning. For protecting the spacers, the yoke plates and the interrupters against overvoltage, voltage clamps such as a solid state protection 173 or spark-gaps 175 alone or in combination can be mounted. Spark-gaps activated by means of a current transformer 179 shown in FIG. 40, supplied by the current flowing through a solid state protection 173 can be used. The spark-gaps can be air spark-gaps or vacuum spark-gaps, and can be triggered, or not, by means of the current transformer. The yoke plate can also be used for measuring the ice load on each of the conductors of the phase line for the deicing purposes. The ice load information detected by load cell 141 is transmitted by means of an emitter 143 supplied in a discontinuous manner by means of a contactless capacitive power supply which is provided with a capacitive antenna 7. Insulators 171 are provided. Metallic caps 169 are mounted on the insulators 171. A booster shell guard ring 177 shown in FIG. 40 can be also provided.

When an overvoltage between the conductors of a phase line occurs because of a ground malfunction, lightning or other reasons, the protection mechanisms are self-activated. These solid state voltage thresholders mounted on the yoke plates are the first to be self-activated then the spark-gaps are self-activated and finally, several milliseconds later the vacuum interrupters of the conductors are closed. When electronic switches are used, an additional voltage thresholder is added near each of the electronic switches and this voltage electronic switch can be closed by means of an automatic closing system when a malfunction occurs. Finally, the vacuum interrupters used as bypass jumpers are closed several tens of milliseconds later.

Figure 41:
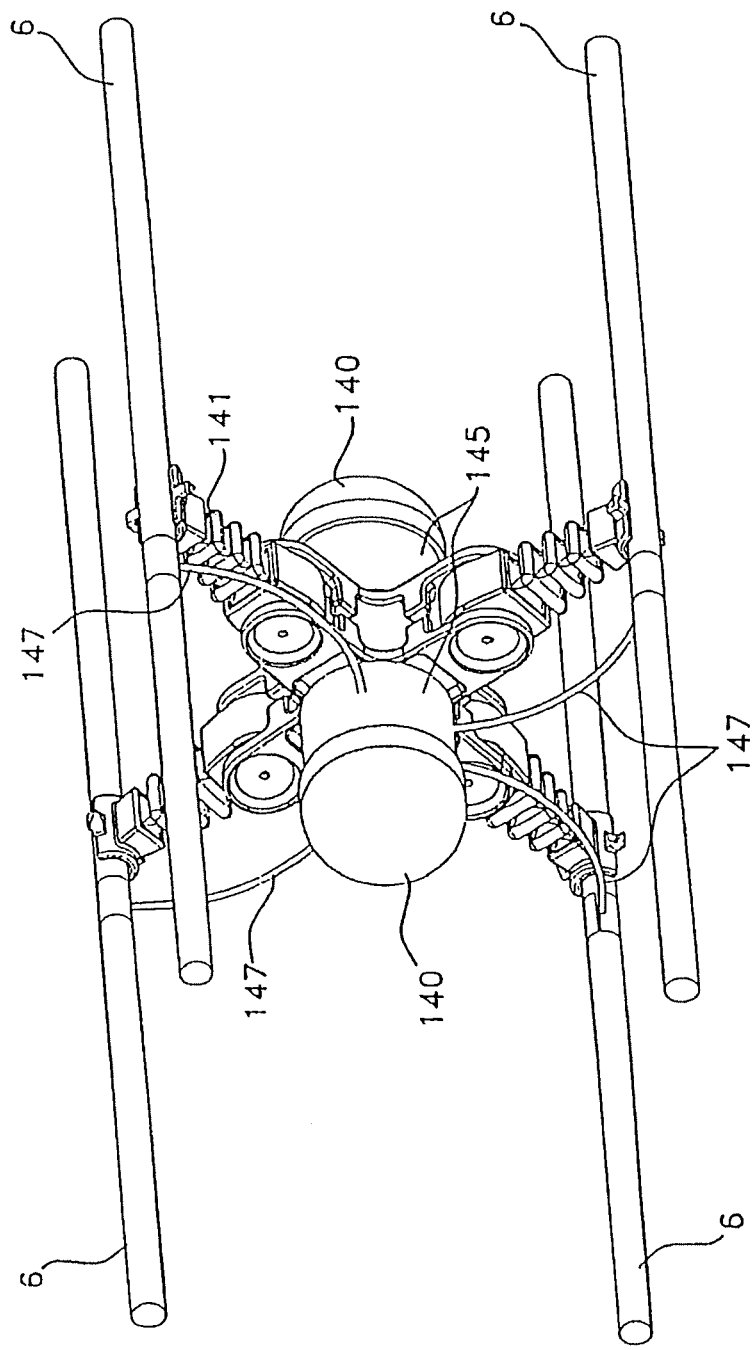
FIG. 41 is a front perspective view of emergency lighting mounted on a crossarm between four conductors on a phase line.

Referring now to FIG. 41, when a segment of the electrical power line is located over a road, a speedway or a river, this segment can be provided with an emergency light 140 that is activated when the segment in question is under a deicing operation. This emergency light is mounted between the four conductors of the phase line on an insulated spacer 141. The emergency light is supplied by means of a power supply which is fed by the voltage difference that is present between the conductors by means of wires 147 when the segment of the electrical power line is under a deicing procedure. The emergency light could use solid state light emitter.

Referring now to FIG. 42, there is shown the antennae 142 of contactless capacitive power supplies of the switching apparatus. The antennae 142 are mounted on the spacer 141 by means of electric insulators 151.

Figure 43:
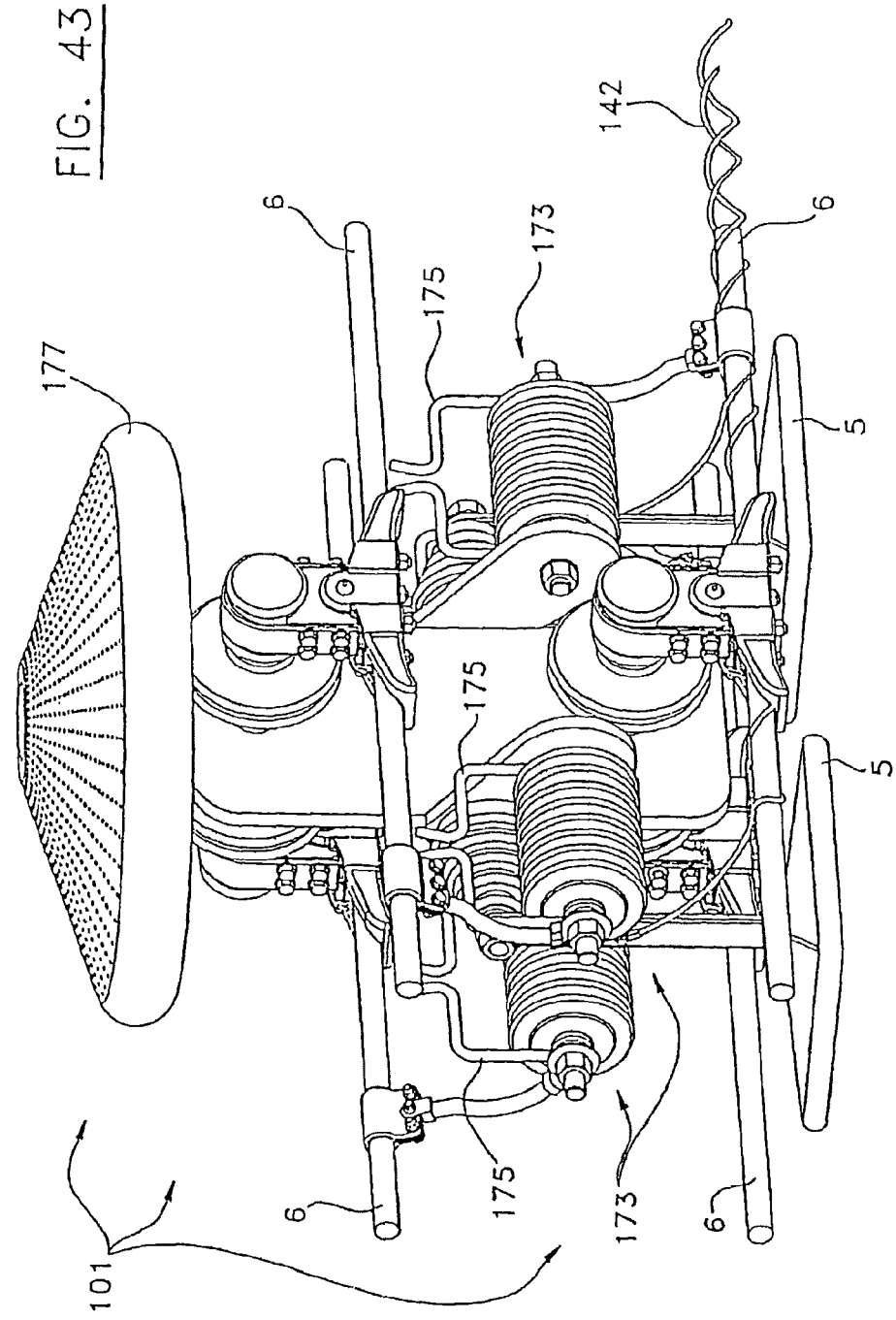
FIG. 43 is a side perspective view of a circuit for protection against surges in combination with a contactless power supply.

Referring now to FIG. 43, there is shown an overvoltage protection circuit with a contactless power supply. The protection circuit comprises voltage clamps 173, spark-gaps 175 and a booster shell guard ring 177. The contactless power supply comprises a plate which is the capacitive antenna 5. This antenna 5 is connected to the switching apparatus via wires 142 and feedthrough 97 shown for example in FIG. 22.

Figure 44:
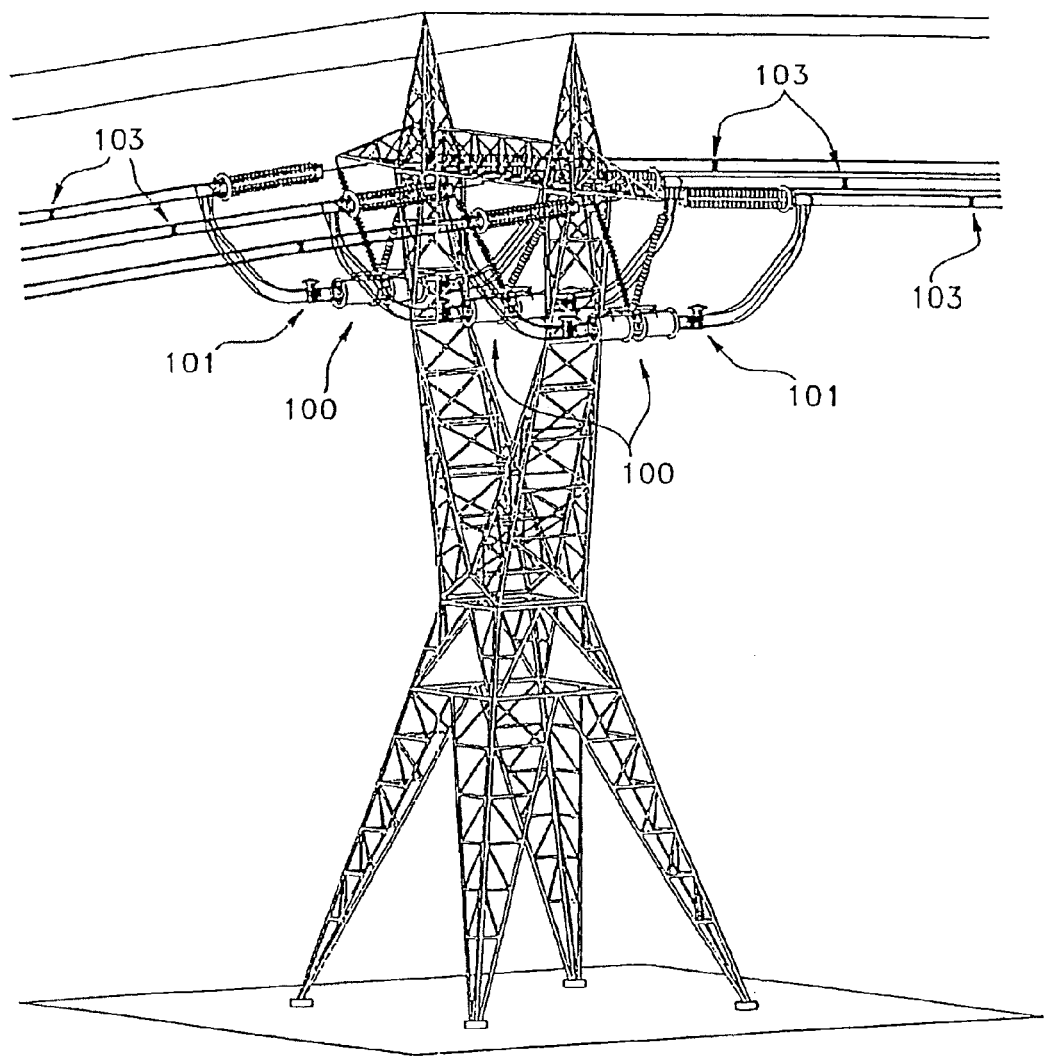
FIG. 44 is a side perspective view of a tower on which is mounted an apparatus according to a preferred embodiment of the present invention.
Figure 45:
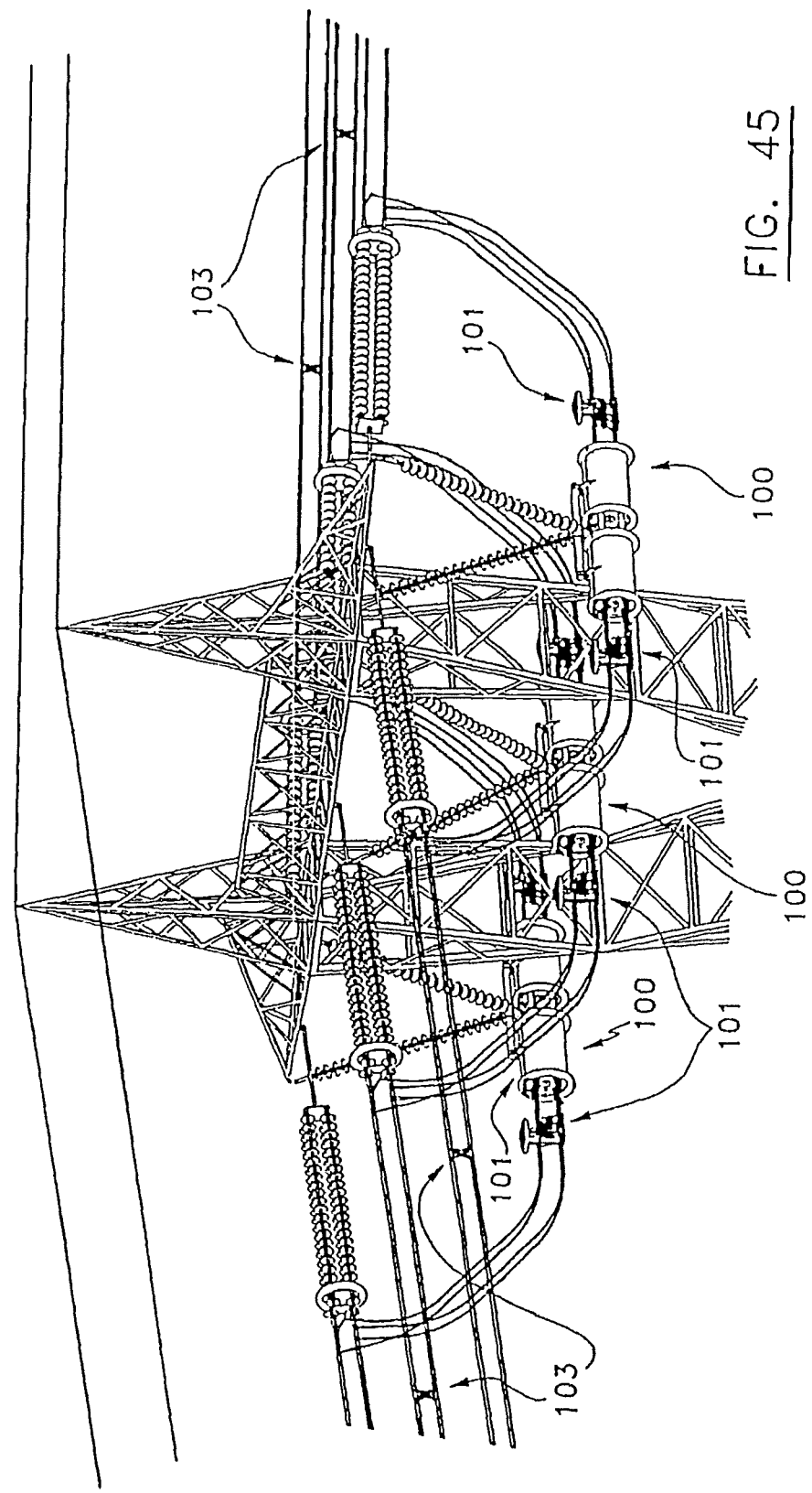
FIG. 45 is an enlarged view of an upper portion of FIG. 44.

Referring now to FIGS. 44 and 45, there is shown the switching module 100 which comprises two switching apparatus mounted back to back. These FIGS. 44 and 45 also show where the overvoltage protection circuit with contactless power supply apparatus 101 shown in FIG. 43 is mounted with respect to the module 100 and spacers 103.

Referring now to FIGS. 4, 5 and 6, we will now describe, according to a preferred embodiment, a method for varying the impedance of a phase line of a segment 2 of an electrical power line 4. The phase line includes four conductors 6 electrically insulated from each other and short-circuited together at two ends of the segment. The method comprises steps of a) providing four first vacuum interrupters 10 connected in series with the four conductors 6; b) providing four first controllable motors 12 for selectively opening and closing the first vacuum interrupters; c) detecting a parameter representative of current operating conditions of the phase line; d) controlling the first controllable motors according to the parameter detected in step c); e) providing four second vacuum interrupters 14 connected in parallel respectively with the first vacuum interrupters; and f) selectively opening and closing the second vacuum interrupters by means of second controllable motors 12, the second controllable motors 12 being controlled by the controlling of step d).

The method further comprises, for each of the second controllable motors, steps of g) providing a dedicated contactless power supply 44 for supplying an electricity supply from the phase line; h) rectifying the electricity supply by means of a rectifier 46; i) storing electrical energy from an output of the rectifier by means of a capacitor 48; and j) discharging the capacitor 148 into the corresponding second controllable motor to close said second controllable motor, upon reception of a control signal generated from the controlling of step d).

Still according to a preferred embodiment, there is provided a method wherein step c) further comprises a step of detecting whether the vacuum interrupters that should be opened in response to the controlling of step d) are opened, and emitting a warning signal when it is not the case; and the step d) of controlling further comprises a step of sending an oscillating command signal for the interrupters that are subject to a warning signal to force open the interrupters in question.

The apparatus also comprises a detection device for detecting current operational conditions of the section of the electrical energy transmission line. The apparatus also comprises a control device for controlling the pairs of electromechanical and electronic interrupters as a function of operational conditions. The interrupters of each pair are controlled independently through control signals. A preferred embodiment of the control device will be described and shown in relation with FIG. 46.

Referring now to FIG. 46, one can see a preferred embodiment of a unit comprising a control device and a part of the detection device. The unit comprises a processor 570 having a first input 574 for receiving signals indicative of operational positions of the interrupters, second input ports 576 for receiving signals indicative of voltages at the terminals of the pairs of interrupters, and outputs 577 and 579 for generating control signals. The processor 570 has calculation capacities for calculating different values related to the detected signals. The device also comprises a radiofrequency transmitter 566 connected to the processor 570 for transmitting signals indicative of the operational positions of the interrupters, and of the voltages at the terminals of the pairs of interrupters. A radiofrequency receiver 564 is also provided. The receiver 564 and the transmitter 566 are respectively provided with antennae 568. The receiver 564 is connected to the processor 570 for receiving radiofrequency control signals from which the control signals are produced. The unit also comprises an amplifier 572 connected to the processor 570 for controlling the motor 540 based on the control signals.

A power supply device is provided to provide power to the processor 570, the receiver 564, the transmitter 566 and the amplifier 572. This power supply device comprises a first electrical power supply 578 comprising a battery 582 and a solar cell 580 connected to the battery 582. This electrical power supply device also comprises a second electrical power supply 581 connected in parallel to the first electrical power supply 578, and having inputs 583 connected to the conductors of a phase line. Therefore, when one of the conductors is open, power supply can be made from this conductor through supply 581 through one of the inputs 583.

The processor 570 also comprises a communication port 575 connected to a turn-count of the lead screw 552 to know its position. The port 574 of the processor 570 is used to receive a signal representative of the position of the carrier of the electromechanical switching device that groups the electromechanical interrupters for a same phase line. The position of the carrier is representative of the position of each of the electromechanical interrupters that are associated therewith.

The receiver 564 and the transmitter 566 allow respectively reception and transmission of radiofrequency signals. The pairs of interrupters are actuated based on the received radiofrequency signals. The radiofrequency signals transmitted by; the transmitter 66 allow confirmation of the reception of control radiofrequency signals and eventually execution of the controls being carried out. The receiver 564 is adapted permanently to receive remote radiofrequency signals that are coded.

In accordance with a preferential manner of operating, one transmits a first code containing an identification of a pair of interrupters, a time window and also a password. Then, one transmits a second code containing an identification of a pair of interrupters to be actuated, the command to carry out, an information related to the time at which the command must be carried out as well as the password. The command associated with the second code is carried out only if the password of the second code corresponds to that of the first code, and if the execution time of the second code is within the time window defined in the first code.

The transmitter 566 which operates intermittently or continuously confirms the received command, the execution time of the command, the state of the batteries and the voltage in the conductors. The information related to the voltage at the terminals of an open conductor allow at the same time a determination of the current passing through the other closed connectors. A zone receiver and transmitter that are not illustrated are also provided for receiving data from charge cells that are mounted on the phase lines and for retransmitting the received data of the charge cells remotely to a central control station (not shown).

According to a preferred embodiment, the charge cell transmitter can be operated intermittently to transmit different data on request or at fixed periods. For example, a 5 W transmitter can operate during a millisecond every fifteen minutes.

Of course, several modifications can be made to the above-described apparatus and method without going beyond the scope of the present invention. It is understood that the components and configurations are not all essential to the invention and must not be interpreted in a restricted sense in order to threshold the scope of the present invention. As it will be apparent to a person skilled in the art, other components, other types of interactions between the components as well as other material configurations can be used to implement the apparatus and the method of monitoring a phase line of a part of an electrical energy transmission line.

The invention claimed is:

1. A method for locating an event occurring along a phase line on a section of an electrical energy transmission line, the phase line having n conductors electrically insulated one from another and short-circuited between themselves at two extremities of the section, the method comprising the steps of:
   a) monitoring a parameter on one of the n conductors of the phase line, at one of the extremities of the section without a ground reference, said parameter being representative of current operational conditions of the phase line and having a known propagation speed in the conductor;
   b) generating an event detection signal at the extremity of the section each time the parameter has a value exceeding a threshold, and storing a reception time when the detection signal is generated;
   c) transmitting a signal representative of the geographic location of the extremity of the section; and
   d) geographically locating the event along the section once two consecutive detection signals are generated from the signal representative of the geographic location of step c), and from the reception times associated with two consecutive detection signals.

2. The method according to claim 1, wherein the step of monitoring a parameter on one of the n conductors of the phase line is carried out at a sampling frequency of at least 1 MHz.

3. The method according to claim 1, wherein in step a), data on the parameter are continuously stored during a predetermined window of time, and in step b), after the generation of the detection signal, the data produced in step a) are kept in memory only for a period of time starting 100 µs before the reception time, and ending when the value of the parameter re-passes below the threshold.

4. The method according to claim 1, wherein said phase line comprises four conductors.

5. Apparatus for locating an event having occurred along a phase line on a section of an electrical energy transmission line, the phase line comprising n conductors electrically insulated one from another and short-circuited between themselves at two extremities of the section, the apparatus being located at one of the extremities of the section and comprising:
   a monitoring device for monitoring at least one parameter on one of the n conductors of the phase line without a ground reference, said at least one parameter being representative of current operational conditions of the phase line and having a known propagation speed in the conductor;
   a device for generating a detection signal of the event at the extremity of the section each time said at least one parameter has a value exceeding a threshold, and for storing a reception time when the detection signal is generated;
   a device for transmitting a signal representative of a geographic location of said extremity of the section; and
   a device for geographically locating the event along the section once two consecutive detection signals are generated, from the signal representative of the geographic location, and from the reception times associated with two consecutive detection signals.

6. A system comprising two apparatuses, each apparatus as claimed in claim 5, a first of said two apparatuses being located on a first section, the second of said two apparatuses being located on a second section adjacent to the first section, said second apparatus being located at an extremity of the second section adjacent to the extremity of the first section where the first apparatus is located.

7. The apparatus according to claim 5, wherein said monitoring device capable of operating at a sampling frequency of at least 1 MHz to monitor said at least one parameter representative of the operational conditions.

8. Apparatus according to claim 5, said monitoring device comprising means for continuously storing data on the parameter during a predetermined time window, and a memory for storing in memory only the data over a period of time starting 100 µs before the reception time and ending when the value of said at least one parameter re-passes below the threshold.

9. Apparatus according to claim 5, said phase line comprising four conductors.

10. A method for determining whether there is a flaw along a phase line on a section of an electrical energy transmission line, and for locating said flaw if there is one, the phase line comprising n conductors electrically insulated one from another and short-circuited between themselves at two extremities of the section, the length of the section being known, the method comprising the steps of:
    a) opening one of the n conductors at one of the extremities of the section to inject therein an incident electrical pulse, and storing a transmission time of the incident pulse;
    b) detecting a reflected electrical pulse received in response to the incident pulse on the conductor at the extremity of the section without a ground reference, and storing a reception time of the reflected pulse, the pulses having a known propagation speed in the conductor;
    c) transmitting a signal representative of the geographic location of the extremity of the section; and
    d) determining whether there is a flaw as a function of the transmission and reception times, of the length of the section and of the propagation speed, and, if there is a flaw, geographically locating said flaw as a function of the signal representative of the geographic location of step c), of the transmission and reception times, and of the propagation speed.

11. The method according to claim 10, wherein the step of detecting the reflected pulse on the conductor at the extremity of the section and of storing the reception time of the reflected pulse is carried out at a sampling frequency of at least 1 MHz.

12. The method according to claim 10, wherein, step b) comprises a step of detecting and storing data on the conductor starting at the moment when the incident electrical pulse is injected up to the moment when the reflected electrical impulse is detected.

13. The method according to claim 10, wherein said phase line comprises four conductors.

14. An apparatus for determining whether there is a flaw along a phase line on a first section of an electrical energy transmission line and for locating said flaw if there is one, the phase line comprising n conductors electrically insulated one from another and short-circuited between themselves at two extremities of the first section, the length of the section being known, the apparatus being located at a first of the extremities of the first section, and comprising:
    an interrupter for opening one of the n conductors;
    a signal generator for injecting an incident electrical pulse in the conductor;
    a detector for detecting on the conductor a reflected electrical pulse in response to the incident pulse without a ground reference, the pulses having a known propagation speed in the conductor;

a memory for storing the incident pulse injection and reflected pulse reception times;

a transmitter for transmitting a signal representative of a geographic location of the first extremity of the first section; and a device for determining whether there is a flaw as a function of the transmission and reception times, of the length of the first section and of the propagation speed, and, if there is a flaw, geographically locating said flaw as a function of the signal representative of the geographic location transmitted by the transmitter, of the injection and reception times, and of the propagation speed.

15. The system comprising two apparatuses, each apparatus as claimed in claim 14, a first of said two apparatuses being located on a first section, the second of said two apparatuses being located on a second section adjacent to the first section, said second apparatus being located at an extremity of the second section adjacent to the extremity of the first section where the first apparatus is located.

16. The apparatus according to claim 14, wherein said detector is adapted to operate at a sampling frequency of at least 1 MHz for detecting said reflected pulse.

17. The apparatus according to claim 14, said detector comprising means for detecting and storing data on the conductor starting at the moment when the incident electrical pulse is injected up to the moment when the reflected electrical pulse is detected.

18. The apparatus according to claim 14, said phase line comprising four conductors.

* * * * *